United States Patent
Davis et al.

(10) Patent No.: US 6,712,577 B2
(45) Date of Patent: Mar. 30, 2004

(54) AUTOMATED SEMICONDUCTOR PROCESSING SYSTEM

(75) Inventors: Jeffrey A. Davis, Kalispell, MT (US); Gary L. Curtis, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/845,458

(22) Filed: Apr. 30, 2001

(65) Prior Publication Data

US 2003/0017034 A1 Jan. 23, 2003

Related U.S. Application Data

(63) Continuation of application No. 09/187,652, filed on Nov. 6, 1998, now abandoned, which is a continuation of application No. 08/851,480, filed on May 5, 1997, now abandoned, which is a continuation of application No. 08/680,463, filed on Jul. 16, 1996, now Pat. No. 5,644,337, which is a continuation-in-part of application No. 08/622,349, filed on Mar. 26, 1996, now Pat. No. 5,784,797, which is a continuation-in-part of application No. 08/415,927, filed on Mar. 31, 1995, now Pat. No. 5,660,517, which is a continuation-in-part of application No. 08/236,424, filed on Apr. 28, 1994, now Pat. No. 5,544,421, application No. 09/845,458, which is a continuation of application No. 08/698,034, filed on Aug. 15, 1996, now Pat. No. 5,836,736, which is a division of application No. 08/415,927, filed on Mar. 31, 1995, now Pat. No. 5,660,517, which is a continuation-in-part of application No. 08/236,424, filed on Apr. 28, 1994, now Pat. No. 5,544,421.

(51) Int. Cl.$^7$ ............................................. B65G 49/07
(52) U.S. Cl. .............. 414/217; 414/416.01; 414/416.03; 414/940; 414/941
(58) Field of Search ........................... 432/239; 414/935, 414/937, 939, 940, 941, 217, 222.01, 416.01, 416.03, 416.05, 416.08; 118/718, 500; 204/298.25, 298.35; 294/64.1, 65.5; 134/902

(56) References Cited

U.S. PATENT DOCUMENTS

| | | | |
|---|---|---|---|
| 4,300,581 A | * | 11/1981 | Thompson ................. 134/57 R |
| 4,449,885 A | | 5/1984 | Hertel et al. |
| 4,571,850 A | * | 2/1986 | Hunt et al. .................... 34/242 |
| 4,924,890 A | | 5/1990 | Giles |
| 4,987,407 A | | 1/1991 | Lee |
| 5,055,036 A | | 10/1991 | Asano et al. |
| 5,064,337 A | | 11/1991 | Asakawa et al. |
| 5,125,784 A | | 6/1992 | Asano |
| 5,215,420 A | | 6/1993 | Hughes |
| 5,232,328 A | * | 8/1993 | Owczarz et al. ...... 414/590 XL |
| 5,301,700 A | * | 4/1994 | Kamikawa et al. ........... 134/76 |
| 5,339,539 A | * | 8/1994 | Shiraishi et al. ............... 34/88 |
| 5,364,219 A | | 11/1994 | Takahashi |
| 5,378,145 A | | 1/1995 | Ono |
| 5,544,421 A | | 8/1996 | Thompson et al. |
| 5,613,821 A | | 3/1997 | Muka et al. |
| 5,674,039 A | | 10/1997 | Walker et al. |
| 5,772,386 A | | 6/1998 | Mages et al. |

FOREIGN PATENT DOCUMENTS

| | | |
|---|---|---|
| EP | 047132 | 3/1982 |
| EP | 560 439 | 9/1993 |
| WO | WO A 81/02533 | 9/1981 |

* cited by examiner

Primary Examiner—Steven A. Bratlie
(74) Attorney, Agent, or Firm—Perkins Coie LLP

(57) ABSTRACT

A semiconductor processing system for wafers or other semiconductor articles. The system uses an interface section at an end of the machine accessible from the clean room. A plurality of processing stations are arranged away from the clean room interface. A transfer subsystem removes wafers from supporting carriers, and positions both the wafers and carriers onto a carrousel which is used as an inventory storage. Wafers are shuttled between the inventory and processing stations by a robotic conveyor which is oriented to move toward and away from the interface end. The system processes the wafers without wafer carriers.

18 Claims, 50 Drawing Sheets

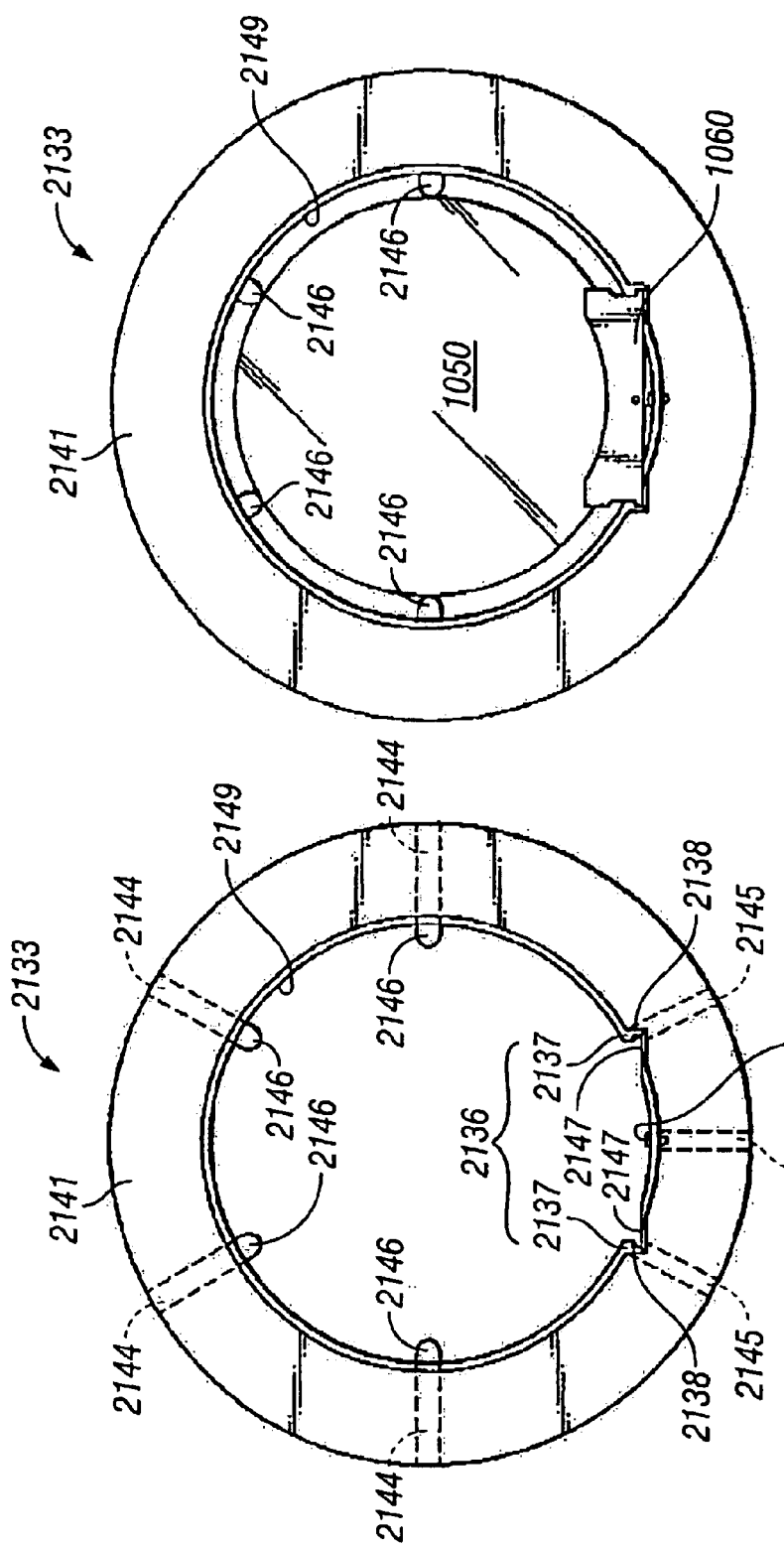

AUTOMATED SEMICONDUCTOR PROCESSING SYSTEM

CROSS-REFERENCE TO RELATED APPLICATIONS

This application is a continuation of U.S. patent application Ser. No. 09/187,652, filed Nov. 6, 1998 and now abandoned, which is a continuation of U.S. patent application Ser. No. 08/851,480 filed May 5, 1997 and now abandoned, which is a continuation of U.S. patent application Ser. No. 08/680,463, filed Jul. 16, 1996, now U.S. Pat. No. 5,644,337, which is a continuation-in-part of U.S. patent application Ser. No. 08/622,349, filed Mar. 26, 1996, now U.S. Pat. No. 5,784,797, which is a continuation-in-part of U.S. patent application Ser. No. 08/415,927, filed Mar. 31, 1995, now U.S. Pat. No. 5,660,517, which is a continuation-in-part of Ser. No. 08/236,424, filed Apr. 28, 1994, now U.S. Pat. No. 5,544,421. This application is also a continuation of U.S. patent application, Ser. No. 08/698,034, filed Aug. 15, 1996, now U.S. Pat. No. 5,836,736, which is a division of U.S. patent application Ser. No. 08/415,927, filed Mar. 31, 1995, now U.S. Pat. No. 5,660,517, which is a continuation-in-part of U.S. patent application Ser. No. 08/236,424, filed Apr. 28, 1994, now U.S. Pat. No. 5,544,421. Applicants claim priority to these applications under 35 U.S.C. §120.

TECHNICAL FIELD

This invention relates to automated semiconductor wafer processing systems for performing liquid and gaseous processing of wafers. Such systems can be used to process semiconductor wafers, data disks, semiconductor substrates and similar articles requiring very low contaminant levels.

BACKGROUND OF THE INVENTION

The processing of semiconductor wafers has become of great economic significance due to the large volume of integrated circuits, data disks, and similar articles being produced.

The size of features used in integrated circuits and data disks have decreased significantly, thus providing greater integration and greater capacity. This has been possible due to improved lithography techniques and improved processing.

The reduction in feature size has been limited by contamination. This is true because various contaminating particles, crystals, metals and organics lead to defects in the resulting products. The limitations on feature size caused by contaminants have prevented full utilization of the resolution capability of known lithography techniques.

Thus there remains an acute need for improved methods and systems for processing semiconductor wafers, data disks and similar articles requiring very low levels of contamination during processing.

During the fabrication of semiconductor components, various manufacturing steps involve the application of processing liquids and gases to the articles being processed. The application and removal of these processing fluids to and from the exposed surfaces of the wafers are enhanced by movement of the wafers within the processing chamber. Processing is also enhanced by centrifugal action of the semiconductor wafers which improves movement of fluids across the wafer surfaces, such as when liquids are sprayed upon the wafer and then move across the wafer surfaces due to centrifugal forces acting upon the liquids as the wafers spin.

As one example, after semiconductor wafers have been cleaned, they must be dried. This is not a trivial process because any water that remains on the surface of a semiconductor wafer has at least some potential of leaving some form of residue which may interfere with subsequent operations or cause defects in the resulting products. Centrifugal action aids in the removal of water and other processing liquids so that such residues are not as likely to occur because the fluid is applied to the surface and then moves outwardly and is removed from the surfaces. Drying is also benefitted because less liquid remains on the wafer surfaces, so drying speed is increased. This saves processing time and reduces the risk of residue or contamination due to particle adhesion.

In one type of prior art centrifugal processor, several wafer carriers are put in holders or carriers in a spaced substantially circular array around the axis of rotation. The rotor with loaded carriers of wafers is then rotated within a processing chamber which is typically enclosed within a processing bowl or vessel. In the center of the vessel and at other peripheral locations are fluid manifolds with spray nozzles or similar inlets that are connected to a source of deionized water, heated nitrogen, or other processing chemicals both liquids and gases. These or other processing fluids are thus applied to the wafers to effect washing, drying or other processing.

Other prior art spin rinser dryers have been built for drying batches of wafers held in a single wafer carrier. The wafer carrier and supported wafers are held within a rotor. The rotor has an opening for receiving the carrier with the wafers positioned in an array with the centerpoints of the wafers at or nearly aligned with the axis of rotation. Typically a small offset is used so that the wafers will seat into the wafer carriers as centrifugal forces are developed during rotation. The water, nitrogen or other processing fluids come into the chamber along the sides rather than through a manifold mounted at the center. The rinsing, other liquids application, or drying take place as the rotor spins with the carrier and wafers held therein. Stationary retainer bars are typically provided adjacent the open top side of the wafer carrier to prevent the wafers from being displaced if the rotor should stop in an upside-down position. The rotors are also typically controlled to stop in a right-side-up position. This type of spin rinser dryer is normally termed an axial or on-axis spin rinser dryer.

Additionally semiconductor processing machines of similar configuration are also used for centrifugal chemical etching or other chemical processing. In this regard, the required chemicals are pressurized or pumped to the processing chamber and valves control the supply of such chemicals into the chamber. The chemical processing can be following by associated rinsing and drying operations. The application of processing chemicals adds to the complexity of the processing because highly reactive chemicals may impinge upon the wafer surfaces at different angles, fluid velocities, with differing flow rates, and with other dynamically varying effects. This variability can cause different etch rates or other variations in chemical processing which is difficult to overcome.

Process uniformity within a batch and repeatability from batch to batch have been major considerations in semiconductor processing, and in particular centrifugal semiconductor processing. The issue is particularly of interest in the case of batch centrifugal processing because the wafers are held in closely spaced arrays using wafer carriers. In addition to inherent variations in the application of processing fluids to the wafers, there are also variations associated with how wafers are held within the carriers. The structural parts of the carriers necessarily restrict access of fluids to the wafer surfaces. This has almost invariably led to different processing results for wafers in different positions within a carrier, even though processing has occurred in the same batch. Although carriers have been designed to reduce their effects on processing fluid distribution within the processing chamber, it has been impossible to eliminate their effects on uniformity and repeatability of processing results.

While the apparatus and methods utilized heretofore have operated with varying degrees of success, they have also sometimes suffered problems with regard to contamination or particle additions which can occur during processing. As the features and geometries of the discrete components formed on the semiconductor devices have become smaller and more densely packed, the need for more stringent contamination control has become increasingly difficult.

Thus there has been a need in the art of semiconductor wafer and similar article processing for a centrifugal processing machine which provides improved uniformity of process results while minimizing the possibility of contamination. This must be done without substantial risk of damage to the semiconductor wafers.

A further area of significance in the processing of semiconductor articles includes the handling and coordination of wafer carriers commonly used to support semiconductor wafers in various stages of processing and translocation between processes. Wafer carriers are often susceptible to picking up undesirable contaminants. Carriers which have been contaminated can in some processing schemes be used to carry more than one batch of wafers. This increases the potential for spreading contamination amongst multiple wafers and batches.

These and other considerations have led to a novel semiconductor processing system as described herein, with various benefits and advantages which are described or inherent from the construction and description given herein.

BRIEF DESCRIPTION OF THE DRAWINGS

One or more preferred forms in the invention are described herein with reference to the accompanying drawings. The drawings are briefly described below.

FIG. 51 is a front view of the rotor shown in FIG. 31.

FIG. 52 is a front view of the rotor as shown in FIG. 51 with a wafer tray held within the rotor.

DETAILED DESCRIPTION OF THE PREFERRED EMBODIMENTS

Processing System Generally

Figure 1:
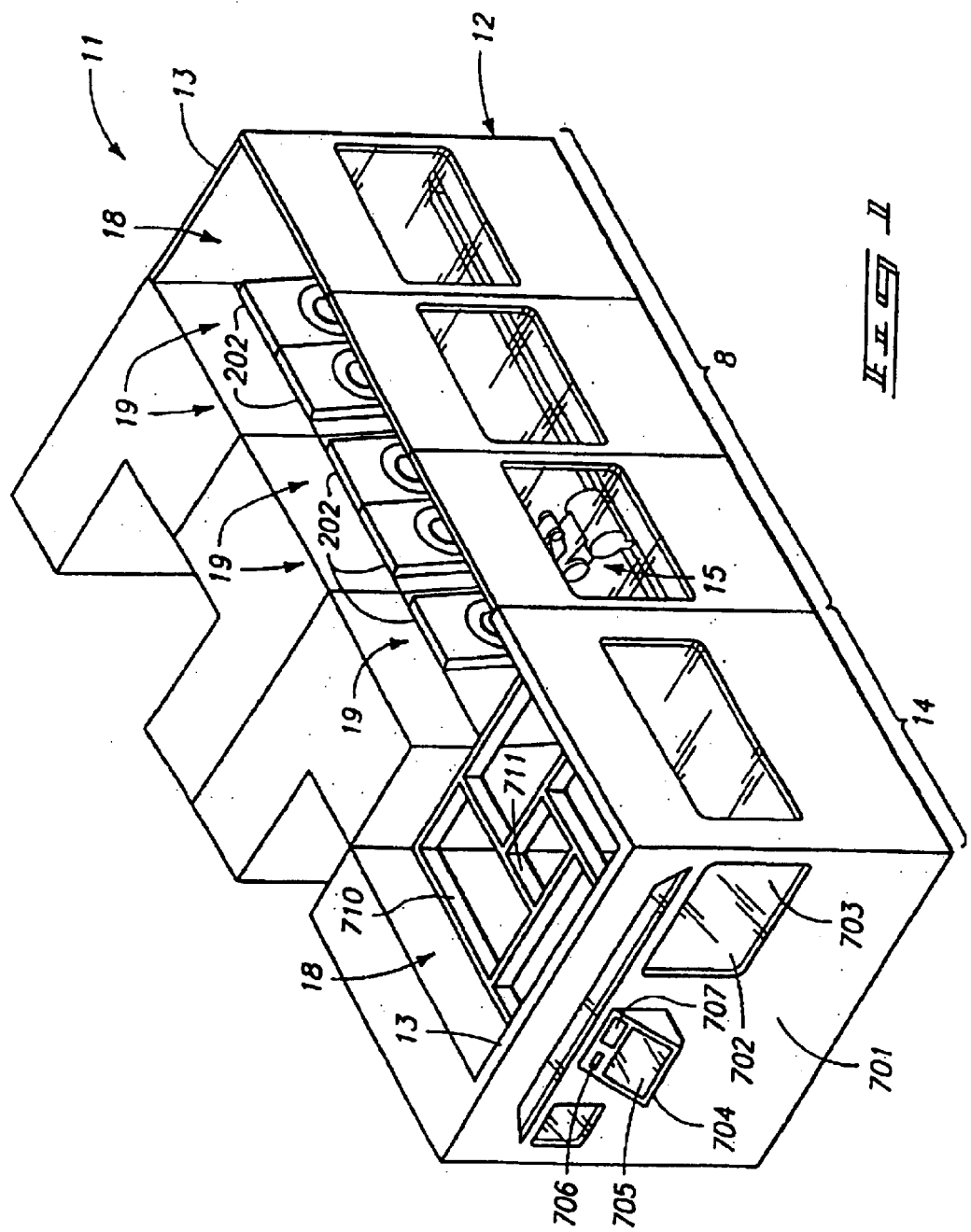
FIG. 1 is a perspective view showing a preferred semiconductor processing system according to the present invention.
Figure 2:
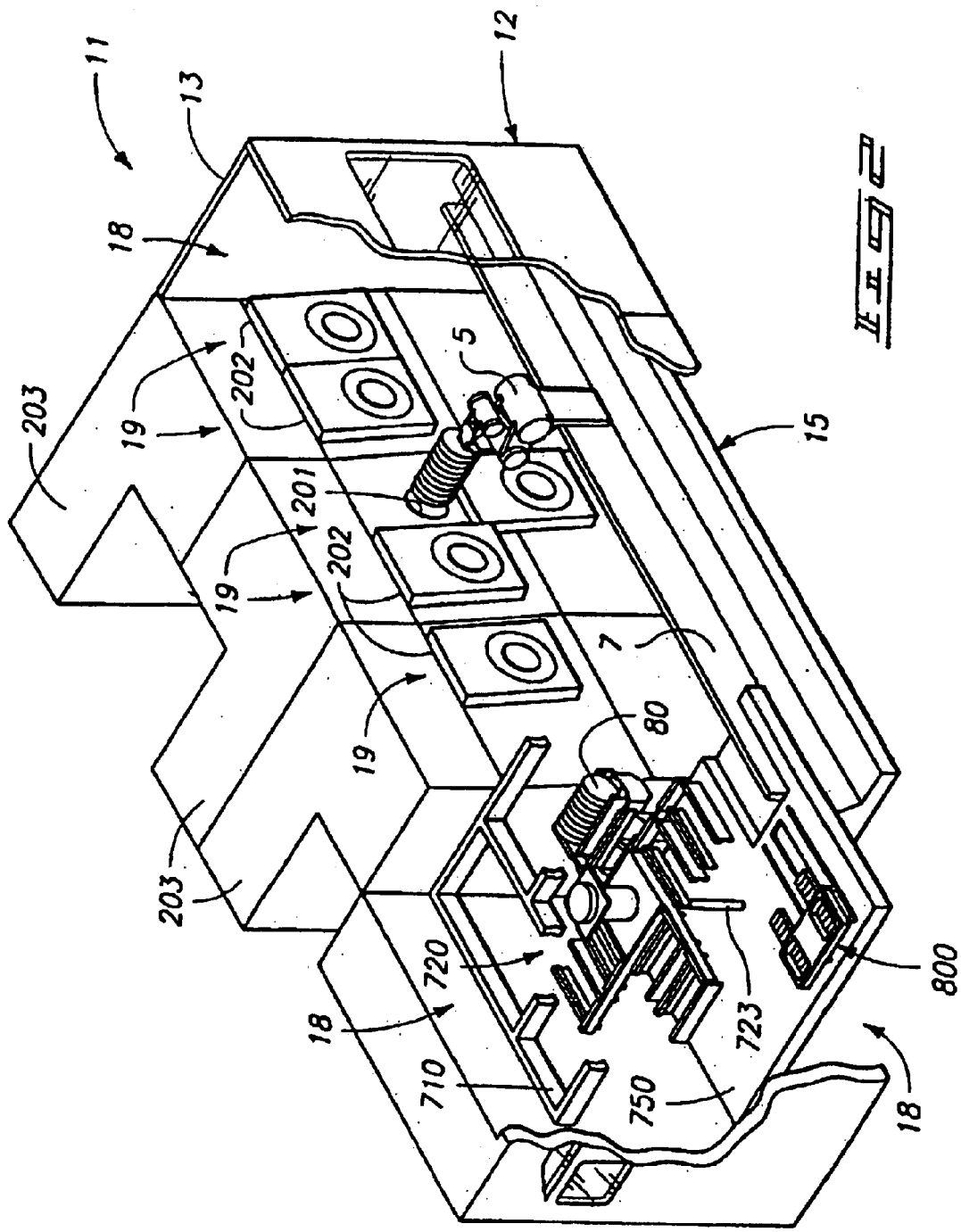
FIG. 2 is a perspective view similar to FIG. 1 showing the preferred semiconductor processing system with portions broken away to better illustrate some of the principal components thereof.

FIGS. 1 and 2 generally show a preferred processing system 11 constructed in accordance with the novel aspects of the inventions. The processing system includes a frame 13 which is connected with a housing 12. The housing 12 and frame 13 rests upon a supporting surface (not shown). The housing is most preferably constructed to form an enclosure which is substantially or fully encloses the machine and defines a working space 18 within which the wafers 80 or other semiconductor articles are moved and processed in relative protection from dust and contamination.

FIG. 1 does not show the full enclosure of housing 12 to improve the illustration. Specifically, the top or roof has been removed for purposes of illustration. The roof can advantageously be provided with a series of ultrafine filters (not shown) through which air, nitrogen or other work space gas is supplied to working space 18.

FIG. 1 shows that the processing system 11 includes an interface section 14 which includes mechanisms and features for inputting and outputting the wafers 80 or other semiconductor articles being processed. The interface section also includes mechanisms for transferring wafers from wafer carriers 79 and for inventorying both the wafers and carriers upon a carrousel 720. Preferred forms of these mechanisms will be described in detail below after further introduction of some additional basic features of the processing system.

Processing Stations Generally

Processing system 11 also includes a processing section 8. The processing section includes one or more individual processing stations 19 which can be of various constructions. Centrifugal or immersion type stations can be used. In a preferred form of the invention, the processing stations 19 are each centrifugal processing stations which include a processing vessel 201 which partially encloses a processing chamber defined therewithin. The processing vessels also preferably mate with a movable door 202 which can be moved between the closed positions generally shown and the retracted position shown at one station in FIG. 2.

The processing stations 19 are mounted within processing station console 203 which have associated supporting fluid supplies for providing processing liquids and gases as needed for the particular processes being carried out at that station. Stations 19 can all be the same, each be different, or there can be more than one of a particular type coupled with one or more other associated stations within the same processing system.

As shown, the semiconductor articles are processed in batches. The wafers within a batch are arranged in a linear batch array in which the individual wafers or other articles are spaced, substantially parallel and aligned with central normal axes of the disk-shaped wafers aligned to form a longitudinal central batch axis (axis not illustrated). The size of the wafers can vary. The number of wafers can also vary, but at this time typically will include 25 or 50 wafers because industry standard wafer carriers 79 have such capacities.

Robotic Conveyor

FIGS. 1 and 2 further show a robotic conveyor, which is generally indicated by the numeral 15. Robotic conveyor 15 includes a mounting conveyor beam or rail 7 upon which a movable conveyor robot subassembly 5 is mounted and moves relative to the rail. The conveyor 15 conveys the semiconductor wafers or other articles 80 within the processing system, specifically between, to and from, the inventory carrousel 720 and the processing stations 19.

The robotic device can be of various designs. One design is that available from Semitool, Inc. of Kalispell, Mont. as part of processing systems sold under the trademark MAGNUM. Further detailed description of suitable conveyor devices and other aspects of the processing system can also be implemented in a manner shown in described in U.S. Pat. Nos. 5,544,421; 5,660,517; and 5,678,320 which are hereby incorporated by reference in their entirety. Such forms of apparatus are also described in corresponding PCT Applications which were published by the World Intellectual Property Organization under PCT Publication Nos. WO 95/30238; WO 95/30240; WO 30239; all of which are incorporated by reference.

Figure 5:
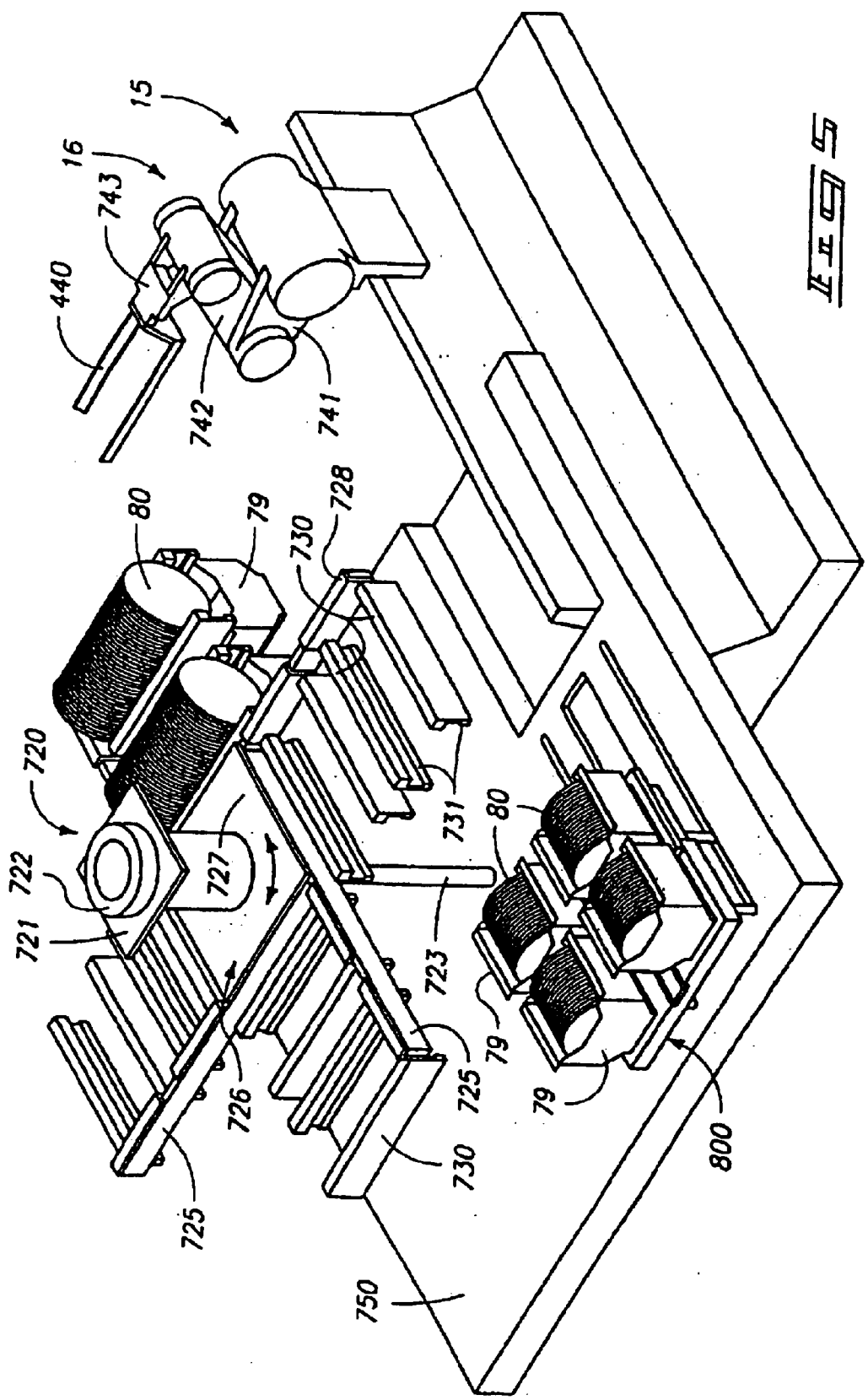
FIG. 5 is a perspective view showing selected components of the processing system of FIG. 1.

In the preferred robotic transfer device 15 the construction includes an articulated arm 16. FIG. 5 better illustrates that the preferred articulated arm includes an upper arm portion 741, lower arm portion 742, and hand portion 743. Articulated arm 16 uses hand 743 and an attached engagement head which can be oriented into various planes of orientation and various positions. The conveyor robot has a distal end 17 which is used to mount an engagement implement which is preferably of the construction detailed below or equivalents thereto. The distal end 17 may move along assorted courses of travel to deliver the semiconductor articles to various individual or plural work stations 19. Each of these various courses of travel will be discussed in greater detail, hereinafter. While the present invention is described as being useful in combination with a washing or chemical processing stations, it will be appreciated that the same device may find utility in other applications.

Input-Output Interface Section

FIGS. 1 and 2 also show that processing system 11 preferably includes an input-output or interface section 14.

The current invention in-part focuses on the novel construction used for interface section 14. Interface section 14 is constructed using the processor framework 13 and enclosure wall structure 12. The interface section has a front end wall 701 which is advantageously arranged along a hall or gallery within a clean room. Front wall 701 includes an interface opening 702. Interface opening 702 is provided with an interface door 703 which is preferably at least partially transparent to allow observation by a human operator. Door 703 is preferably operated by a suitable power door operator 709 which can be a linear screw drive or many other suitable mechanisms. The front wall 701 is also preferably provided with an operator control module or station 704 which is accessible from the clean room end of the system and can be of various constructions. As shown, operator module 704 includes a touch screen display and control panel 705. Also appropriately included are a disk drive 706 for providing control programming information, and other manually depressible control buttons (such as emergency stop) not specifically shown, but generally referred to as 707.

Interface section 14 also preferably includes a carrousel support framework 710 which is mounted in an elevated position within the interface section enclosure. Carrousel support framework 710 includes a central frame opening 711 (FIG. 1) which is used to mount an inventory carrousel which will be more fully described below. The specific form of the carrousel support framework can easily vary depending upon the specific form in which the carrousel or other inventory storage is constructed.

Inventory Carrousel

Figure 6:
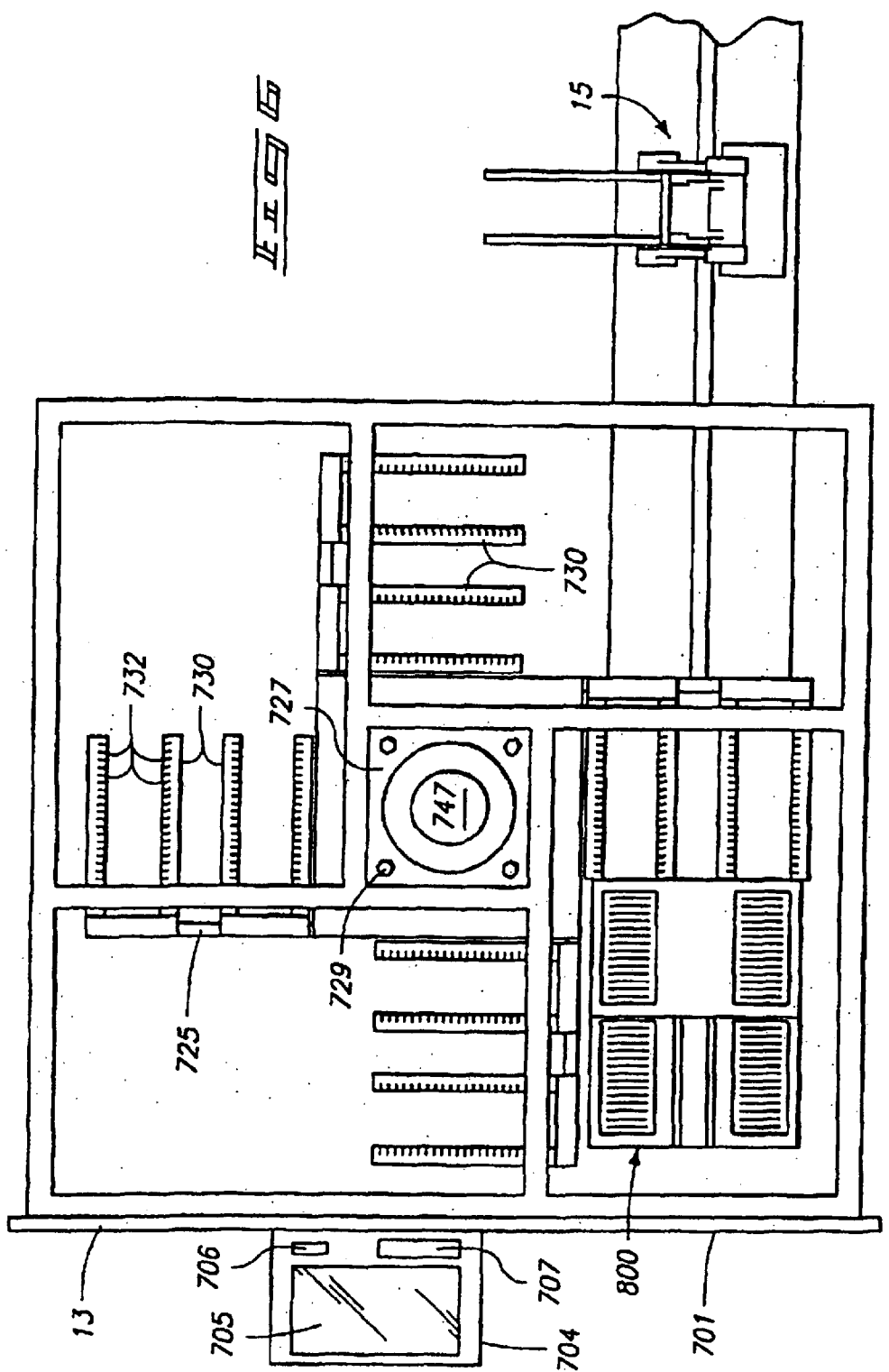
FIG. 6 is a plan view showing selected components of the processing system of FIG. 1.

FIG. 5 shows portions of the carrousel inventory mechanism used to support a plurality of wafers 80 or other semiconductor articles being processed. Carrousel assembly 720 includes a carrousel mounting plate 721 which is secured within opening 711 of the carrousel support framework 710 using fasteners 729 (FIG. 6). Support plate 721 is connected to and carries a carrousel main housing 722 which is detachable for maintenance and other purposes. Carrousel main housing 722 has internal features which support and mount a carrousel drive motor 747 (shown in phantom in FIG. 7). The output of the carrousel drive motor is in the form of a carrousel rotor shaft 723. The lower end of shaft 723 has a suitable angular position encoder 745 coupled at its lower end by coupling 746. An encoder support bracket 744 is attached to frame 13 or other suitable supporting structure to stabilize portions of the encoder against rotation with shaft 723.

The carrousel assembly further includes a plurality of carrousel support arms 725 which extend outwardly and are arranged to provide four cantilevered beam portions which can be advantageously used to support wafers 80 and wafer carriers 79. As shown, the carrousel support arms 725 connect in an overlapping square-shaped array to form a central square 726 which is overlaid with a carrousel central support panel 727.

Each carrousel support arm 725 is preferably constructed so as to receive one or more support brackets 728. Support brackets 728 can be mounted in any suitable fashion. As shown, support brackets 728 rest over arms 725 and are secured thereto by fasteners (not shown).

Each support bracket 728 includes an upper or first rest or support 730, and a second or lower rest or support 731. The upper rest 730 is preferably provided with a series of grooves or notches 732 (see FIG. 6) along opposing inner, upper surfaces. Grooves 732 serve as supporting receivers into which are received individual wafers 80. The lower, second supports 731 are used for receiving and supporting wafer carriers 79. As shown, the lower supports 731 are constructed so as to form a semiconductor article carrier support. Article carrier support 731 is advantageously provided with constructional surface details (not shown) which serve to help retain the wafer carriers 79 against unintended movement after being placed upon supports 731. This maintains the carriers in position when the carrousel rotor rotates to a desired angular position. The specific features used will vary in conformance with the particular carrier design used.

The interface section also preferably includes a mid-level deck 750 which extends and portions which extend beneath such deck. Deck 750 is preferably perforated using perforations or apertures (not shown) which allow clean air or other work space gas to pass downwardly from upper air supply and filtration units (not shown) which provide filtered air into upper reaches of the processing system enclosure. This arrangement tends to take any generated particles or contaminants downwardly in the stream of filtered air or other working space gas.

Figure 7:
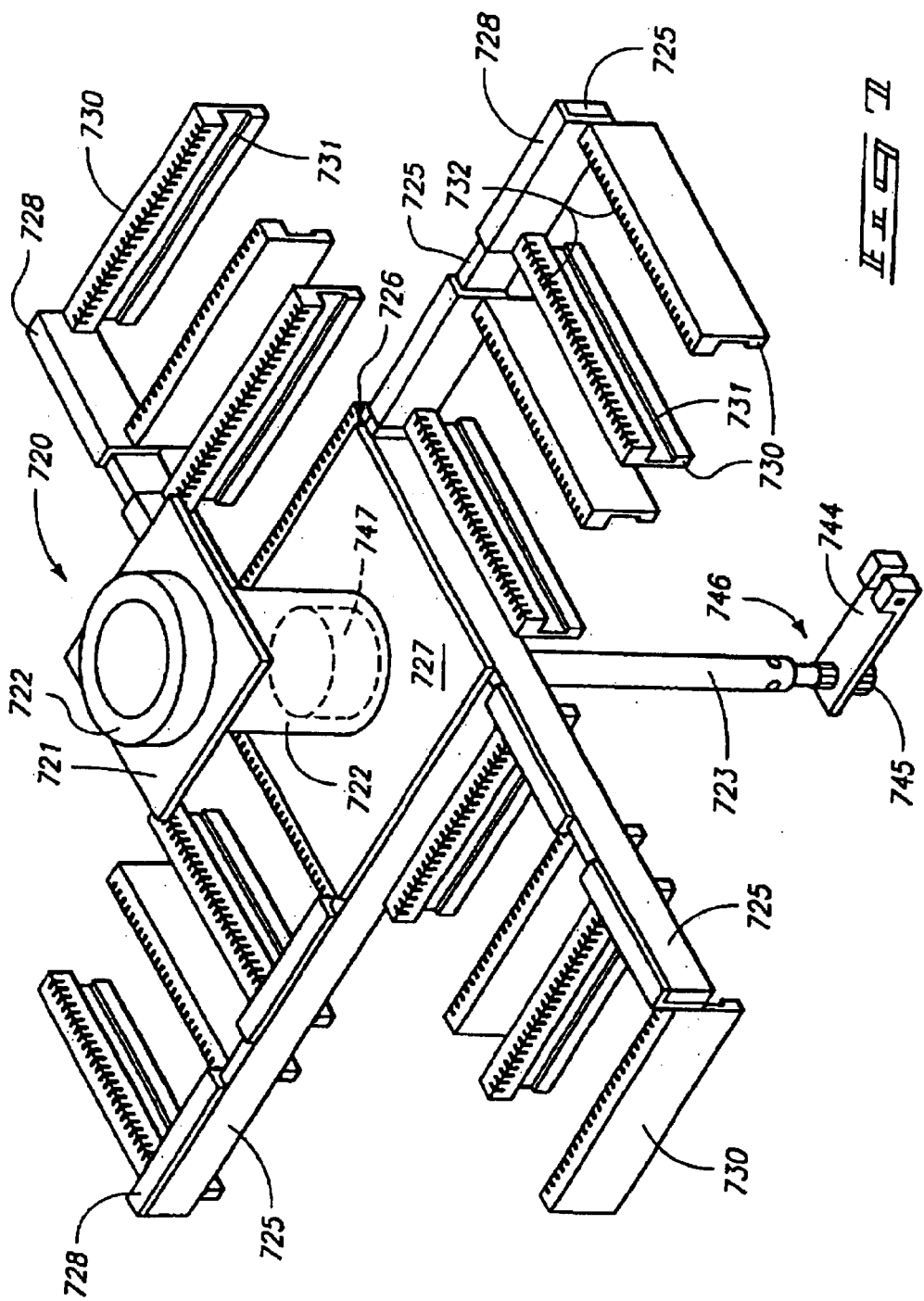
FIG. 7 is a perspective view showing a preferred carrousel subassembly forming a part of the processing system of FIG. 1.

The preferred carrousel construction shown in FIGS. 5–7 illustrates a system designed to accommodate approximately four hundred (400) wafers. Such wafers are typically supplied in wafer carriers 79 which have the capacity of twenty five (25) wafers each. Carrousel 720 thus is capable of supporting both the wafers and sixteen (16) associated wafer carriers in inventory positions upon the carrousel. The carrousel construction and arrangement shown allows the inventoried wafers and carriers to be properly accessed at four different angular positions of the carrousel. Access can occur using either a wafer transfer apparatus 800 or robotic conveyor 15. This arrangement also allows the robotic conveyor to access one arm of the carrousel while another arm of the carrousel is being loaded or unloaded using the transfer subsystem 800.

Article Transfer Subsystem

Figure 8:
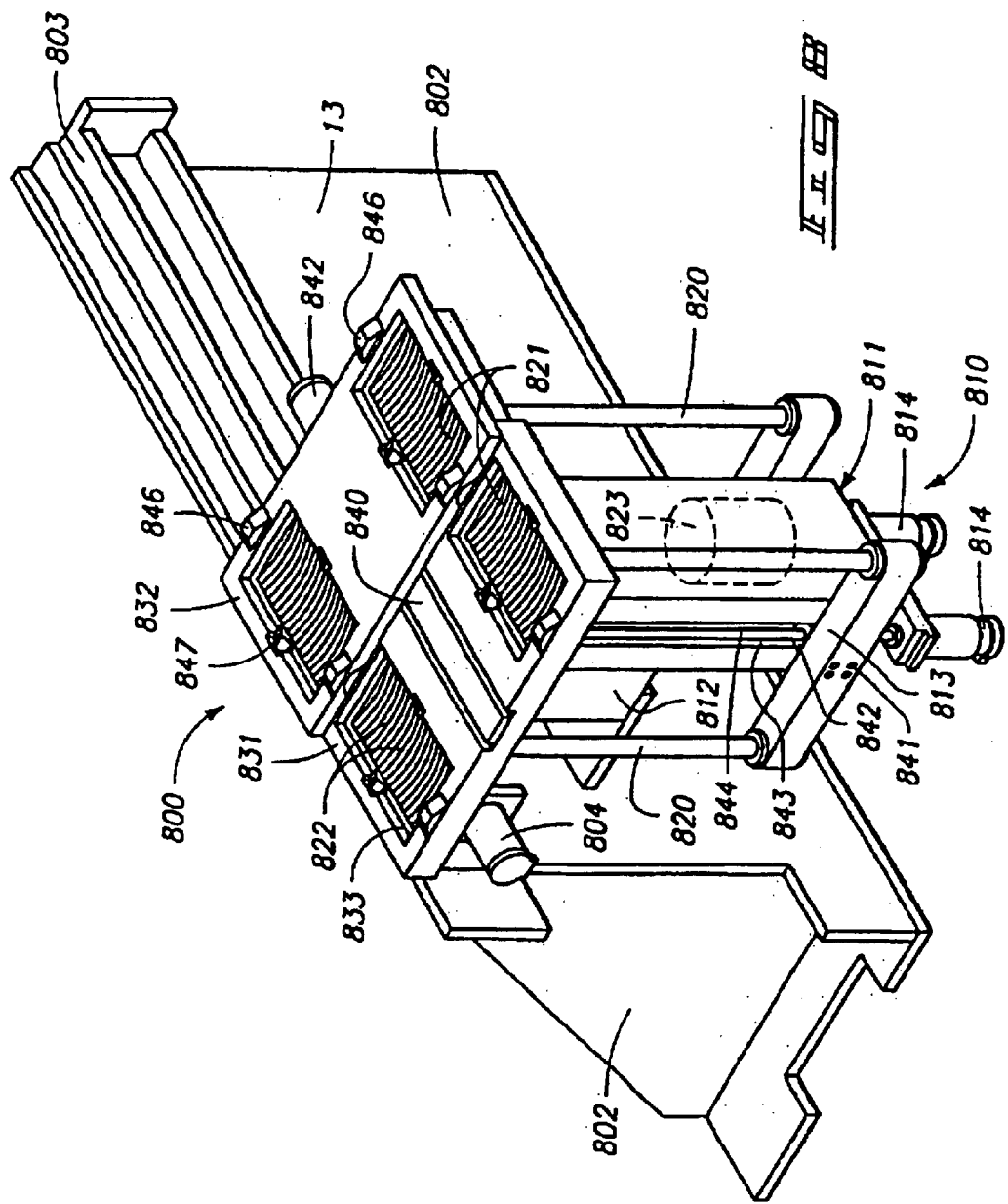
FIG. 8 is a perspective view showing a preferred article transfer subassembly forming a part of the processing system of FIG. 1.

The semiconductor article transfer mechanism 800 is shown in greater detail in FIG. 8. Mechanism 800 is advantageously supported by a subframe 802 which either forms part of machine framework 13 or is otherwise appropriately supported within the enclosure 12. Subframe 802 can be of various constructions. FIG. 8 shows that subframe 802 includes a lateral stage guide rail 803 which mounts a laterally moveable transfer main subassembly 810.

Lateral motion is provided to horizontally move the main subassembly 810 back and forth using a suitable later stage drive. As shown, the lateral stage drive includes a lateral stage drive motor 804 which drives an associated screw actuator or other suitable drive assembly which moves the main subassembly 810 horizontally back and forth along support rail 803. The Lateral stage drive operates directly upon the supporting frame guide 803 and a lateral stage follow 812 which forms a part of main subassembly 810. A variety of lateral stage guide and drive constructions are suitable for use in this invention.

The article transfer main subassembly 810 also includes a main part 811. Main part 811 is mounted for elevation change such as by mounting for vertical motion relative to the lateral stage follower 812. The connection between lateral stage follower 812 and main piece 811 is actuated by a first elevator actuator 823 which is mounted within main part 811.

The lateral stage 812 and main part 811 together form a transfer first carriage which is mounted to the frame for movement relative thereto. As shown, the first carriage is mounted for both horizontal and vertical motion. The first carriage preferably includes at least one feature for supporting at least one article carrier 79 on the first carriage. The carrier support features can be constructed according to a variety of alternative designs; however, a preferred construction will be detailed next.

The article transfer mechanism 800 further includes two upper decks 831 and 832 which form a part of the first carriage and are connected to the main part 811. As shown, first deck 831 is connected to the main part in a fixed relationship, although a moveable mounting is alternatively possible. First deck 831 has two wafer carrier receptacles 833 formed therein. Receptacles 833 are shaped and sized so as to support bottom edge surfaces of wafer carriers 79. Receptacles 833 also each have an open portion or receptacle opening within the receptacle which is open through deck 831. These receptacle openings allows for the free passage of article lift heads 821 up through the receptacle and deck. The lift heads also pass up through an aperture formed in the bottom of carriers 79 in order to lift wafers 80 from the wafer carriers 79.

As shown, the carrier support on the first carriage also includes a second or upper deck 832. Second deck 832 also has receptacles 833 for receiving wafer carriers 79 and supporting the carriers thereon. Receptacles 833 in the second deck also have openings which allow the wafer lift heads 821 to extend therethrough when elevated as explained below. The lift heads 821 associated with the first deck can be considered a first set of lift heads, and those associated with the second deck can be considered a second set of lift heads. Although a plurality of lift heads is shown and preferred, it is alternatively possible to use a single lift head and a single deck, with resulting reduced capacity of the transfer mechanism.

First and second decks 831 and 832 are advantageously provided with a suitable number of carrier positioners 846 which facilitate easy placement of the carriers 79 into the receptacles 833. Carrier detectors 847 are also advantageously included at receptacles 833 to allow detection of the carriers when placed in a proper position within the receptacles.

Figure 9:
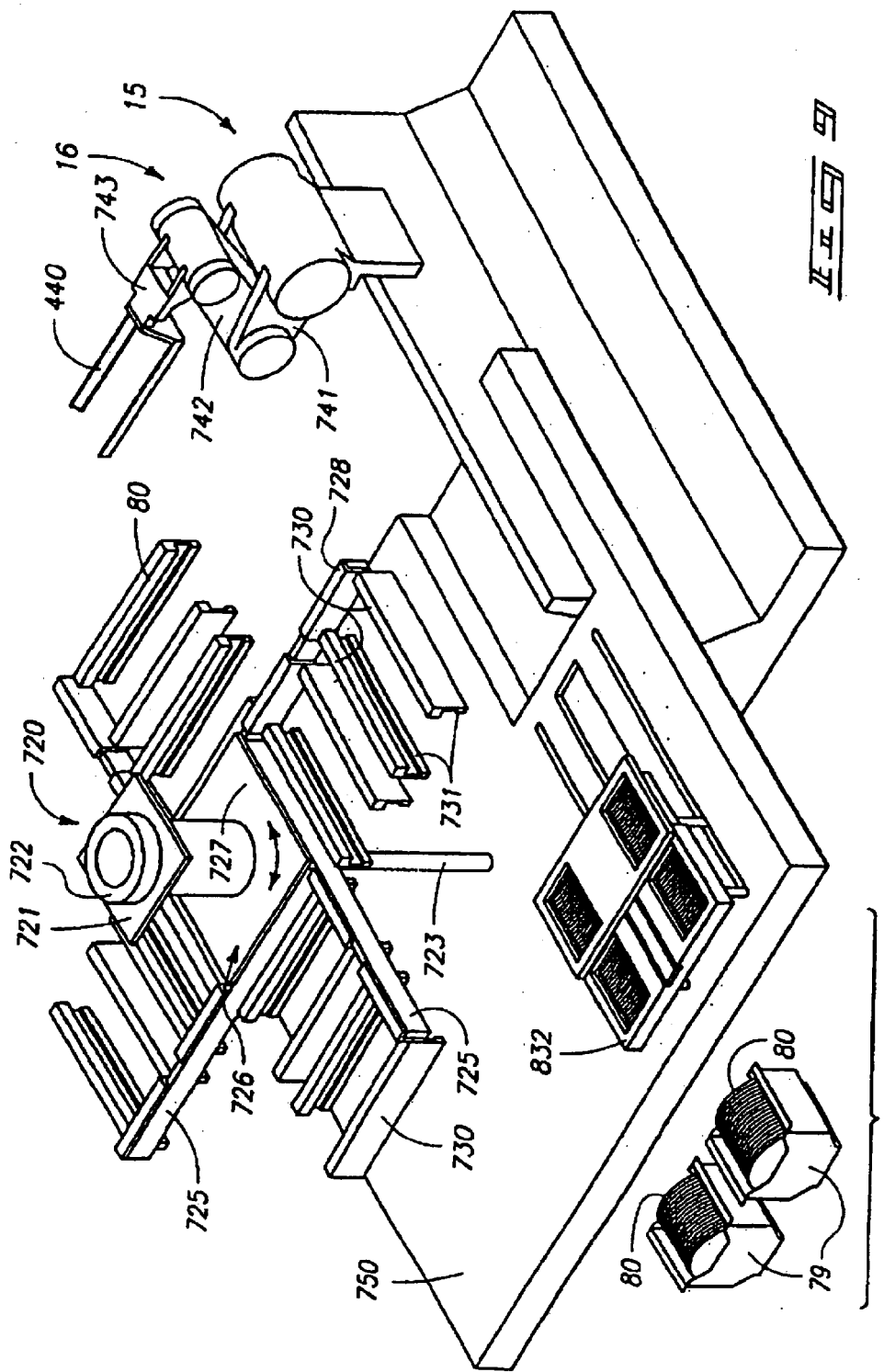
FIGS. 9–21 are a series of views illustrating how the processing system of FIG. 1 transfers semiconductor wafers onto the carrousel in preparation for processing in the associated processing stations.
Figure 10:
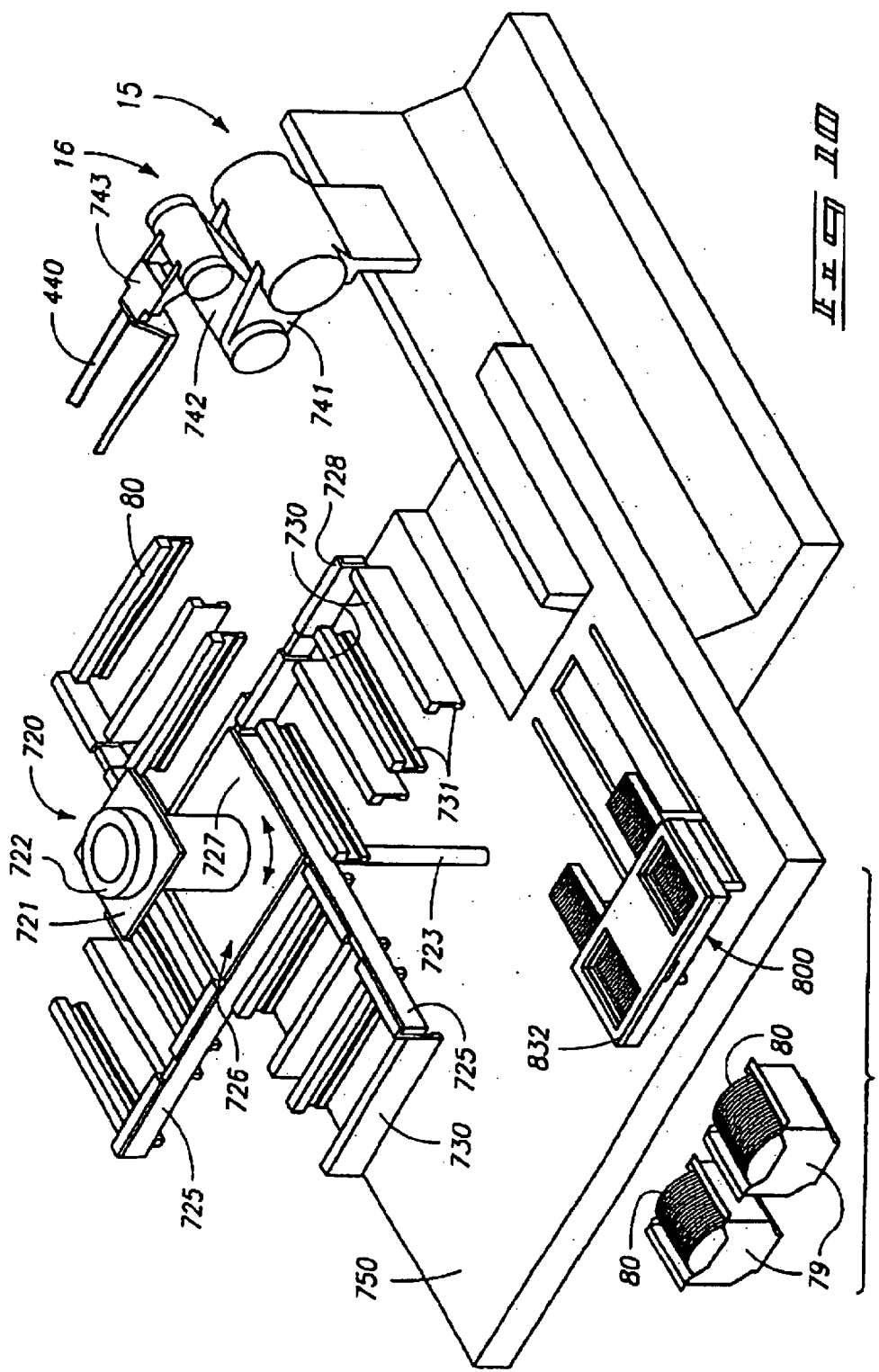
Figure 11:
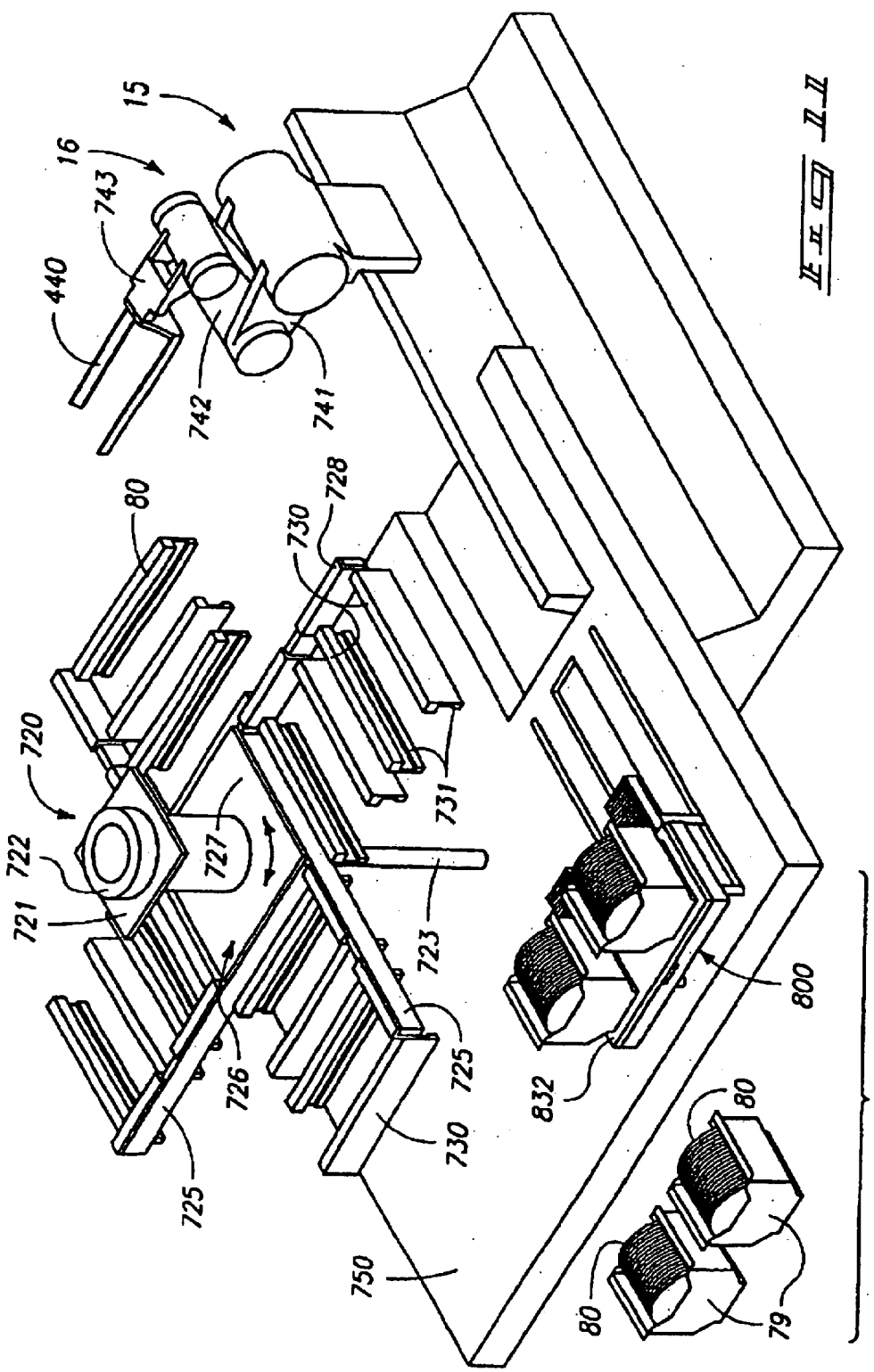
Figure 12:
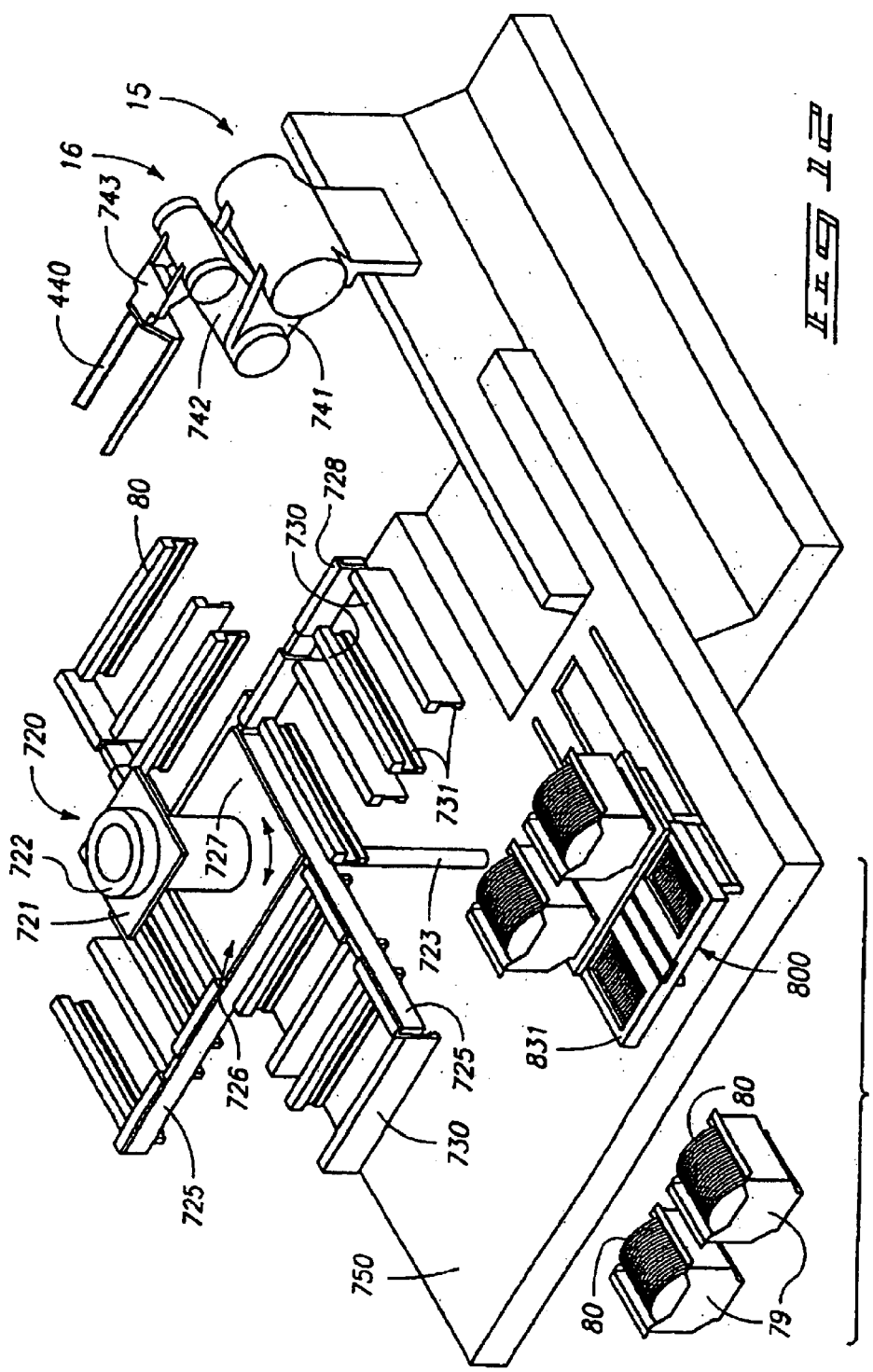

The first and second deck pieces 831 and 832 are advantageously constructed, mounted and arranged so as to facilitate their loading with wafer carriers and wafers held in the carriers. This loading is intended to occur through the interface opening 702. The loading is advantageously done by bringing both decks into close proximity to the opening so that either a robotic or human operator can set the carriers loaded with wafers into receptacles 833 through opening 702. To facilitate this, the construction shown includes a first deck 831 and second deck 832 which are both capable of being placed adjacent opening 702. Deck 831 is in closest proximity without special modification or movement beyond that provided by the lateral stage in properly positioning the subassembly 810 toward the opening 702. This is illustrated in FIG. 9. As FIG. 9 further shows, the second deck 832 is slidably connected to the first deck 831 or other parts of the main part 811. FIG. 8 shows a preferred construction for accomplishing this which uses a guide rail 840. Guide rail 840 slidably connects the two decks and allows linear motion in the direction substantially defined by the longitudinal axis of guide rail 840. Second deck 832 is moved relative to first deck 831 using an upper deck actuating driver or motor 842. The actuator advantageously includes a linear drive, such as a helical screw and ball bearing follower which slides the upper deck relative to the lower deck to assume positions as is illustrated in more complete detail in FIGS. 9–12. The position shown in FIG. 9 is an overlapping position in which the upper deck is positioned adjacent to the loading and unloading opening 702 for easy access. The position shown in FIG. 12 depicts the upper deck in a staggered relationship with the lower deck which allows both decks to support wafer carriers thereon.

Figure 14:
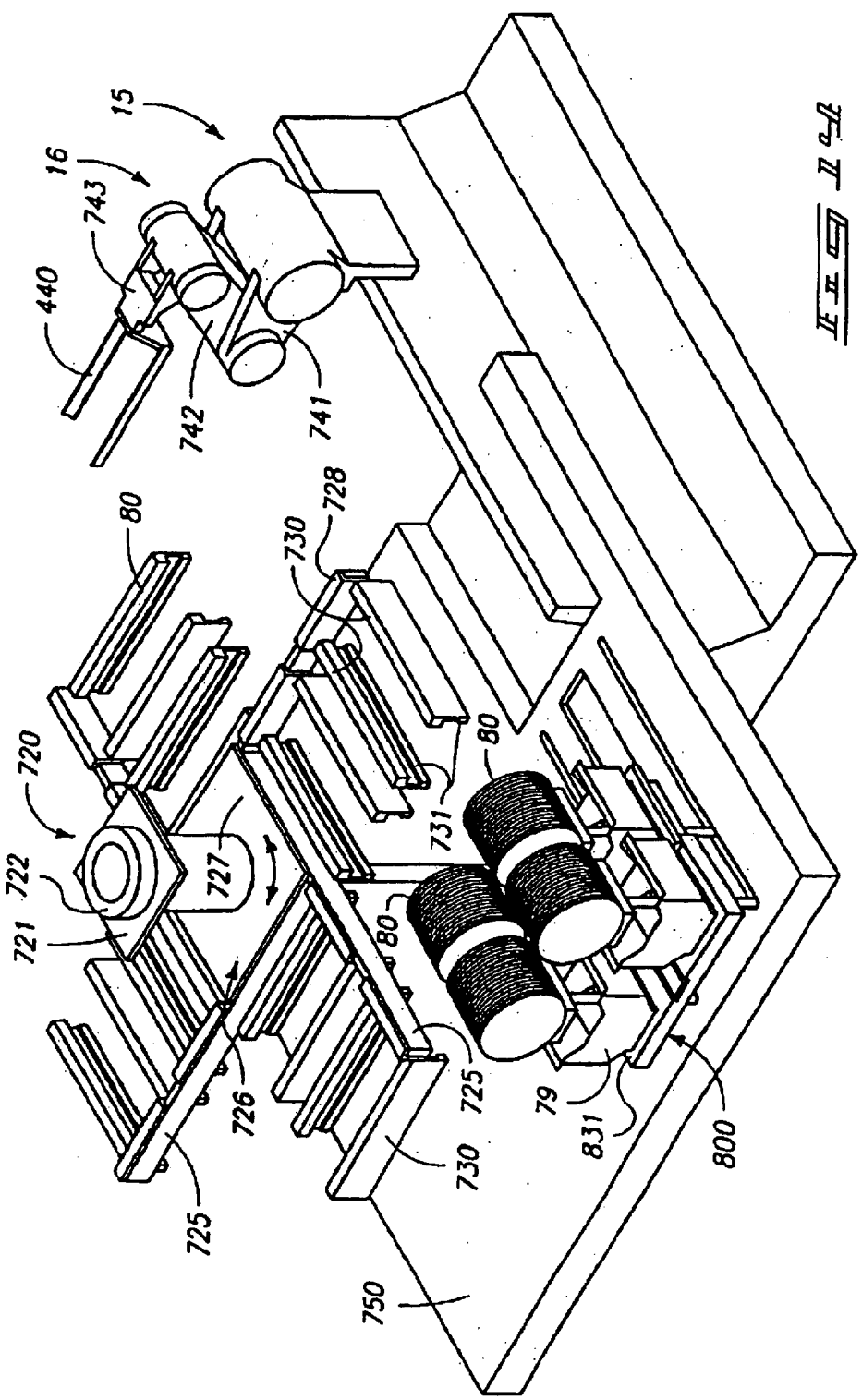

The transfer subassembly 810 also includes at least one second carriage. As shown, the second carriage includes the wafer lift heads 821 described above. The lift heads serve as supports for wafers or other semiconductor articles being transferred. In the exemplary construction shown, the lift heads are supported upon upstanding lift head extension rods 820. The lift heads and portions of the lifting rods extend through the openings in the receptacles 833, such as shown in FIG. 14.

In the preferred construction shown there are two second carriages. One of the second carriages include the first set of lift heads which extends through the first deck 831. The other second carriage includes the second set of lift heads which extend through the second deck 832. The second carriages are preferably operated in an independent manner using the construction which will now be described.

The second carriages also include transverse second carriage members 813. The transverse second carriage members 813 form a connecting bar which supports the lift rods 820 near the ends of each connecting bar. The connecting bars, lift rods and lift heads move upwardly and downwardly as the parts of the second carriage assemblies. These second carriage assemblies are move by second carriage assembly operators. In the preferred construction, these operators include a suitable linear drive mechanism, such as a helical screw drive. The drive shown in FIG. 8 includes a drive motor 814 which drives a screw member 841. A screw drive follower 842 is nonrotatably supported within a guide channel 843 formed in the side of the main part 811. The transverse members 813 are connected to the drive followers 842 by fasteners 844. This construction provides vertically moveable second carriage assemblies which each move independently relative to the main piece 811 using second carriage elevator motors 814.

It is further noteworthy that the wafer lift heads 821 are preferably provided with a series of wafer or other semiconductor article receiving grooves or other similar receiving features 822 which allow an array of wafers or other articles to be held therein.

Transfer of Wafers Between Carriers and Carrousel

FIGS. 9–21 illustrate the preferred operation and methods according to the invention. The methods described in this section include loading the processor and those steps involved in transferring wafers 80 from carriers 79 to the carrousel array held by carrousel 720.

FIG. 9 shows an initial stage of the methods wherein the wafer transfer has been controlled by positioning the upper deck 832 of the transfer first carriage toward the opening 702 (not shown in FIG. 9 see FIG. 1). The illustrated carriers 79 and supported wafers 80 are awaiting loading onto the upper deck 832. The carriers are then manipulated manually or by machine to perform loading of the carrier or carriers through the opening 702 and onto the upper deck. The loading is preferably performed so as to provide positioning of the carriers onto the deck and into the carrier support receptacles 833, or other features used to properly position the carriers upon the transfer first carriage.

Figure 13:
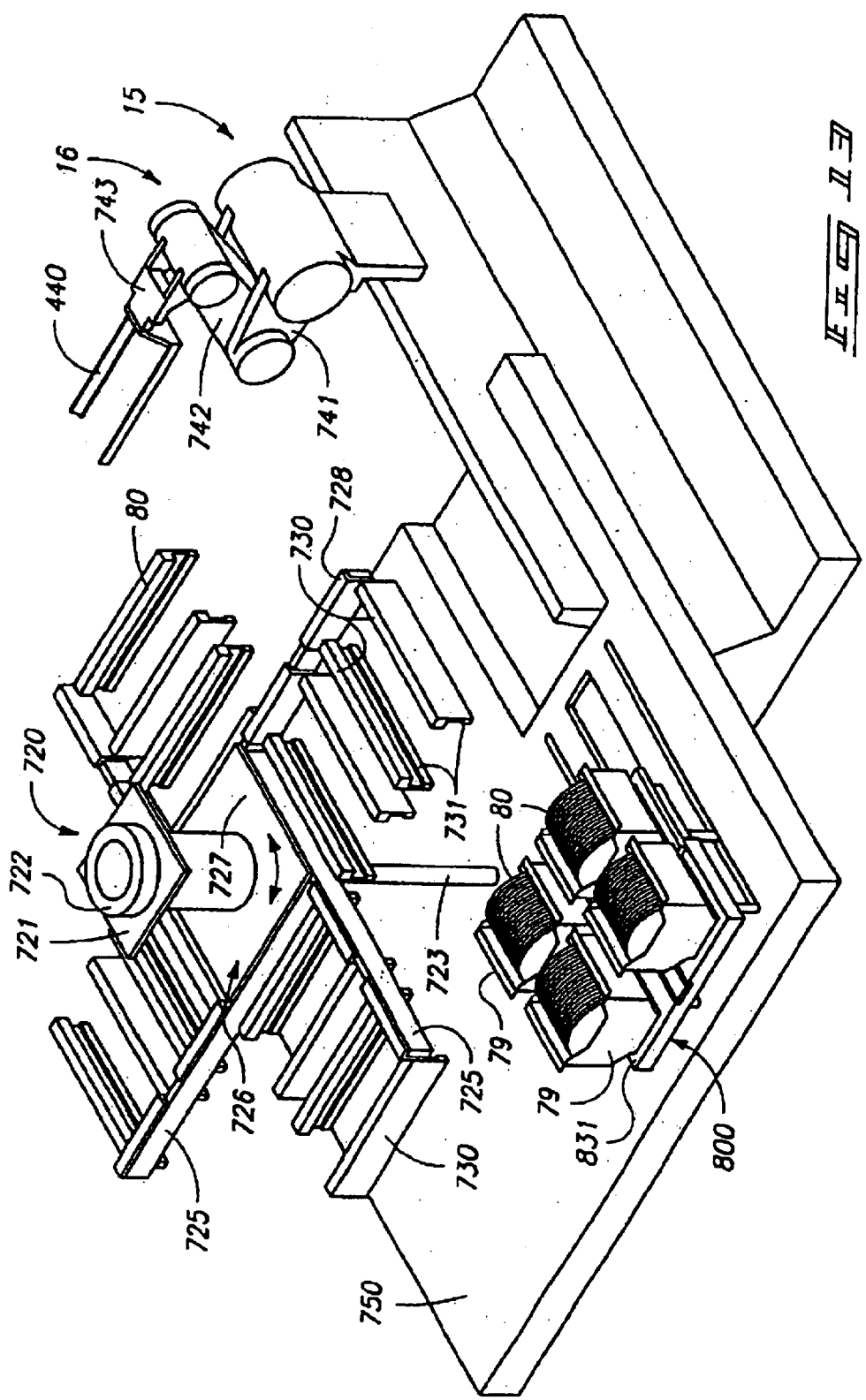

After the carriers have been positioned upon upper deck 832, then operation preferably proceeds by retracting or otherwise moving the upper deck into the position shown in FIG. 12. This retracting step allows access to the carrier receptacles 833 formed on the lower deck 831. This causes a presenting of the second set of carrier receptacles in preparation for loading of carriers thereon in the same manner as just described above. FIG. 13 shows the second set of carriers loaded onto the lower deck 831. With this action the transfer mechanism is fully loaded with wafer carriers having wafers contained therein.

FIG. 14 illustrates the step of separating the wafer 80 or other semiconductor articles from the carriers 79. The separating of the articles from the carriers can be effected by raising or elevating the lifting heads 822. The raising or extending step is preferably powered using the second carriage operators 814 which lift the heads relative to the first carriage of the transfer mechanism.

Figure 15:
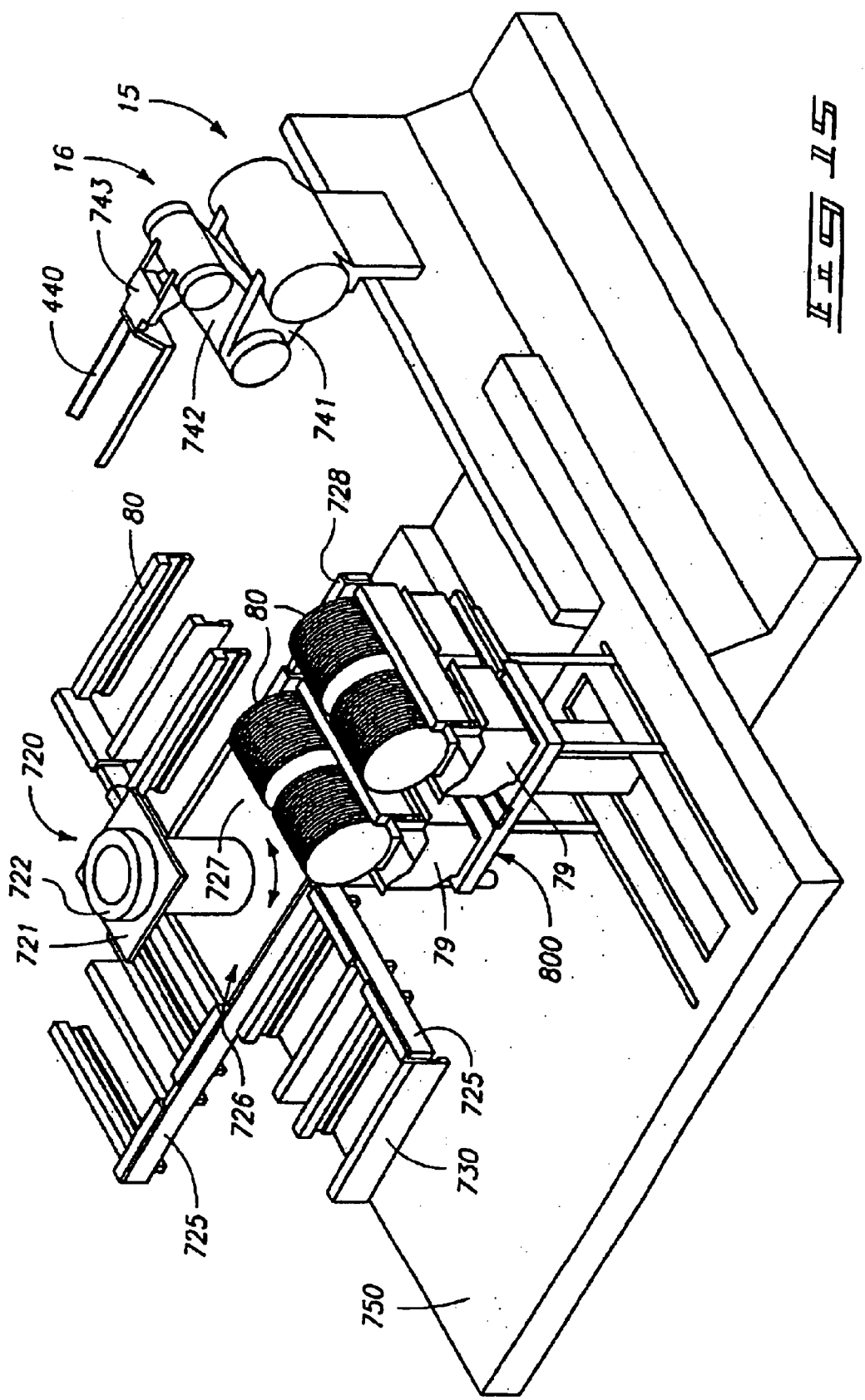

FIG. 15 shows a further stage of the transfer process wherein the two carrier-loads over the upper deck 832 are moved to effect a positioning of the wafers over the wafer supports provided on the carrousel. To effect this step, the carrousel is adjusted as needed by moving the carrousel angularly into the aligned pre-loading position shown in that Fig. Thereafter the step of translating the lateral stage of the transfer mechanism toward the open wafer support brackets 728 receptacles or receivers is performed. The first set of wafers is first positioned over the wafer supports on brackets 728 at the desired positions.

Figure 16:
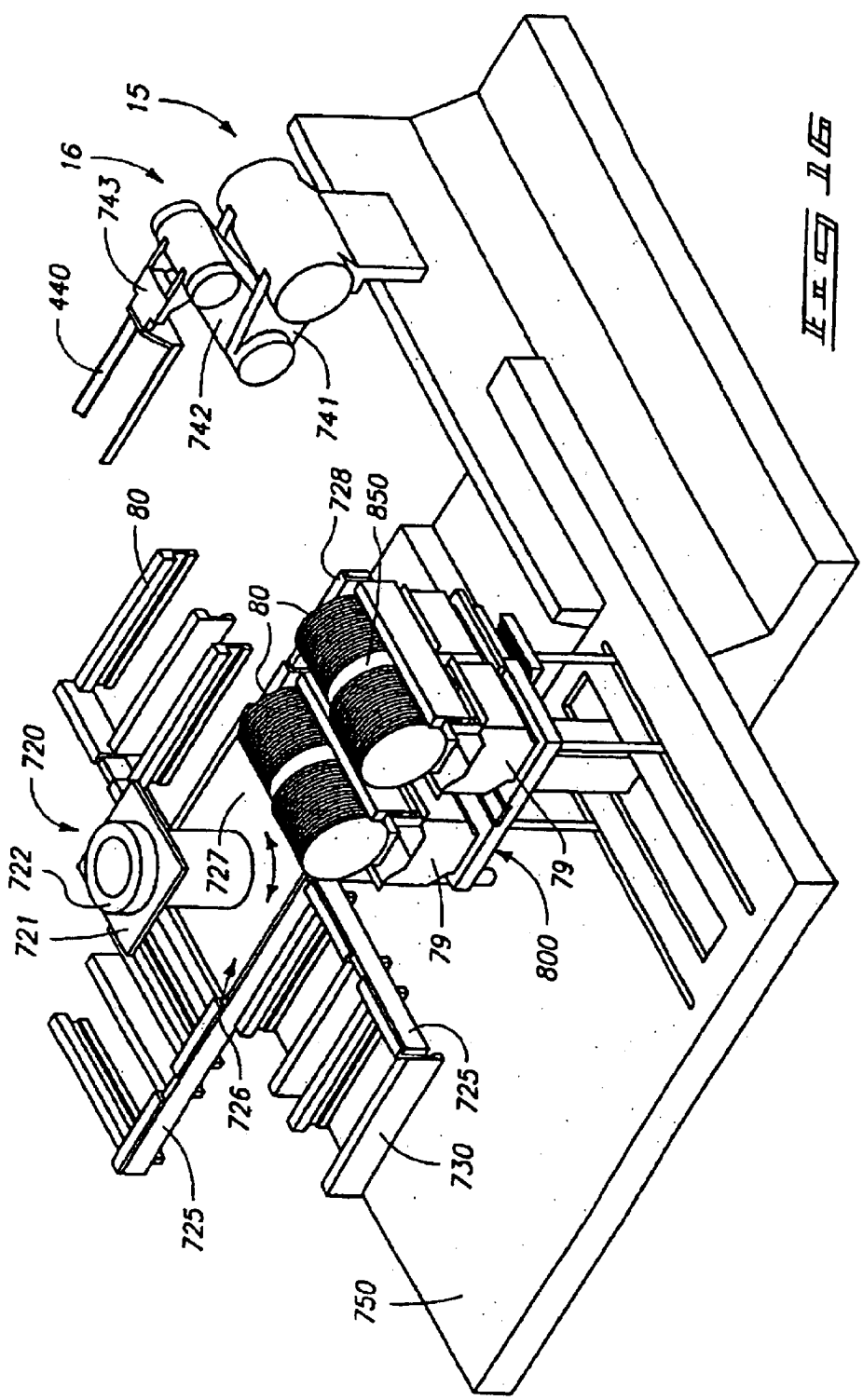

FIG. 16 then shows the upper deck lifting heads retracted downwardly after a retracting step has been performed upon the upper deck second carriage. This retracting step causes a downward lowering and transferring of the wafers from the receiving grooves 822 in the lifting heads 821 to the receiving grooves 732 formed in the carrousel wafer supports 730.

Figure 17:
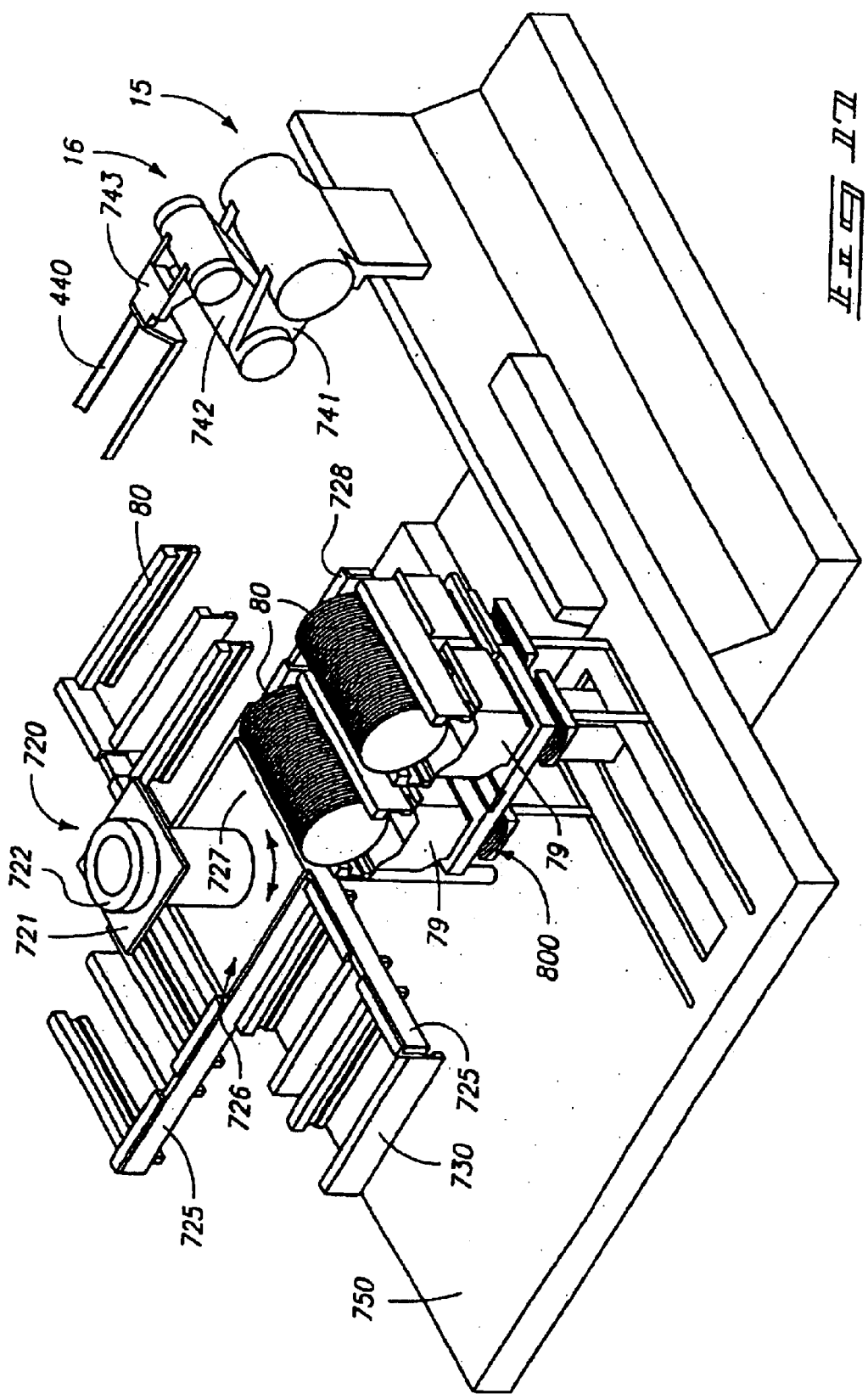

FIG. 17 shows that the wafer lifted from the lower deck 831 are similarly transferred to the carrousel wafer supports. It should be noted that more efficient use of space is accomplished by placing the second set of wafers into closer proximity with the first set of wafers, than is otherwise allowed due to the size and geometry of the wafer carriers. This is indicated by elimination of the medial gap 850 (FIG. 16) as indicated in FIG. 17. The result is to form two parallel carrousel batch arrays each having fifty (50) or other suitable number of wafers, starting with twenty five (25) from each wafer carrier. Although this configuration is preferred it is alternatively possible to use less or more numbers of carriers to form a single carrousel batch array.

Figure 18:
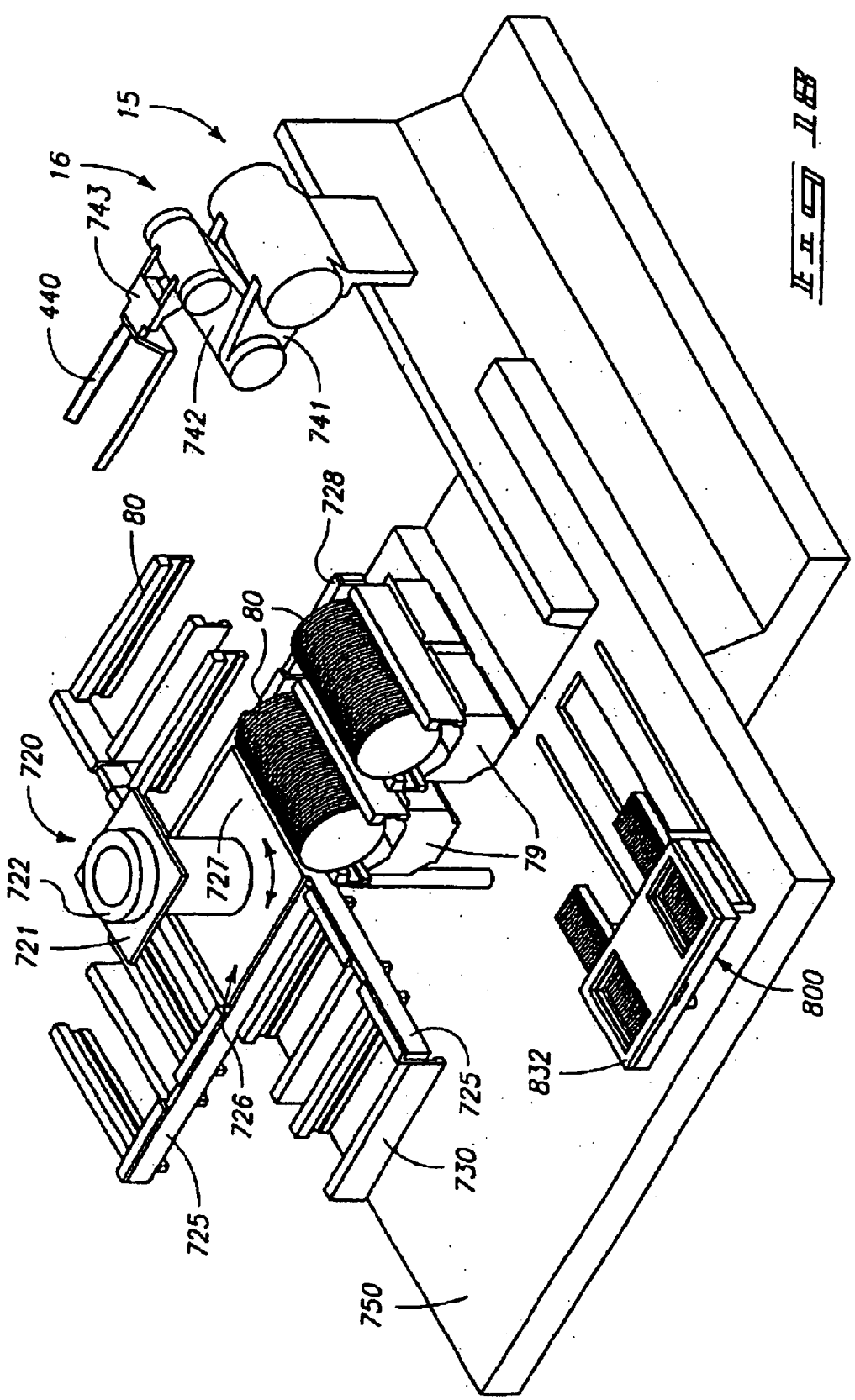
Figure 19:
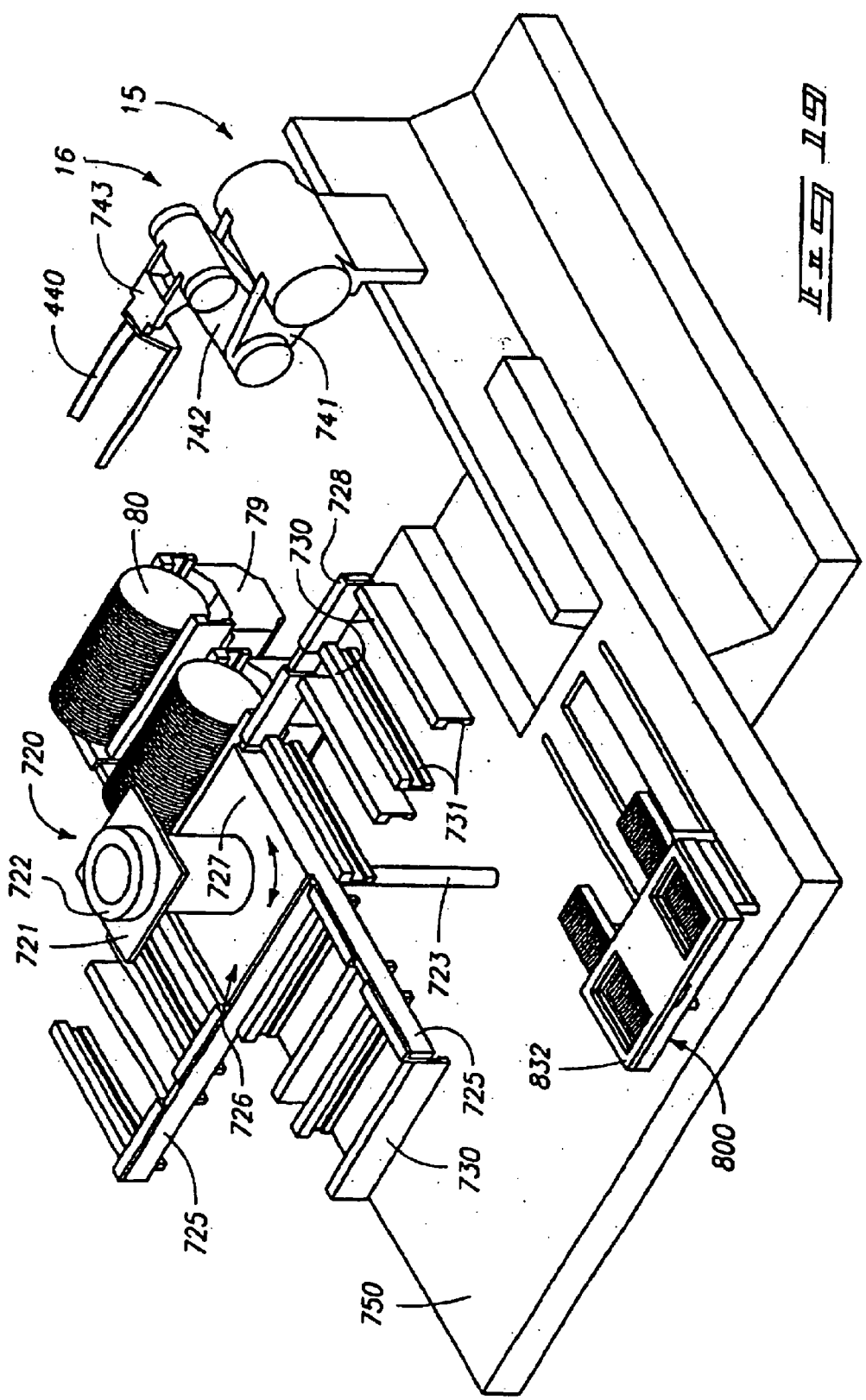

FIG. 18 shows the wafer transfer subassembly fully retracted away from the carrousel and prepared to accept another group of four (4) loaded wafer carriers to load another arm of the carrousel. Prior to undertaking such loading and transferring, the carrousel is affected by moving the carrousel angularly as illustrated in FIG. 19. This rotating of the carrousel also performs an aligning or positioning step so that the robotic wafer conveyer 15 can interact with the carrousel batch arrays.

Figure 20:
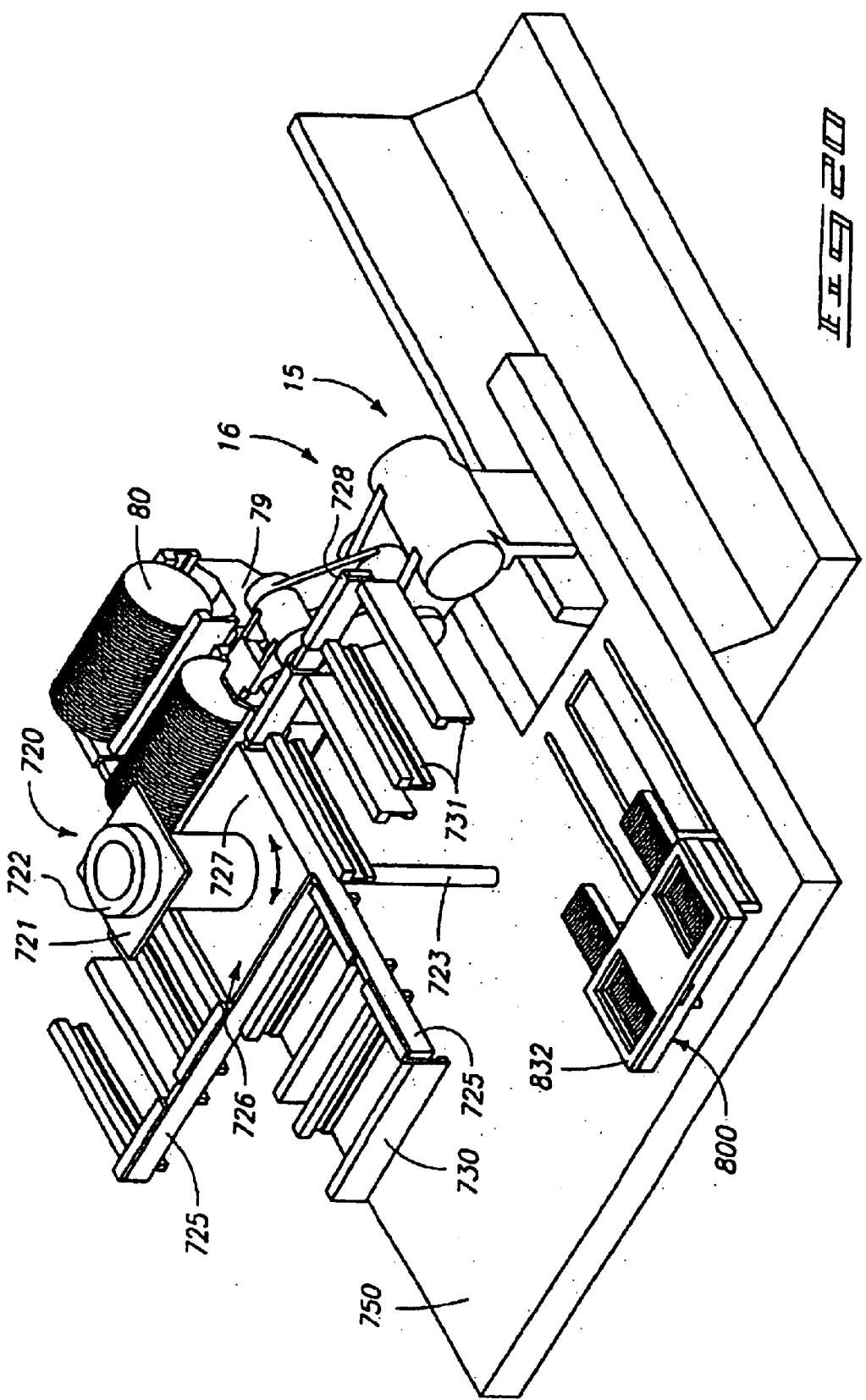
Figure 21:
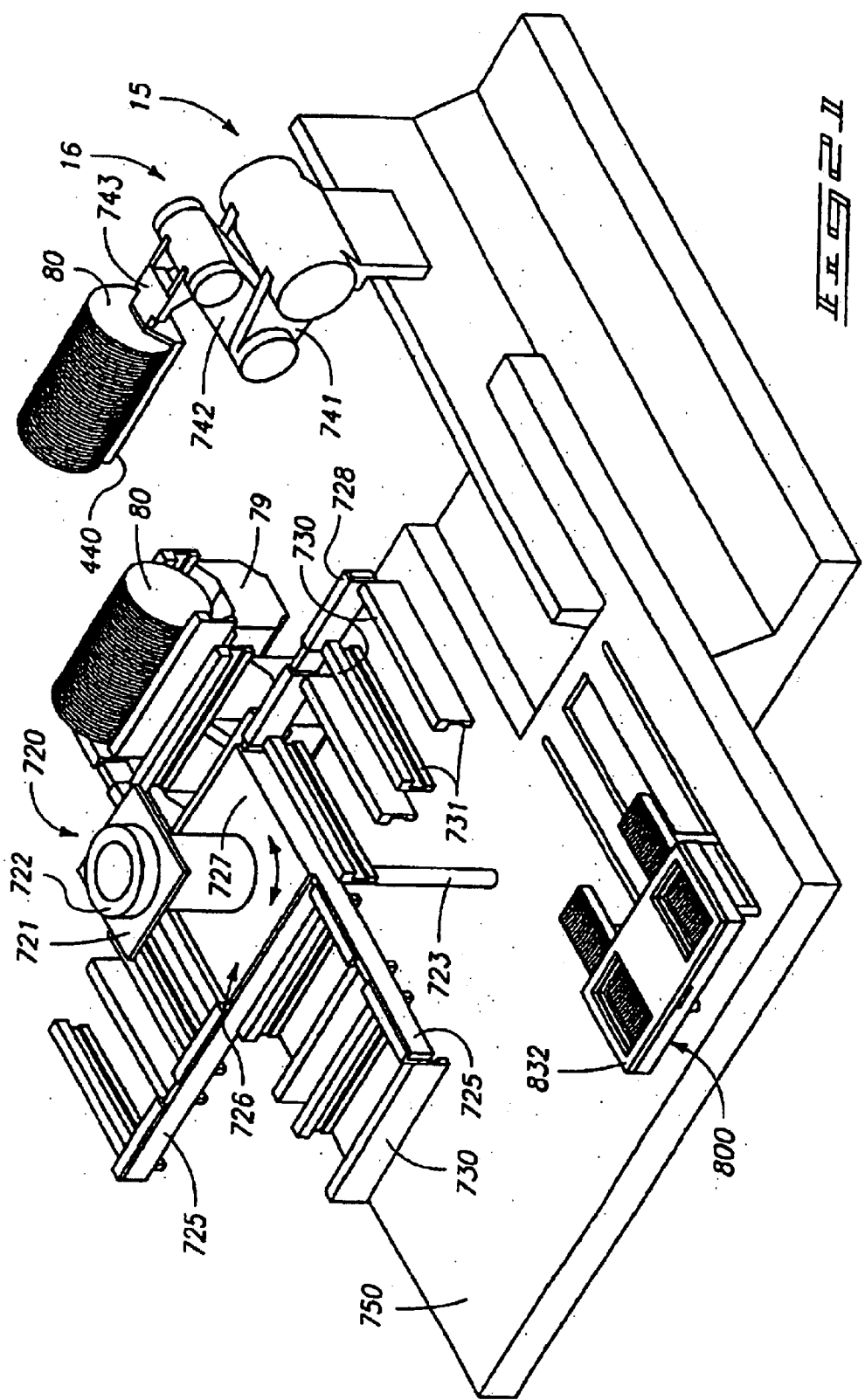

FIG. 20 shows the robotic conveyor 15 after positioning the conveyor into a carrousel engagement position. In this positioning step the wafer engagement implement 140 is extended under the wafers held on the carrousel. The conveyor then performs a lifting step which separates the wafers from their supported positions on brackets 728. The conveyor then performs a series of conveying movements, such as illustrated in FIG. 21. The moving or conveying step is performed to relocate the wafers into position for loading into the desired processing station 19. More specific explanation about the loading (installing) and unloading of the wafers into the processing stations 19 will be given below after first considering the preferred construction of the engagement implements and corresponding rotors which can advantageously be employed in the invention.

First Processing Rotor and Transfer Implement

Figure 23:
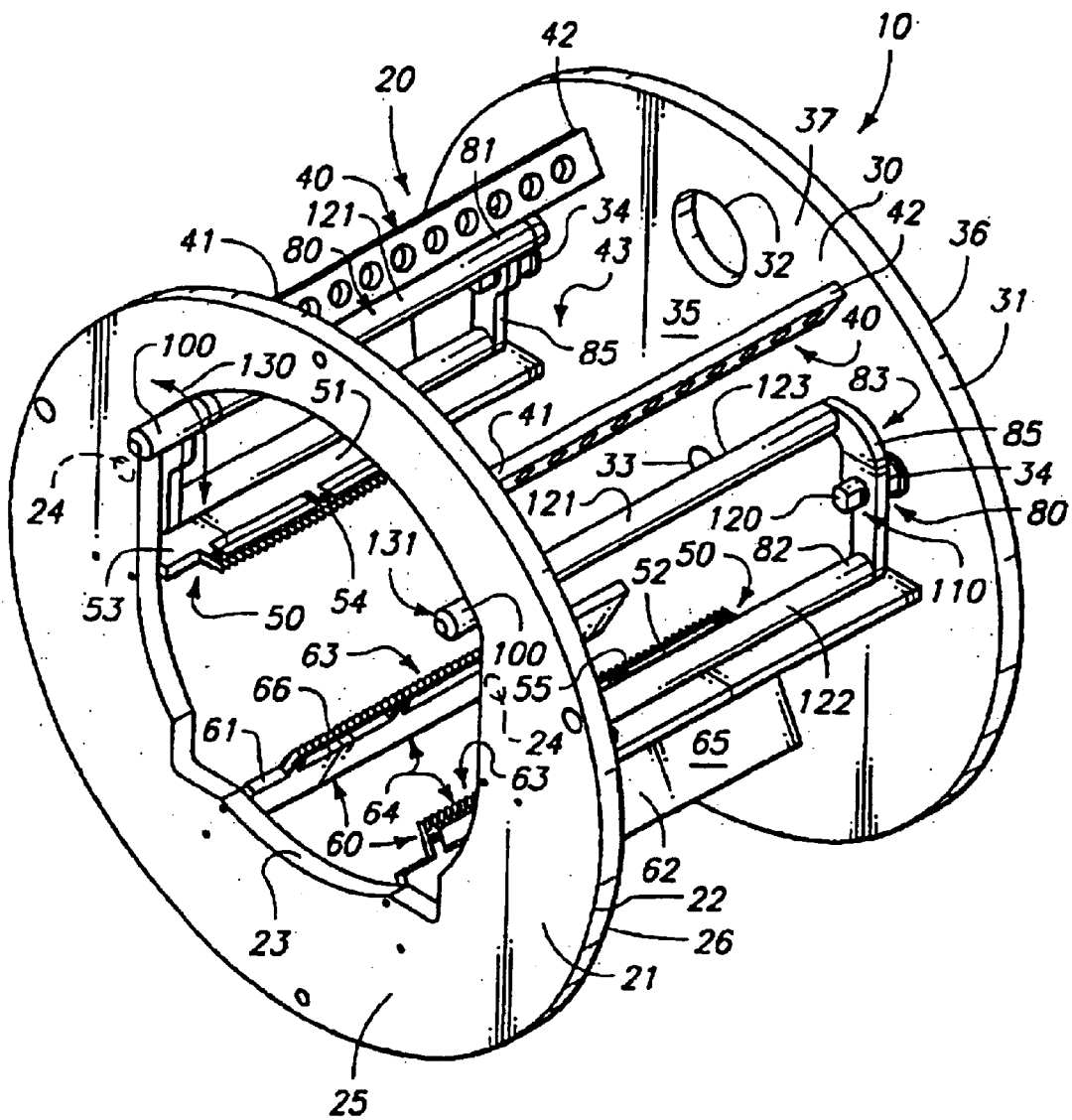
FIG. 23 is a perspective view of a preferred centrifugal processor rotor utilized in the system of FIG. 1.

A first embodiment of preferred centrifugal processor rotor used in the present invention is generally indicated by the numeral 10 in FIG. 23. The centrifugal processor rotor forms part of the larger machine or processing system 11 described above.

Figure 22:
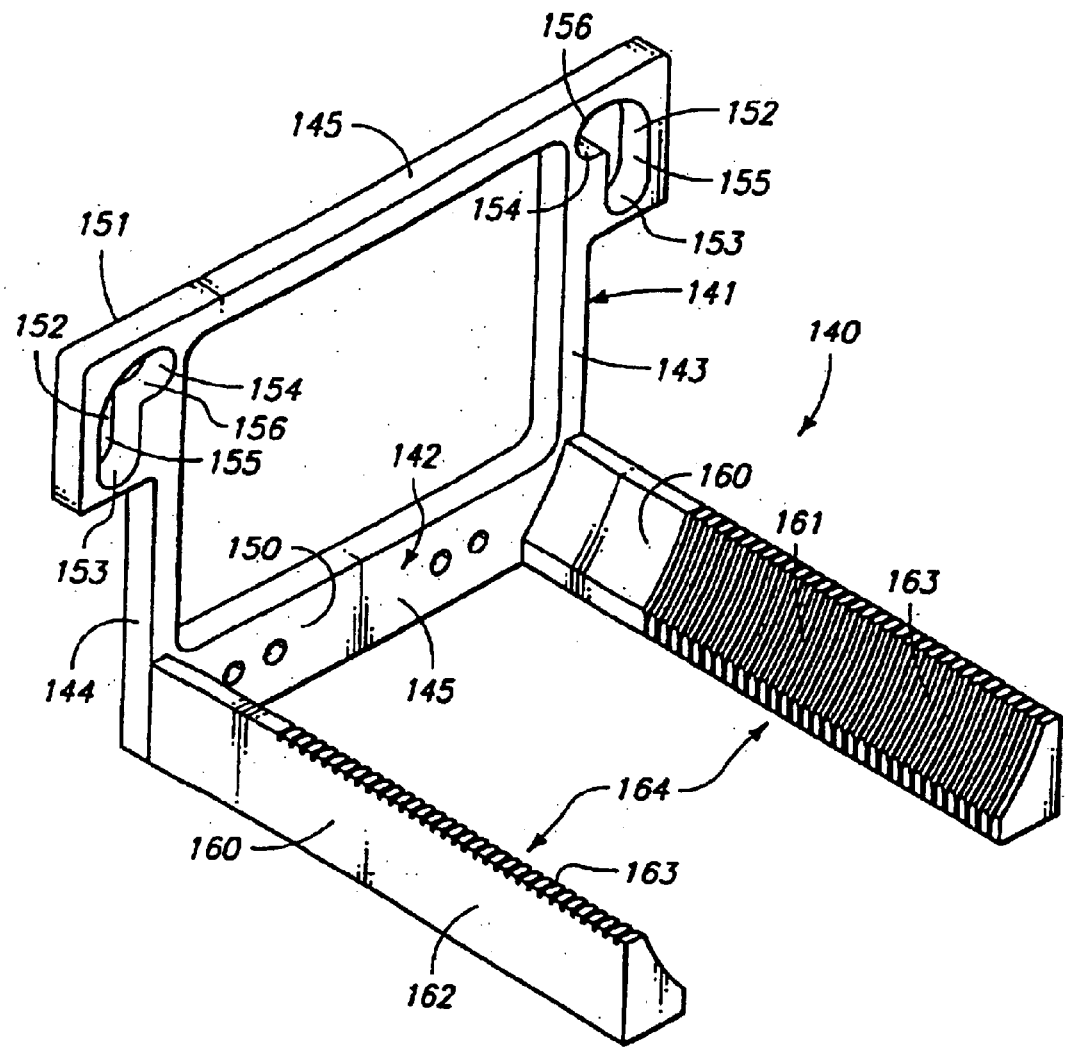
FIG. 22 is a perspective view of a transfer implement which is utilized in the system of FIG. 1.

FIGS. 24–27 show a first preferred embodiment of rotor 10 and article transfer implement 140 in different positions in order to illustrate the various features of each and their cooperation to perform the novel operational methods described herein. FIG. 22 shows the transfer implement 140 alone. FIG. 23 shows the rotor alone.

The centrifugal processor rotor 10 includes a rotor frame 20. The rotor frame has a front portion or plate 21 which is defined by a peripheral edge 22. The front portion 21 further defines a substantially centrally disposed opening or aperture 23, and a pair of mounting apertures 24. The front portion or plate 21 has a forwardly facing surface 25, and an opposite rearward facing surface 26. Mounted in suitable relationship, such as the substantially parallel spaced relationship relative to the front plate 21, is a rear portion or second plate 30. The rear portion 30 has a peripheral edge 31, and further defines a major aperture 32, and a minor aperture 33. The minor aperture is disposed in substantially coaxial alignment relative to the axis of rotation of the rotor frame 20.

The rear portion further defines a pair of mounting apertures 34. The rear portion 30 has a main body 35 which is substantially planar, and circular in shape, and which has substantially the same diametrical dimensions as the front portion 21. The main body 35 is further defined by an exterior facing surface 36, and an opposite, interior facing surface 37, respectively.

The individual front and rear portions 21 and 30, respectively, are held together in a suitable construction, such as the illustrated substantially coaxial and parallel spaced relation by means of rotor frame members 40 which are spaced about the rotor. Each of the rotor frame members 40 have a first end 41, which is fixed on the front portion 21 by utilizing conventional fastening methods, and an opposite, second or distal end 42, which is mounted on the rear portion 30 by using the same techniques. The location of the first and second plates in the given orientation described above defines a processing cavity 43 therebetween.

As best seen by reference to FIG. 23, a pair of laterally disposed support members, or combs 50 are borne by the rotor frame 20 and are positioned in the cavity 43. The combs 50 include a first comb 51, and an opposite, second comb 52 which are individually affixed on the interior facing surfaces 26 and 37 of the first and second portions 21, and 30 respectively. The first and second combs extend substantially normally outwardly relative to the surfaces 26 and 37, as shown. The first and second combs 51 and 52 are disposed to hold the wafers or other semiconductor articles being processed. This can advantageously be in the form of the illustrated substantially parallel, spaced configuration shown.

Each of the first and second combs has a frame portion 53, which is affixed on the front portion 21, and the rear portion 30, by using conventional fastening techniques Further, each of the first and second combs has a comb portion 54 which is defined by an undulating peripheral edge 55. The undulating peripheral edges 55 are positioned in inwardly facing relation, one to the other, and are operable to engage the semiconductor articles as will be discussed in further detail in the paragraphs which follow. The peripheral edge may be provided in various materials or with various surface coatings which will protect the semiconductor articles which come into contact with same. One preferred construction utilizes a tetrafluoroethylene polymer plastic material. Others materials and constructions are alternatively possible.

FIG. 23 further shows a pair of base combs, identified hereinafter as first and second base combs 61 and 62, respectively. These base combs are affixed by conventional fastening techniques on the front and rear portions 21 and 30 respectively. The pair of base combs are shown disposed in parallel spaced relationship, and are generally aligned with the rotational axis of the rotor. The first and second base combs, in combination with the first and second laterally disposed combs 51 and 52, define an article receiving assembly or receiver 63 which is operable to hold, support or cradle the articles in desired processing positions. The receiver is also preferably constructed to otherwise orient the semiconductor articles in substantially coaxial alignment relative to the axis of rotation of the rotor frame 20.

Figure 25:
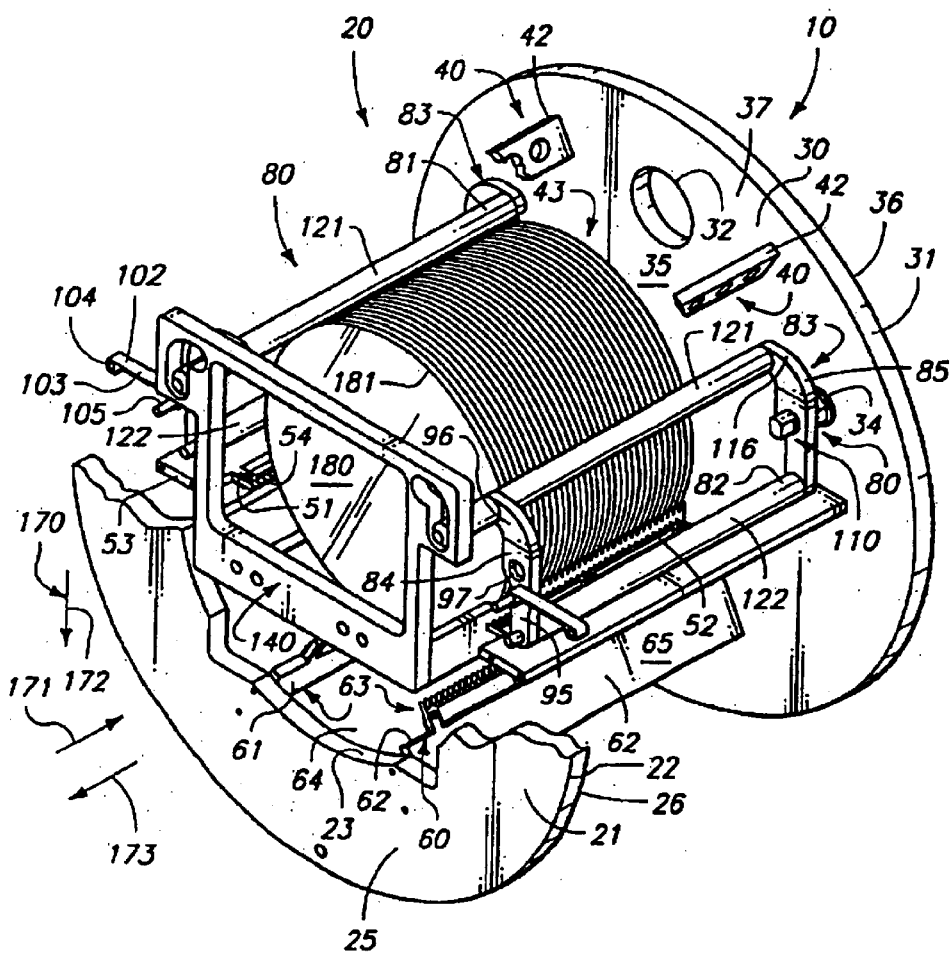
FIG. 25 is a fragmentary, perspective view of the centrifugal processor rotor shown in FIG. 23, at a processing step subsequent to that shown in FIG. 24. Some portions are removed to show the underlying structures.

FIG. 25 shows that the base combs define a gap 64 therebetween and which has a given cross-sectional dimension. The individual base combs 61 and 62 each have a frame portion 65 which is affixed on the surfaces 26 and 37 respectively. The individual base combs further include an undulating peripheral edge 66 having receiving grooves and interposed projections.

Figure 4:
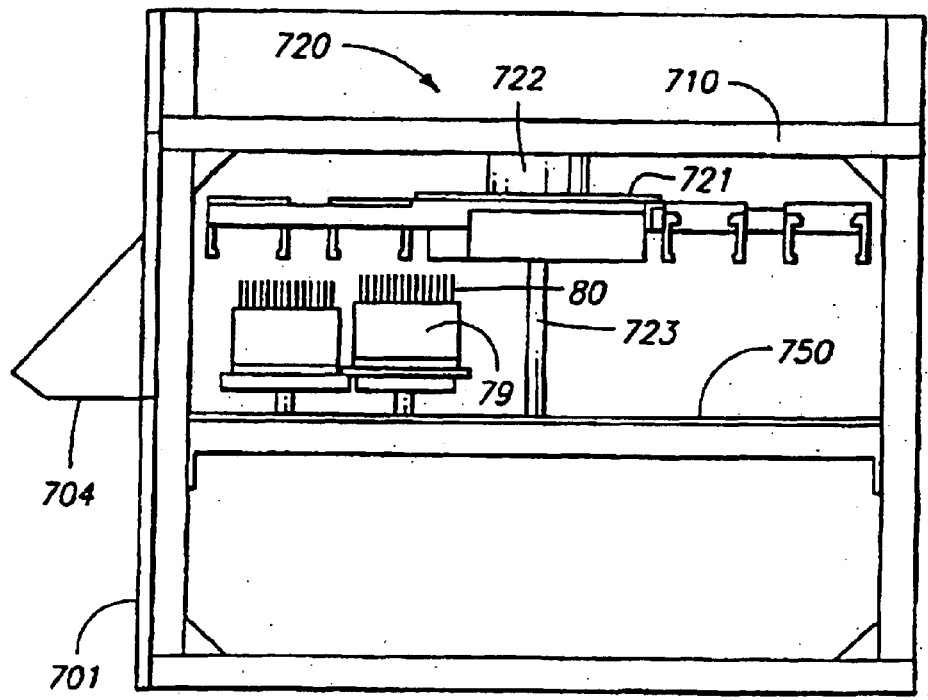
FIG. 4 is a partial side elevational view of portions of the interface section of the processing system of FIG. 1.

As best illustrated by reference to FIGS. 4 and 5, the centrifugal processor rotor 10 includes a pair of retainer assemblies 80. The retainer assemblies 80 will be identified hereinafter as a first retainer assembly 81, and a second retainer assembly 82, respectively. As will be appreciated by a study of the drawings, the first and second retainer assemblies 81, and 82 are substantially mirror images of each other, and therefore the features of only one of the retainer assemblies will described in detail hereinafter. Each retainer assembly 80 includes a pair of end pieces 83. The end pieces are identified as a first or forward end piece 84, and a second or rearward end piece 85. The first end piece 84 has a main body 90 which has a first end 91, and an opposite second end 92. The main body is further defined by an interior facing surface 93, and an opposite, exterior facing surface 94. The main body 90 also has a substantially linear portion 95, and a curved portion 96.

Figure 3:
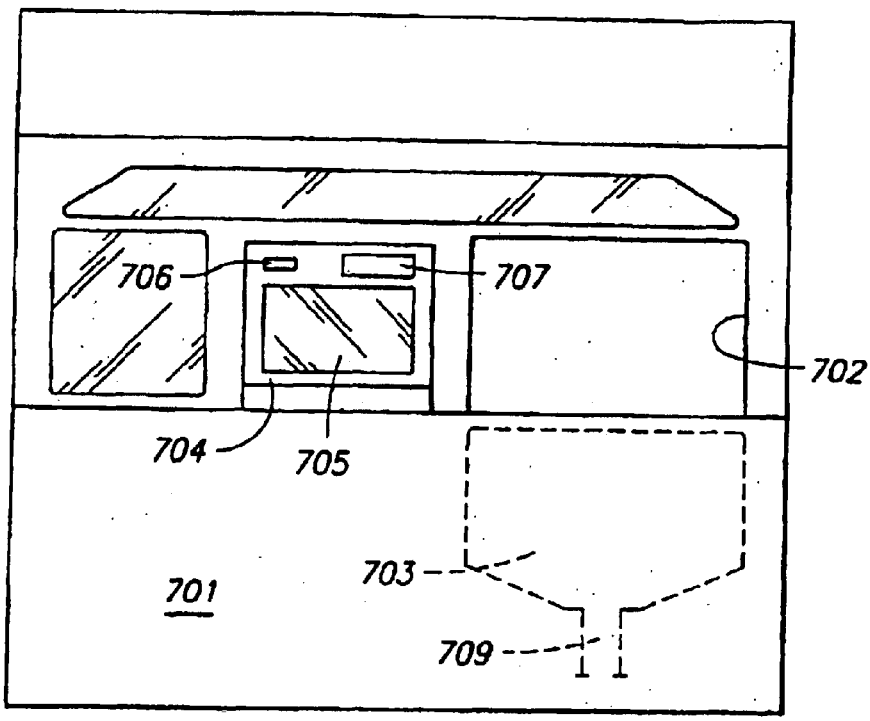
FIG. 3 is a front elevational view of the processing system of FIG. 1.
Figure 24:
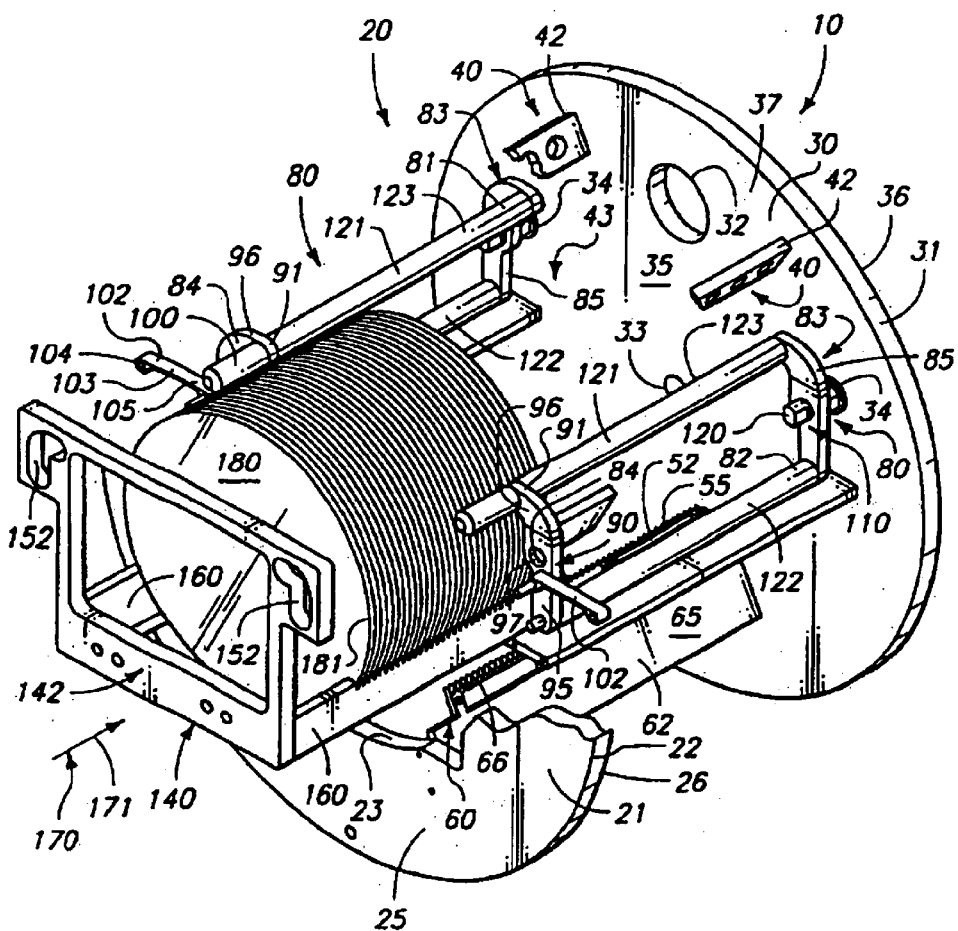
FIG. 24 is a fragmentary, perspective view of the centrifugal processor rotor of FIG. 23, with the some portions removed to better show underlying structures.

As illustrated in FIG. 24, the main body 90 is substantially curvilinear in its overall shape. A centrally disposed aperture 97 is formed in the linear portion 95. Further, an engagement member 100 extends normally outwardly relative to the exterior facing surface 94. A biasing member or spring 102 is borne by the rotor frame 20. The spring has a main body 103, with a first end 104 which is fixed by a conventional fastener on the rear surface 26 of the front portion 21; and a second end 105, which is fixed in a predetermined location on the linear portion 95 of the main body 90. The operation of the biasing member or spring 102 will be discussed in greater detail hereinafter. As will be recognized, from a study of FIGS. 3 and 4, the main body 90 is mounted for rotational movement about a front pin (not shown) and which is received in the individual mounting apertures 24.

The mounting pin is further in mating relationship and received in the aperture 97.

FIG. 25 illustrates that the second end piece 85, of the respective retainer assemblies 80, has a main body 110 which includes a first end 111, and an opposite, second end 112. The main body 110 further is defined by an interior facing surface 113; an opposite, exterior facing surface 114; a linear portion 115; and a curved portion 116 which is positioned at the first end 111 thereof. A centrally disposed aperture 117 is formed in the linear portion 115. A rear pin 120 is received in mating relation in the aperture 34. The rear pin 120 is also received in the central aperture 117 thereby rendering the main body 110 rotatable about the rear pin 120.

Fastened on the first end 91 and 111 of the first and second end pieces 84 and 85 respectively, is a first longitudinally disposed member 121. Further, fixed on the second end 92 and 112 of the first and second end pieces 84 and 85, respectively is a second, longitudinally disposed member 122. The first and second longitudinally disposed members 121, and 122 are suitably oriented, such as in the fixed substantially parallel spaced relationship shown. These members are also further oriented in substantially parallel relationship to the axis of rotation of the rotor frame 20.

The first longitudinally disposed member 121 includes an inside facing peripheral edge 123 which is coated with a material that does not harm or contaminate the semiconductor articles which are being processed.

Figure 26:
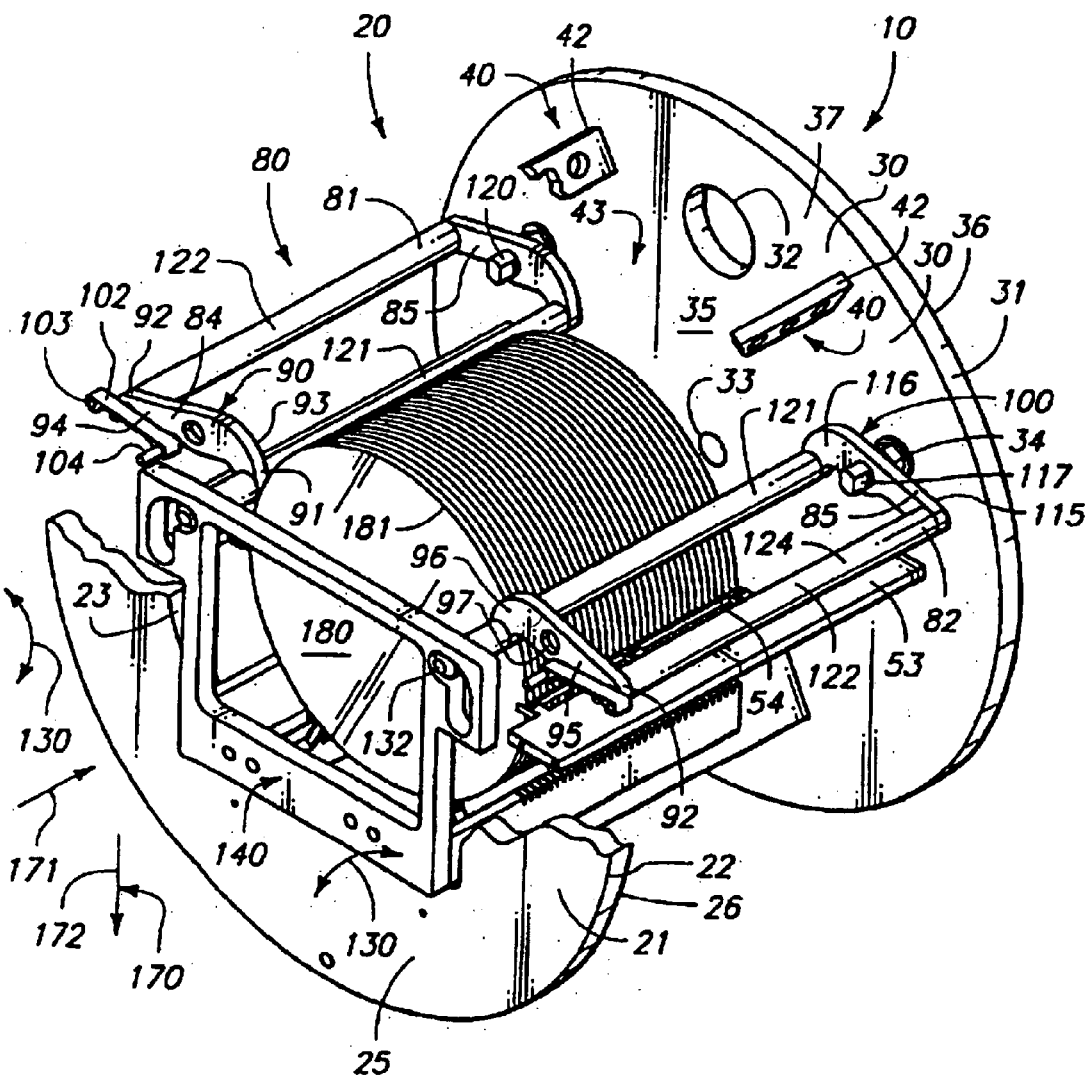
FIG. 26 is a fragmentary, perspective view of the centrifugal processor rotor shown in FIG. 23, at a processing step subsequent to that shown in FIG. 25. Some portions are removed to show the underlying structures.

The respective retainer assemblies 80 move along predetermined paths of travel 130 between a first, or open position 131 (FIG. 23), and a second, or closed position 132 (FIG. 26). As will be recognized by a study of FIG. 27, the respective retainer assemblies 80, when disposed in the second position 132, secure the individual semiconductor articles on the object receiving assembly 63 for centrifugal processing. Further, it should be understood that when the individual retainer assemblies 80 are positioned in the second position 132 (FIG. 27), the second longitudinally disposed members 122 are operable, under the influence of centrifugal force imparted to the respective longitudinally disposed members 122 by the rotation of the rotor frame 20, to exert radially inward forces on the semiconductor articles thereby securing them in substantially coaxial alignment relative to the rotor frame 20.

The centrifugal processor rotor 10 of the present invention works in combination with a transfer implement which is designated generally by the numeral 140 in FIG. 22. The transfer implement 140 includes a face plate 141 which is releasably secured on the distal end 17 of the arm 16. The face plate has a main body 142 which is defined by a left portion 143; a right portion 144; and bridging portions 145 which connect the left and right portions 143 and 144 together. Further, the face plate 141 includes an inside facing surface 150, and an outside facing surface 151. The outside facing surface is releasably secured in juxtaposed relation relative to the distal end 17 of the robotic arm 16.

A pair of apertures, 152 are individually formed in the face place 141. In this embodiment, the individual apertures have a first end 153; and an opposite, second end 154. The respective apertures further have a vertically oriented portion 155, and a substantially horizontally oriented portion 156. As best seen by reference to FIG. 24, the individual apertures 152 are substantially curvilinear in shape.

The transfer implement 140 includes a pair of arms 160 which extend substantially normally, outwardly relative to the inside facing surface 150 of the main body 142. In this regard, each of the arms includes a first arm 161, and a second arm 162 of substantially identical dimensions. Each of the arms 161 and 162 has a generally upwardly oriented surface which has a number of repeating undulations or grooves 163 formed therein. The upwardly facing surface may be coated or treated with a material which protects and does not substantially contaminate the semiconductor articles while being transported.

As best seen by reference to FIGS. 2 and 7, a gap 164 is defined between the first and second arms 161, and 162. It should be recognized that the gap 164 is larger than the gap 64 which is defined between the first and second base combs 61 and 62 respectively.

Figure 27:
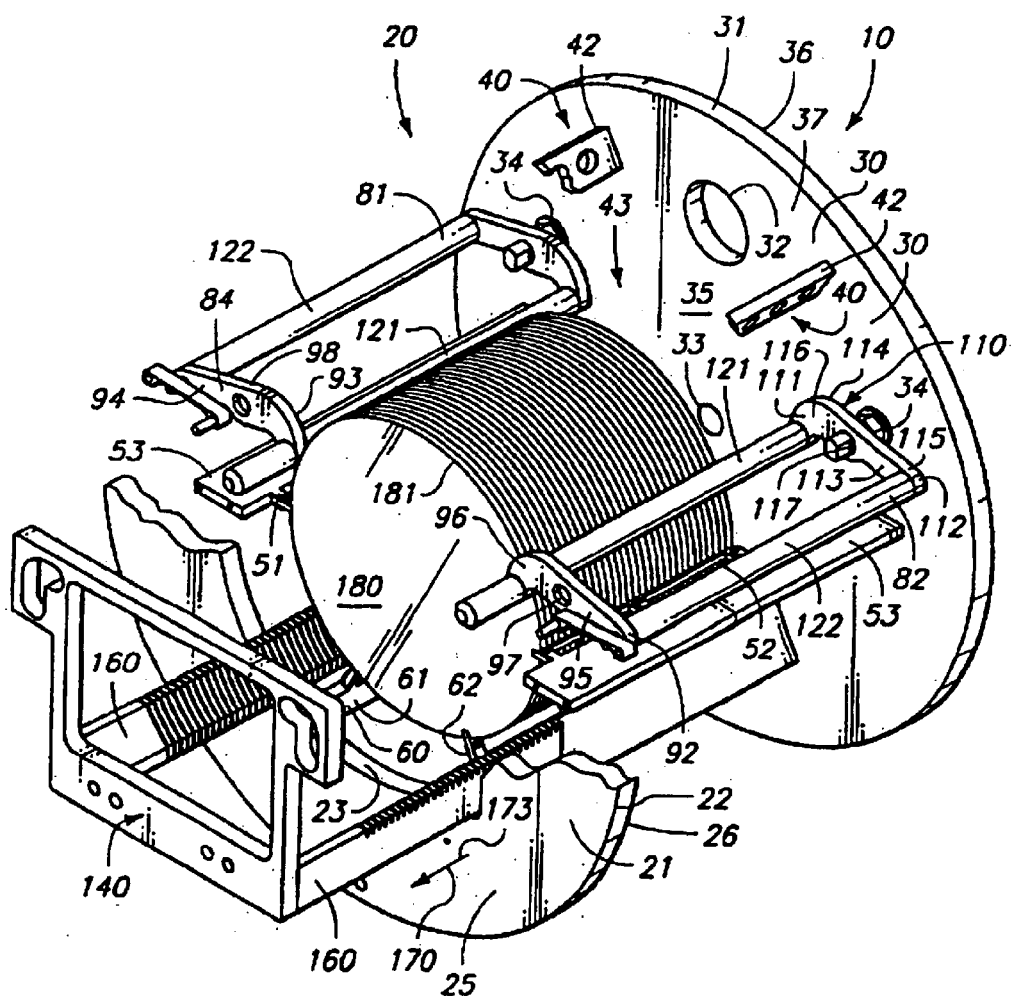
FIG. 27 is a fragmentary, perspective view of the centrifugal processor rotor shown in FIG. 23, at a processing step subsequent to that shown in FIG. 26. Some portions are removed to show the underlying structures.

The transfer implement 140 is moveable along a given course of travel 170. The course of travel comprises a first component 171, (FIG. 24); a second component 172 (FIGS. 5 and 6); and a third component 173 (FIG. 27). The first and third components 171, and 173, are substantially parallel to each other, and the second component 172 is substantially transversely disposed relative to the first and second components. As will be recognized, the transfer implement 140, while traveling along the first course of travel 171, cooperates with the individual engagement members 100 at the end of the first course. Continued movement of the transfer implement 140 along the second component 172, imparts force to the retainer assemblies, thereby effectively urging the retainer assemblies along their respective paths of travel 130, from the first position 131, to the second position 132. Further, the movement of the transfer implement 140 along the second course 172 brings the semiconductor articles, here illustrated as a plurality of silicon wafers 180 into resting relation onto the object receiving assembly 63.

FIG. 24 shows that the transfer implement carries the individual wafers or other articles in spaced, substantially parallel relation in a batch array.

The transfer implement 140 while moving along the first course of travel 171 cooperates with the respective engagement members 100 by receiving the respective engagement members in the individual apertures 152. As seen in FIG. 25, when the transfer implement 140 is located at the end of the first course 171, and at the beginning of the second course 172, the respective engagement members are located at the first end 153 of the individual apertures 152. As best understood by a comparison of FIGS. 5 and 6, movement of the transfer implement 141 along the second course 172 has the effect of urging the individual engagement members along the sides of the respective apertures 152, from the first end 153, to the second end 154 thereof. This movement of the engagement members 100 along the individual apertures 152 draws the engagement members 100 generally radially inwardly, thereby defining the paths of travel 130 which are substantially arcuate in shape (FIG. 23). It is also noteworthy that the apertures 152 are shaped to allow installation over the engagement members 100 for the entire range of positions which the engagement members can assume.

The article or object receiving assembly 63 carries or cradles the individual silicon wafers 180 in substantially the same orientation as the transfer implement 140. FIG. 27 shows that the object receiving assembly 63 passes through the gap 164 which is defined between the first and second arms 161 and 162 as the transfer implement 164 moves along the second course of travel 172. Once the plurality of wafers 180 are disposed in rested relation on the article receiving assembly 63, the transfer implement 140 moves along the third course of travel 173 out of the cavity 43. As will be seen by a study of FIG. 27, the movement of the individual retainer assemblies 80 along the paths of travel 130 between the first position 131 and second the position 132 orients the first longitudinally disposed members 121 in tangential, force engaging relation relative to the peripheral edge 181 of wafers 180. This effectively secures the individual wafers in substantially coaxial alignment relative to the axis of rotation of the rotor frame 20.

Upon rotation of the rotor frame 20, the second longitudinally disposed member 122 is acted upon by centrifugal force thereby further urging the first longitudinally member 121 into increased radially inward force transmitting relation relative to the wafers 180.

In addition to the centrifugal biasing which occurs, the biasing member 102 is a spring or other member which operates when the retainer assemblies 80 are in their first, or open position 131 to bias and urge the retainer assemblies 80. The retainers are biased in the direction of the first position 131, and in the direction of the second position 132. This accomplishes the desired conditions of either being held in the opened or closed retainer positions.

To remove the individual wafers 180 from the rotor frame 20, the reverse of the process outlined above would be followed. In particular, the transfer implement 140 would move along the third course of travel 173 into the cavity 43. At the end of the third course of travel 173, the engagement members 100 would be received in the apertures 152, and oriented at the second end 154 thereof. The transfer implement 140 would then travel along the second course of travel 172, in the direction of the first course 171. This movement of the transfer implement 140 effectively moves the engagement members along the path of travel 130, from the second position 132, to the first position 131. As will be recognized, this movement causes the longitudinally disposed members 121 to move out of tangential force engaging relation relative to wafers 180.

At the end of the second course, the engagement members 100 are oriented at the first end 153 of the respective apertures. Further, as the transfer implement 140 moves along the second course 172, the individual arms 160 engage, and cradle the wafers 180 thereby lifting them out of engagement with the article receiving assembly 63. The transfer implement then moves along the first course of travel 171 out of the cavity 43 and on to another work station.

Operational Description of First Rotor and Transfer Implement

The operation of the preferred embodiment of the present invention is believed to be readily apparent but is briefly summarized at this point.

The centrifugal processor rotor 10 is best seen by a reference to FIG. 23. The centrifugal processor rotor 10 for treating semiconductor articles, such as silicon wafers 180, includes a rotor frame 20 defining a cavity 43. A retainer assembly 80 is borne by the rotor frame 20 and positioned in the cavity 43. The retainer assembly 80 is moveable along a path of travel 130 from a first, open position 131, to a second closed position 132. An object receiving assembly 63 is borne by the rotor frame 20 and positioned in a given location in the cavity 43. The object receiving assembly 63 supports the semiconductor articles in the cavity 43 for centrifugal processing.

Still another aspect of the present invention includes a centrifugal processor rotor 10 for treating semiconductor wafers 180 comprising a rotor frame 20 defining a cavity 43 and having a predetermined axis of rotation. A pair of retainer assemblies 80 are borne by the rotor frame. Each retainer assembly 80 is rotatable about a given axis, and has at least one member 121 which moves along a given path of travel 130 from a first position 131 to a second position 132. An object receiving assembly 63 is borne by the rotor frame 20 and is located in the cavity 43. The object receiving assembly positions the semiconductor wafers 180 in substantially coaxial alignment relative to the axis of rotation of the rotor frame 20. A transfer implement 140 is moveable along a course of travel 170 into, and out of, the cavity 43. The transfer implement 140 supports the plurality of silicon wafers 180 in a predetermined orientation. Upon movement of the transfer implement 140 along the course of travel 170, the transfer implement 140 cooperates with the retainer assemblies 80, and further movement of the transfer implement 140 along the course of travel 170 following mating cooperation with the retainer assemblies 80, carries the semiconductor wafers 180 into resting relation onto the object receiving assembly 63. This movement of the transfer implement 140 along the course of travel 170 simultaneously urges the longitudinally disposed members 121 of the respective retainer assemblies 80 along their individual paths of travel 130 from the first position 131, to the second position 132.

Still a further aspect of the present invention includes a method for centrifugally treating a plurality of semiconductor wafers 180. The method for treating semiconductor wafers 180 comprises providing a rotor frame 20 which defines a cavity 43; providing a movable retainer assembly 80 which is borne by the rotor frame 20, and which moves along a given path of travel 130; providing an object receiving assembly 63 which is borne by the rotor frame 43; providing a transfer implement 140 which is moveable along a given course of travel 170, and which carries the plurality of silicon wafers 180 in a predetermined orientation into the cavity 43; urging the transfer implement 140 along the course of travel 170, the transfer implement 140 while moving along the course of travel 170 cooperating with the retainer assembly 80, and effectively imparting force to the retainer assembly 80 to urge the retainer assembly 80 along its respective path of travel 130, while simultaneously carrying the individual wafers 180 into rested relation onto the object receiving assembly 63. The retainer assembly 80 secures the individual semiconductor wafers 180 in fixed substantially coaxial orientation relative to the rotor frame 20. The method further includes the step of imparting rotational movement to the rotor frame 20 thereby creating centrifugal force which acts upon the respective semiconductor wafers 180 by means of the retainer assembly 80.

Therefore, the centrifugal processor rotor 10 of the present invention provides a convenient means by which semiconductor articles, such as a plurality of semiconductor wafers 180, can be centrifugally processed in a manner which avoids the shortcomings identified with the prior art practices and other devices.

Description of Second Rotor and Transfer Implement Assembly

FIGS. 8–11 show a further preferred rotor and transfer implement combination according to this invention. This combination includes a rotor assembly 310 which bears similarity to rotor 10 described above. Parts which are common to both rotor constructions and transfer implement constructions are similarly numbered with regard to the second embodiment using numbers in the 300's and 400's in lieu of numbers ranging from 10 up into the 100's. Corresponding parts with corresponding reference numbers are determined by adding 300 to the first embodiment reference numbers. Not all features have been numbered in both embodiments to simplify and clarify the illustrations. Description of the common features of both embodiments will not be repeated. Additional description is provided below in connection with changed or noteworthy aspects of the second embodiment.

Figure 28:
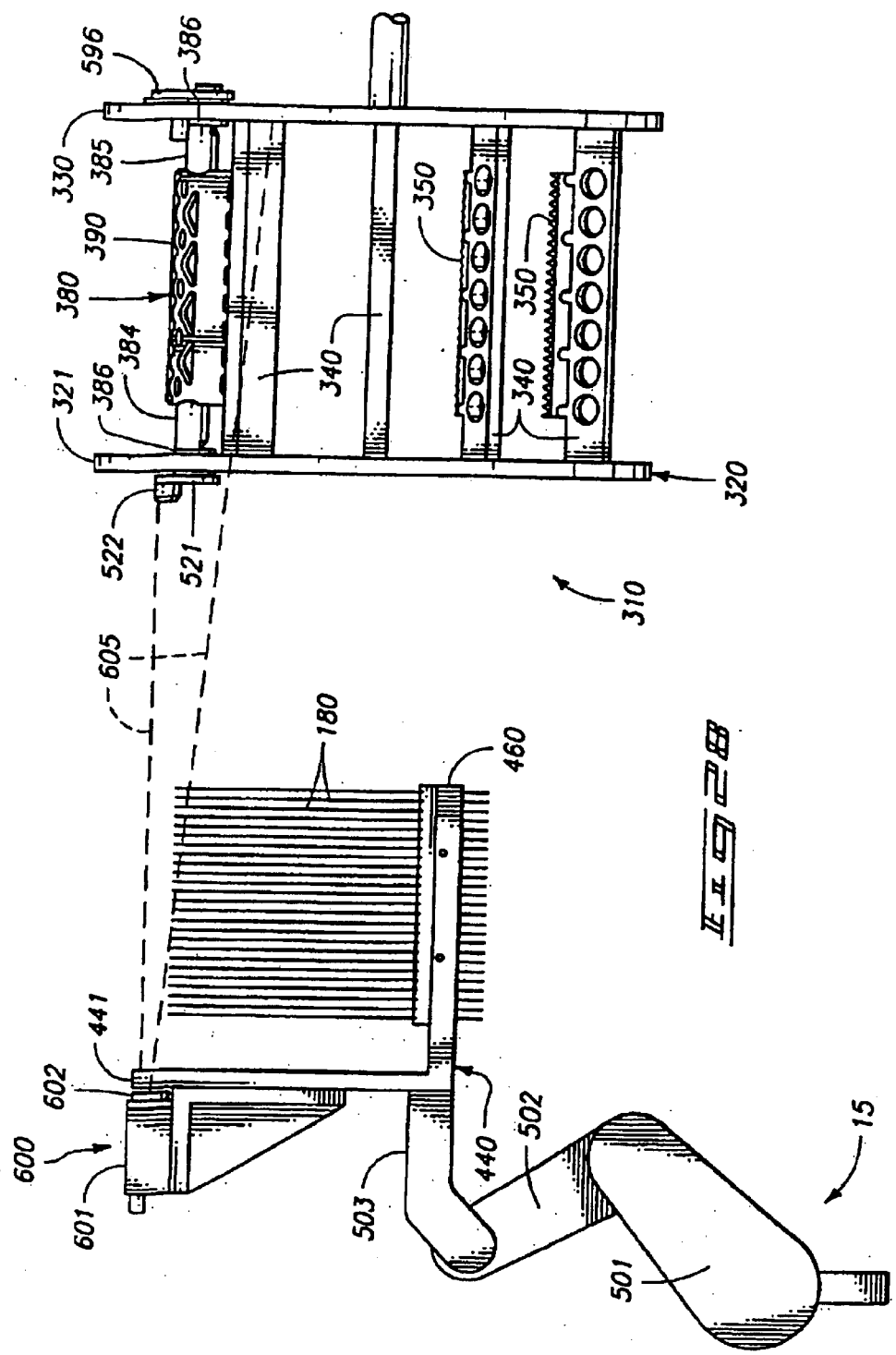
FIG. 28 is a side elevational view showing a further embodiment of the invention having a rotor and transfer implement mounted upon a robotic arm assembly.

FIG. 28 shows the robotic transfer device 15 having first, second, and third arm portions 501, 502 and 503, respectively; which can also be thought of as upper arm 501, forearm 502 and hand 503. The second embodiment engagement implement 440 is mounted at the distal end of the mechanical arm assembly 15.

The transfer implement has cantilevered arm members 460 which extend from the face plate 441. The upper and inward surfaces of the arm members have array support features in the form of grooves 463 (FIG. 31) and intervening ridges or projections which act to space the wafers 180 into the spaced parallel batch array.

The face plate also serves as a retainer actuator in the form of two apertures 452 which are appropriately shaped to provide camming or similar displacement action when the implement is engaged and moved relative to lever arms 521. Lever arms 521 are pivotally mounted in the front rotor plate 321.

Figure 29:
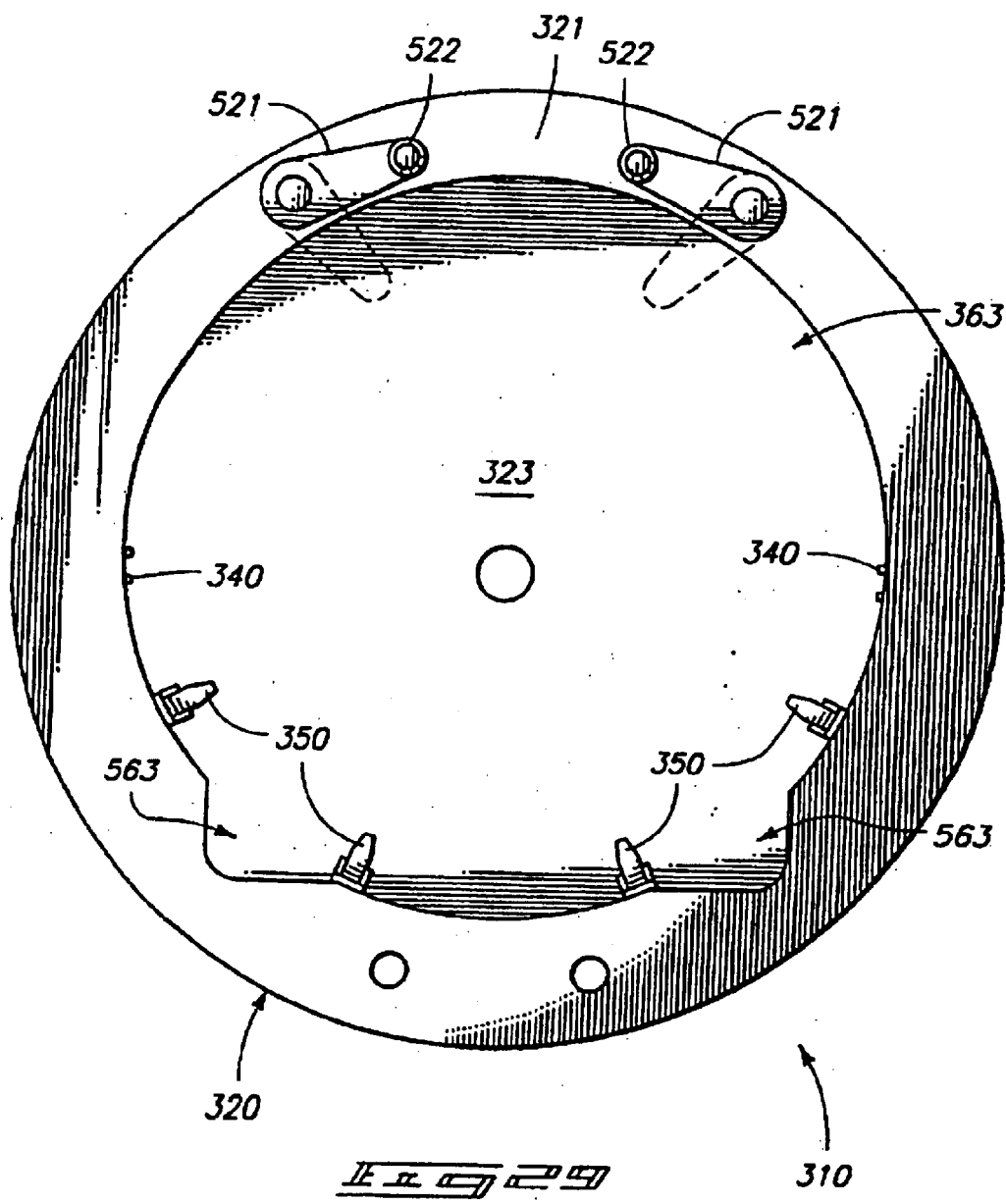
FIG. 29 is a front elevational view of the rotor shown in FIG. 28.

Apertures 452 form part of an article retainer operator which functions to pivot lever arms 521. FIG. 29 shows how the lever arms can be pivoted between upper or retracted open positions shown in solid lines, and lower or contracted closed positions shown in phantom lines. This is accomplished by lowering the transfer implement downwardly from the upper or loading and unloading position shown in FIG. 30 to a lowered retracted position shown by phantom lines 531 in FIG. 30. To function in this capacity the retainer operator apertures 452 are positioned over the lever arm end extensions 522. The transfer implement is then raised to move the lever arms up and into the open positions. The transfer implement is lowered to move the lever arms down and into extended or closed positions.

FIG. 28 further illustrates that the transfer implement 440 can be used to mount a visual sensing subsystem 600. Visual sensing subsystem 600 is advantageously used to monitor the position of the transfer implement, and to monitor the condition of the rotor. The visual sensing subsystem utilizes a television camera or similar image detection device 601. Image detector 601 can be a charge coupled device image detector similar to video cameras or other suitable sensors. The image detector 601 has a light gathering lens 602 which collects light beamed toward the lens over a viewing range which is only partially suggested by view lines 605 shown in FIG. 28. The lens 602 is positioned adjacent to a viewing opening 611 (FIG. 30) formed in the transfer implement face plate 441. The image detector 601 is advantageously mounted to the face plate 441 using a camera mounting bracket 613 which is adjustably secured thereto using suitable fasteners 614 which are received through slotted mounting apertures 615 which allow vertical adjustment. The camera can alternatively be mounted directly upon the robot or at other suitable locations using a variety of adjustable mounts. The output signals from the image detector 601 are communicated via a suitable signal cable 620 or other suitable image conveying conduit.

The image information from camera 601 is communicated to a computer which serves as the central control processor. The image information is utilized with supporting image analysis computer software which allows items of the machinery to be recognized and used to verify proper operating conditions. Such image analysis software is commercially available from several sources. The software is customized to recognize specific features such as the lever arm end extensions 522, so that verification can be had that the lever arms are retracted upwardly and are not positioned downwardly such that installation of a batch of wafers would cause interference and breakage of the wafers as the batch is attempted to be installed within the rotor 310. Other verifications can also be performed using the image detection subsystem, such as explained below.

FIG. 28 shows the preferred second embodiment rotor 310 in side elevational detail. The front and back rotor parts 321 and 330 are joined by several longitudinal rotor frame members 340 which are spaced about the rotor at suitable radial positions. This provides an annular rotor frame or framework 320.

The front part 321 of the rotor frame is provided with a receiving opening 323. The receiving opening allows a batch of wafers to be installed within the rotor. In the preferred version shown the wafers 180 are not supported upon any carrier or other array supporting piece or pieces which stay in the processing chamber. Instead the wafer batch array is installed into the processing chamber in an array formation defined by the transfer implement, and then transferred to a receiver which is on the rotor.

The receiver is generally referred to by the reference number 363. The receiver advantageously includes a receiving space or cavity 343 adjacent the receiving opening 323. In the preferred construction shown, the receiving cavity is substantially encompassed along the sides and rear end within the rotor frame 320. The rotor frame is left with numerous open spaces to allow fluid access to the batch array of wafers when held in the receiver.

The receiver assembly also preferably includes one or more receiver array supports 350. As shown, array supports 350 are provided in the form of combs having receiving grooves and intervening ridges or projections. The edges of wafers are captured in the receiving grooves and spacing between adjacent wafers is maintained by the intervening projections. The receiver 363 includes four stationary supports 350 each being fitted with the support combs which directly contact the edges of the wafers.

Figure 30:
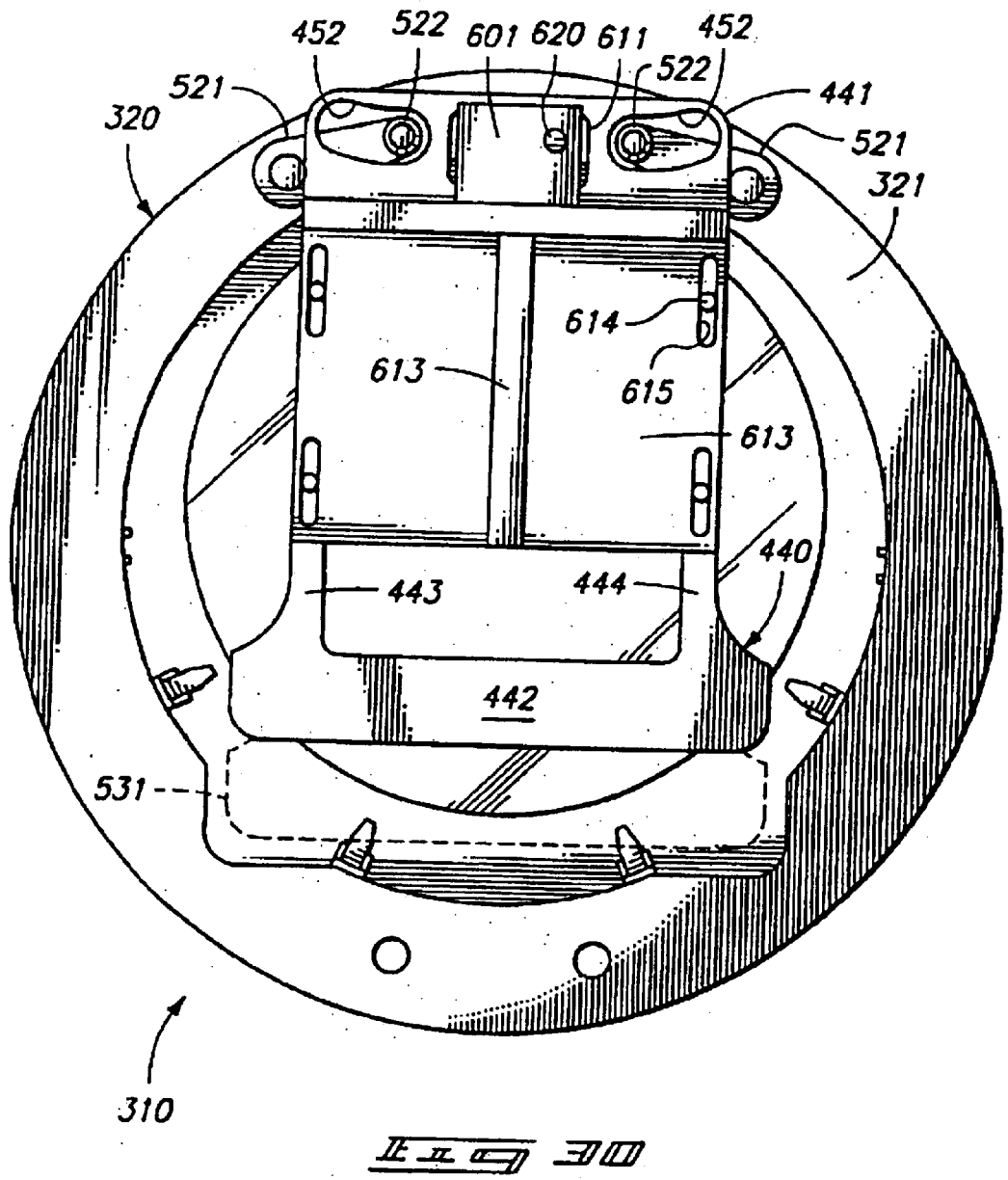
FIG. 30 is a front elevational view similar to FIG. 29 with a transfer implement positioned in front of the rotor.

The front piece 321 of the rotor frame includes the receiver opening 323. The receiver opening is preferably provided with cutouts 563 which allow sufficient clearance for the transfer implement to move downwardly and transfer the edges of the wafers into supporting contact with the supports 350. Sufficient clearance is also provided to allow the transfer implement to move downwardly to allow free travel clearance between the transfer implement supports on arms 460 and the adjacent portions of the wafers resting in the receiver supports 350. This downward transfer and clearance is illustrated in FIG. 30.

The rotor assembly 310 further includes a complementary pair of retainer assemblies 380. The retainers 380 each include a longitudinal main retainer member 390 which is mounted for pivotal action by front and back retainer end pieces 384 and 385. The front and back end pieces extend through apertures formed in the adjacent rotor frame pieces 321 and 330, respectively. Bushings or other suitable bearings 386 are provided to improve pivotal support. The front end pieces 384 are connected to the lever arms 521. Lever arms 521 and end extensions 522 serve as part of the retainer operators used to operate the retainers between open and closed positions.

The rear end pieces 385 are connected to a rear lever arm 596. The rear lever arm has a ball (not shown) mounted at the distal end thereof The ball engages with either or two detents (not shown) formed along the rear face of the rear rotor part 330. This construction provides a restraint which maintains the retainers in either open or closed positions.

The retainers 380 also preferably include contacting bars which have undulating groove and projection faces similar to the stationary receiver members 350. Biasing springs are not shown similar to spring 102, but could be utilized to add additional biasing forces to the retainers into the open, closed or both positions.

The retainers 380 are preferably constructed so as provide automatic centrifugal motivation which urges the retainers into a closed position to engage and securely hold wafers or other articles being processed. This is preferably done by providing appropriate balance to the main retainer member 390 relative to the pivotal mounts at each end. When the rotor rotates the center of gravity of the retainer assemblies causes the retainer support members to pivot into a closed position wherein the support members are extending inward in a nearly radial orientation toward the rotational axis. It is even further preferred that the centrifugal forces and balance of the assemblies be designed to pivot the retainers slightly past a radial line in order to more securely hold the retainers in a closed position and keep it affirmatively in that position using the detent construction and mechanical engagement between the retainers and the wafers or other articles being retained in the rotor.

Operational Description of Second Rotor and Transfer Implement

The processing system preferably operates using certain methods for centrifugally processing batches of semiconductor articles, such as the illustrated wafers 180. The novel methods can according to one aspect of this invention involve supporting plural semiconductor articles in a batch array upon a suitable transfer implement, such as the transfer implements 140 and 440 described herein. The batch of articles typically are relatively thin wafer shaped articles which can be circular disks or panels having other possible shapes. The supporting advantageously involves arranging the articles in a spaced parallel relationship to form the batch processing array. The articles are preferably spaced approximately equal amounts, although irregular spacings may bear some advantage in particular circumstances. The articles can be supported upon peripheral edges thereof to form the array. The supporting step is preferably done by inserting the peripheral edges of the articles within grooves or receptacles formed along supporting surfaces of the transfer implement, such as at grooves 163 or 463. The supporting can also be defined to include abutting the marginal portions of the wafers or other articles against the intervening projections formed between the grooves to provide endwise support against displacement in the longitudinal directions.

Figure 31:
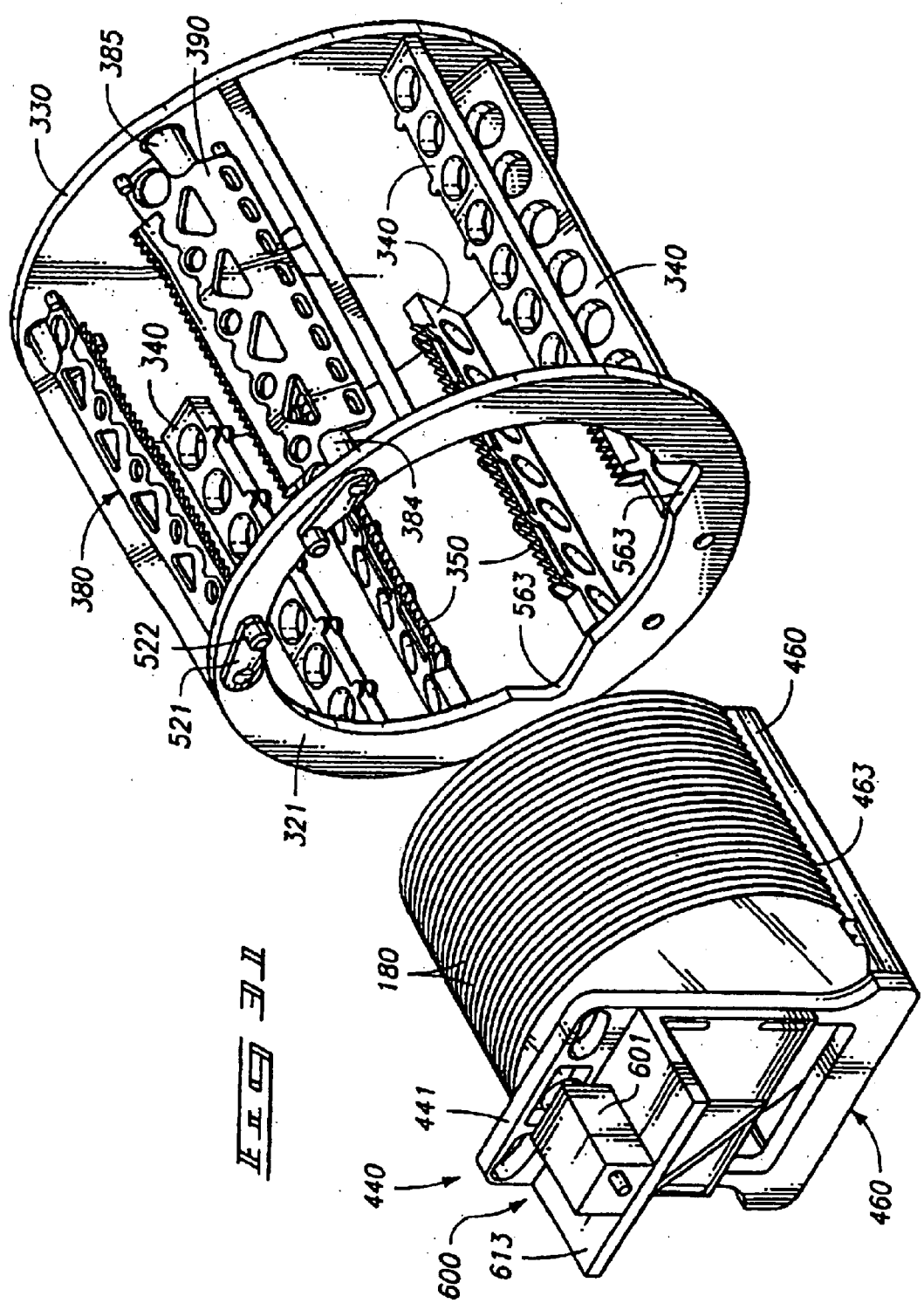
FIG. 31 is a perspective view showing portions of the rotor and transfer implement shown in FIG. 28.

The novel methods can in another aspect of the invention include moving the transfer implement and supported batch array to and into a processing station, such as processing stations 19, which are adapted to receive and support the batch array which is formed without a carrier which remains in with the wafers throughout centrifugal processing. The moving step or steps include moving the batch array on the implement to the processing station and aligning the batch array with a processing vessel main opening, such as opening 203 (FIG. 31). The aligning operation occurs by positioning and orienting the array on the implement so as to be approximately aligned with the receiver formed on the rotor, such as receiver 463 on rotor 310.

The moving step can additionally be defined by inserting the batch array of articles through the main opening of the processing vessel. Such inserting step can be accomplished by positioning the transfer implement and supported batch array within the receiver, such as receiver 463.

In order to minimize potential damage to the wafer or other articles held in the batch array, it is preferable to include a retainer open positioning step which causes positioning of the movable article retainers, such as retainers 81 and 82, into retracted or open positions. In the retracted open positions the retainers are laterally withdrawn away from the receiver opening to allow clear access for insertion of the batch array and supporting transfer implement in through the receiver opening and into longitudinally aligned or appropriate stopping position within the receiver. The opening or positioning of the retainers is advantageously accomplished at the end of the prior cycle of processing when the transfer implement is moved upwardly, thus engaging the retainer actuators in the form of receptacles 152 with the ends of the retainers to effect a lifting operation of the retainers. This lifting causes the retainers to be actuated and repositioned into the open positions.

During the loading of the receiver, the methods further preferably include the step of engaging the batch array with the receiver to support the plural semiconductor articles using the receiver in a batch array upon the supporting features of the receiver. This is advantageously accomplished by lowering the transfer implement as indicated in FIG. 30 in phantom lines 531. The step of lowering or otherwise displacing the transfer implement and supported wafers laterally with respect to the longitudinal axis of the array and axis of rotation, causes a transferring to occur. This transferring results in transfer of the wafers from the transfer implement onto supporting surfaces and features of the batch receiver. This transferring is preferably done in a manner which involves longitudinally aligning corresponding grooves which are on the transfer implement with receiving grooves in the article receiver. This results in the individual semiconductor articles being supported in a manner the same or substantially similar to the supporting step described above in connection with supporting the articles in a batch array on the transfer implement, as explained above.

In another aspect the novel methods preferably include repositioning or otherwise moving at least one movable article retainer into a closed position. This effects a retainer closing operation. In such closing operation and associated closed position, the article retainer or retainers are in juxtaposition with the plural semiconductor articles held in the receiver. More preferably, the article retainers are in direct physical contact with the semiconductor articles, such as along peripheral edge surfaces thereof. The article retainer or retainers are repositioned in a retainer close positioning step. This retainer close positioning step is performed using the preferred embodiments shown, as a simultaneous operation or actuation associated with the engaging step described above, although simultaneous actuation may not be needed in some forms of the invention. This closing is effected in a manner which is the complement of the retainer opening operation or open positioning step described above.

The methods further include retracting or withdrawing the transfer implement from the processing chamber. This is advantageously done using the robotic transfer 15 and moving the transfer implement outwardly along a line of travel which is in the same approximate orientation as the travel into the processing chamber.

In the close positioning step the transfer implement moves downwardly or otherwise in a laterally displacing mode of action. This causes force to be transferred between the transfer implement retainer actuator openings, such as openings 152 and 452, against the exposed ends or the retainer mechanisms (100 and 522), bringing about movement of the retainers 81, 82 and 381, 382 into the closed positions. In these closed positions the contacting surfaces of the retainers may either be slightly spaced or brought in direct physical engagement with the articles being processed so as to effect an initial or preliminary urging or biasing which involves forcing of the semiconductor articles. This preliminary forcing or urging helps to seat the articles within the receiver grooves and minimizes the chance of vibration or movement of the articles, particularly as the rotor increases in angular speed. Such movement can be problematic in some processing operations, and is more generally undesirable.

In other aspects of the invention, the methods further include closing the processing chamber opening using a movable processing chamber door to provide a substantially enclosed processing chamber. In the embodiment shown in FIG. 31 this is accomplished by moving the processing chamber door 202 upwardly and across the opening 203. Other configurations are alternatively possible.

The methods further include rotating the rotor and supported wafers or other semiconductor articles. The rotating step is preferably performed to provide better access to processing fluids supplied to the processing chamber. The supply of processing fluids can occur in the form of liquids sprayed into the processing chamber, or gases which are emitted into the processing chamber. The rotating action is further useful without fluid application to spin liquids from the surfaces of the articles being processed, and to aid in drying liquids from the exposed surfaces of the wafers. The centrifugal action provides improved gaseous contact to aid in drying or other gaseous processing phases.

The novel methods further include maintaining or biasing the articles into their desired processing positions during centrifugal processing. This is advantageously accomplished by providing automatic centrifugal biasing action using the article retainer operators. The article retainer operators respond to centrifugal forces developed during rotation of the rotor. The retainer operators preferably have a restraining means, such as the biasing spring member 102 or the detent restraint which help to lock the restraints into the closed position during rotation. The restraining action can also be accentuated by designing the balancing of the retainer operators such that the contacting surfaces of the retainers go past a radial orientation which is pointing directly at the central axis of rotation and positions the retainer operators beyond this point to produce an action which maintains the retainers in a fully closed position until they are affirmatively released by the retainer actuator provided in the form of the transfer implement and its opening operation described above.

The methods can also further include opening the processing chamber opening by retracting the movable processing chamber door. This is done in a manner complementary to the door closing step listed above.

The novel methods also preferably include verifying retainer positions before any insertion of the transfer implement is attempted. This helps to reduce the risk of possible damage to the machine or articles being processed. The verifying can be performed in anticipation of the unloading phase of the processing. Verifying can best be accomplished using the image sensor 601 which looks at the open processing chamber and recognizes either or both the lever arms 521 and ends 522 using image analysis software which is commercially available. If the lever arms are in a closed position, then it is appropriate for the transfer implement to proceed with insertion to progress in unloading the machine.

Verifying steps can also be used prior to unloading to verify that the retainer actuator lever arms are in the desired closed positions. Additional verifying can be performed after loading the articles into the rotor, to assure that the retainers are in closed positions before spinning the articles.

The novel methods also preferably include inserting an unloaded transfer implement into the processing chamber to unload the batch array from the rotor. The inserting step is best prefaced with a set of moving and related steps explained above in connection with the transfer implement when loaded with a batch of articles. In the case of inserting and moving the unloaded transfer implement the arms 140 and 160 are inserted in a complementary relationship avoiding the receiver supports 63 and 463. The transfer implement is brought into the receiver opening in a relatively low condition associated with insertion to load and retraction after loading the wafers onto the rotor article receiver. The steps further include longitudinally aligning or stopping the transfer implement in a desired position in anticipation of lifting and transferring the articles onto the transfer implement. The axial aligning step brings corresponding grooves of the article supports into registration.

The novel methods in another aspect include lifting or otherwise laterally displacing the transfer implement to cause an engaging of the articles supported on the receiver article supports. This effects a transferring and brings the transfer implement into a supporting action for the articles.

The lateral displacing action of the transfer implement also preferably causes a simultaneous actuation of the article retainers on the rotor. This releases the wafers or other articles and allows upward or other appropriate lateral displacement so that the wafers are brought into a retractable orientation and position for removal of the articles from the processing station.

The methods also in another aspect include retracting the transfer implement and supported batch array of articles from the processing station.

In further aspects the retracted batch array can then be prepared and controlled for repeating some or all of the above processing steps at a second or subsequent processing station as the particular requirements may be.

Control System

Figure 32:
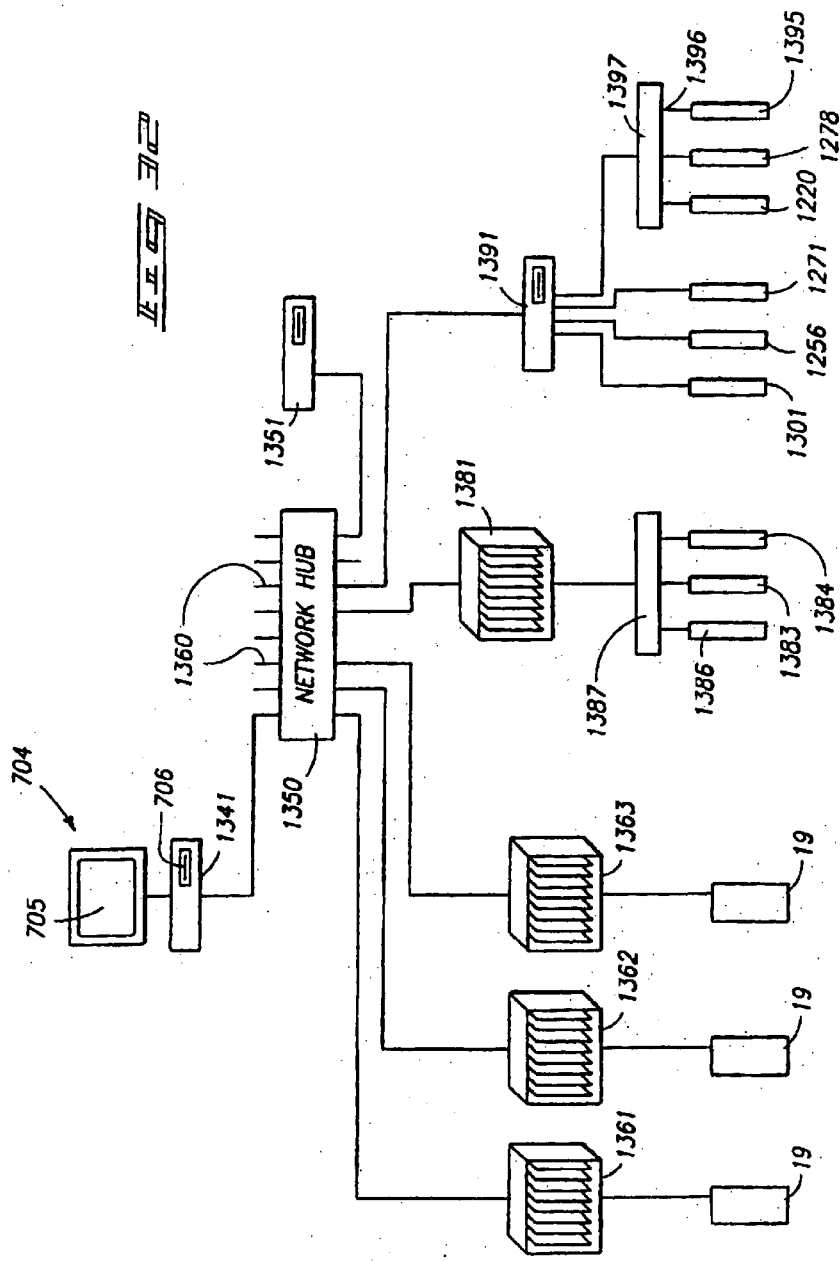
FIG. 32 is a control system schematic block diagram of a preferred control system used in the processing system of FIG. 1.

FIG. 32 shows a preferred control system used in processor 11. The control system advantageously uses a modular design which incorporate commercially available computer modules, such as Intel 80486 or equivalent based computer or computer boards, to perform various functions. FIG. 32 shows the human operator interaction station 704 The first such station 704 has an associated control processor 1341 of conventional design and an electrically attached display and control panel 705. Control and display panel 704 is accessible from the front or clean room side of processor 11. Additional control stations can alternatively be provided at central processing control rooms, at the grey room side of the processing system, or at other desired locations and connected to added input ports 1360.

Control stations are connected using a standard network interface hub 1350. Network hub 1350 is connected to a central controller, such as a computer file server 1351. Hub 1350 can also be used to connect an outside control or monitoring station at ports 1360 for additional control capabilities, data acquisition, or monitoring of processing and control functions.

Hub 1350 is further connected to processor control modules 1361–1363, which are also conventional computers without displays. Three processor station control modules 1361–1363 are each associated with processing stations 19 respectively. Similar, added modules are used as needed for the particular number and types of stations 19 used in system 11. These station control modules allow independent processing routines to be run at the processing stations and for data to be recorded indicating the processing performed in each particular batch being run by each processing station.

Processing station control modules are connected to and interact with the processing station motors, plumbing, etc which are collectively identified with the processing station number 19 in FIG. 32.

FIG. 32 further shows an interface subsystem controller 1381, which again is a computer. Interface subsystem controller 381 is electrically connected to various features of the interface subsystem to both control operation and receive confirmatory signals of movements and positions. The interface controller 381 is preferably connected to the interface section to receive signals through a number of optical fibers 1386 used to convey signals from positional encoders for the first and second carriages 1382, limit switches 1383 which detect the limit of travel of the carriages and elevators, and wafer detectors 1384 which detect wafer carriers and wafers held in the interface section. The system is preferably constructed so that most or all sensed signals used in the control and operation of the interface are communicated by optical fiber to eliminate the risk of cross-talk between signal lines. The optical fiber transmitted signals are converted into electronic signals by an optical fiber signal converter 1387 which produces electronic signals which are communicated to computer 1381.

FIG. 32 still further shows a conveyor control module in the form of a computer 1391 without display which is electrically connected to various parts of the conveyor, such as the mechanical arm drive motors 1256, 1271 and 1301, encoder 1220, and other components thereof not specifically illustrated.

The conveyor control module also preferably receives a number of signals through optical fibers 1396. Optical fibers 1396 are used to convey signals from angular position encoders and motor encoders for the conveyor 15 which are for simplicity exemplified by encoder 1220 in FIG. 32. Limit switches for the conveyor are exemplified by limit switch 1278 in FIG. 32. Hall effect sensors 1395 are used in sensing operation of the motors of the conveyor. The system is preferably constructed so that all sensed signals used in the control and operation of the conveyor are communicated by optical fiber to eliminate the risk of cross-talk between signal lines and provide a smaller cable bundle which is moved in connection with tram motion up and down the track. The optical fiber transmitted signals are converted into electronic signals by an optical fiber signal converter 1397 which is connected to reconvey the signals to computer 1391.

Figure 33:
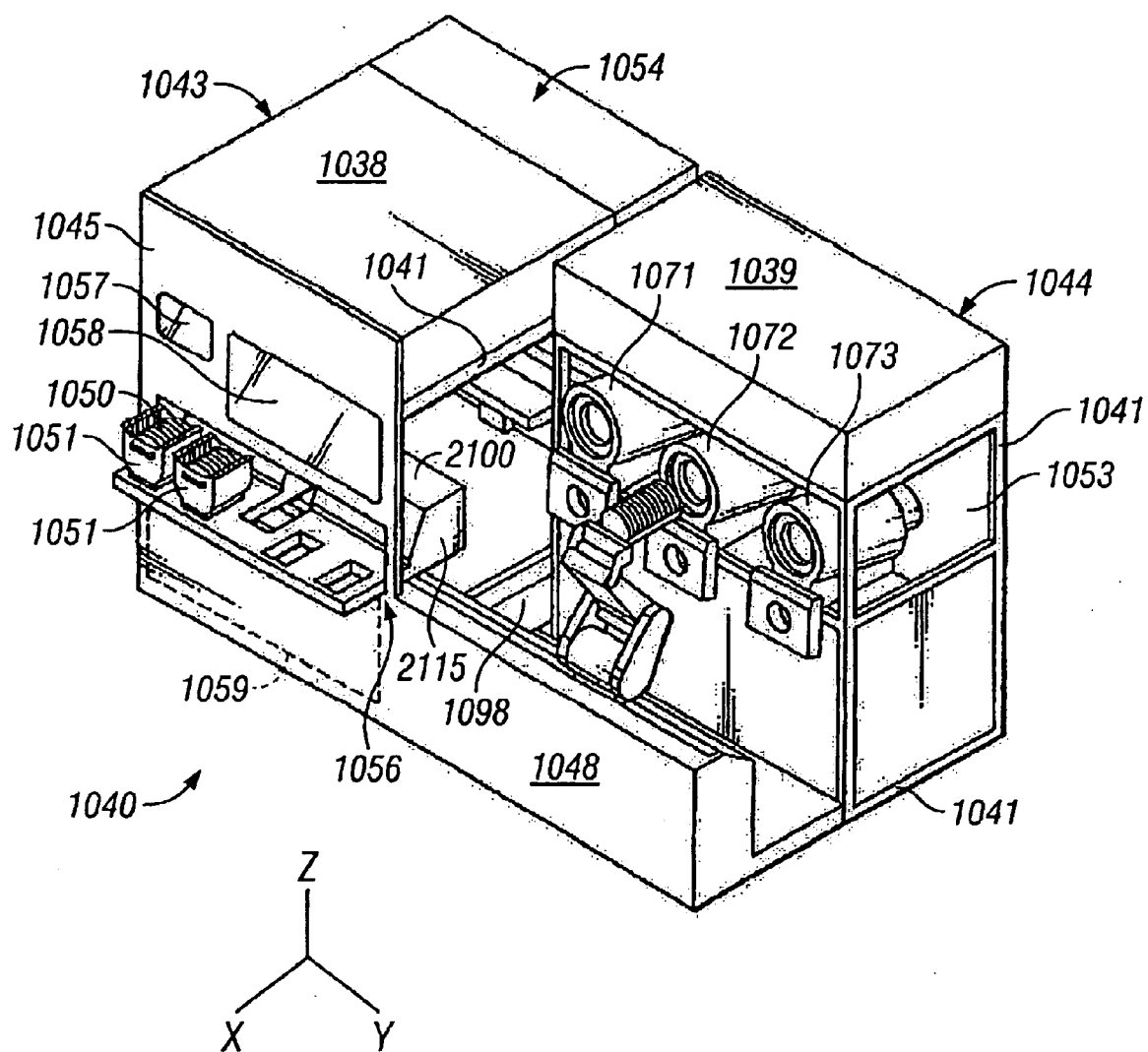
FIG. 33 is a perspective view showing another preferred semiconductor wafer processing system according to this invention.

FIG. 33 Processor Generally

FIG. 33 shows a preferred processing system 1040 according to this invention. Processing system 1040 includes a basic frame 1041 which provides structural support for related components. Processor 1040 has two fundamental sections, one of which is the interface section 1043. The other fundamental section is the processing section 1044.

The frame supports an enclosure envelope 1045 which in FIG. 33 is shown partially removed adjacent the processing section for purposes of illustration. The enclosure envelope encloses a working space 1046 within portions of processor 1040. Wafers 1050 are held and maneuvered within the enclosed working space. The wafers are moved between multiple processing stations 1071–1073 contained within the processing section 1044. The working space can be supplied with a purge gas and operated at either slightly elevated or slightly reduced pressures relative to ambient atmospheric pressure.

The upper portions of processor 1040 are provided with an interface filter section 1038 and a processing filter section 1039. These filter sections preferably employ HEPA type ultrafiltration filters. Air moving equipment forces air through the filters and downwardly into the working space to move contaminants downwardly and out through the back side of the processor.

The multi-station processor 1040 also preferably has a process station maintenance section 1053 which is separated from the work space 1026 by portions of the enclosure envelope 1045. Processor 1040 also preferably has an instrumentation and control section 1054 mounted rearwardly from the interface section 1043. Control section 1054 preferably includes various control equipment used in processor 1040.

Maintenance section 1053 and control section 1054 are of potentially higher contamination levels due to the presence of various equipment components associated with the processing stations. The processor 1040 is advantageously mounted in a wafer fabrication facility with clean room access to the front of the processor along front panel 1048. The maintenance and control sections are preferably accessed from the rear of processor 1040 through a gray room adjacent the clean room. Such gray rooms have fewer precautions against contamination than the clean room. This configuration reduces plant costs while allowing access to portions of the processor more typically needing maintenance.

The front of processor 1040 includes a front control panel 1057 allowing operator control from the clean room. Control panel 1057 is advantageously a touch screen cathode ray tube control display allowing finger contact to the display screen to effect various control functions. Control section 1054 also preferably includes a secondary control panel which faces rearwardly into the gray room so that operation can be affected from either front or back of the machine. All control functions and options are displayed upon the control panels to effect operation and set up of the processor.

As shown, wafers 1050 are supplied to and removed from the enclosed work space 1046 of processor 1040 using interface section 1043. Wafers are supplied to the interface section in industry standard wafer carriers 1051 (detailed in FIG. 37). The wafer carriers are preferably supplied in groups, such as a group of four carriers. The groups are placed upon a cantilevered shelf 2101 forming a part of a first carriage 2100. Shelf 2101 extends through an interface port 1056 which is controllably opened and closed using a interface port door 1059. Adjacent the interface port and control panel is a view window 1058 through which a human operator can see operation of processor 1040. FIG. 33 shows two wafer carriers 1051 positioned upon the cantilevered shelf 2101. There are two additional positions available for two additional carriers which are left unloaded in FIG. 33.

Wafer Tray

Figure 34:
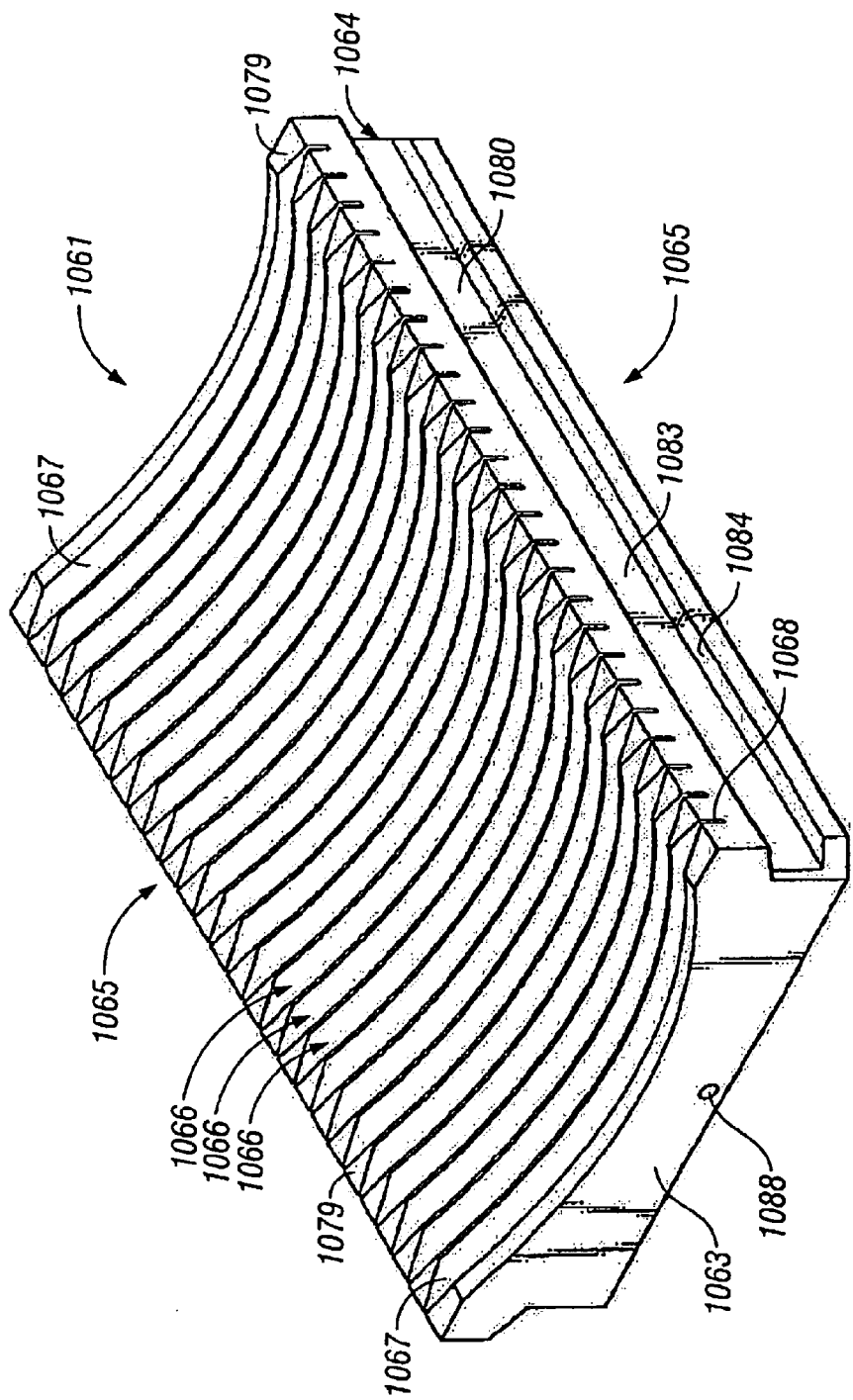
FIG. 34 is a perspective view showing top portions of a wafer holding tray used in the processing system of FIG. 33.
Figure 35:
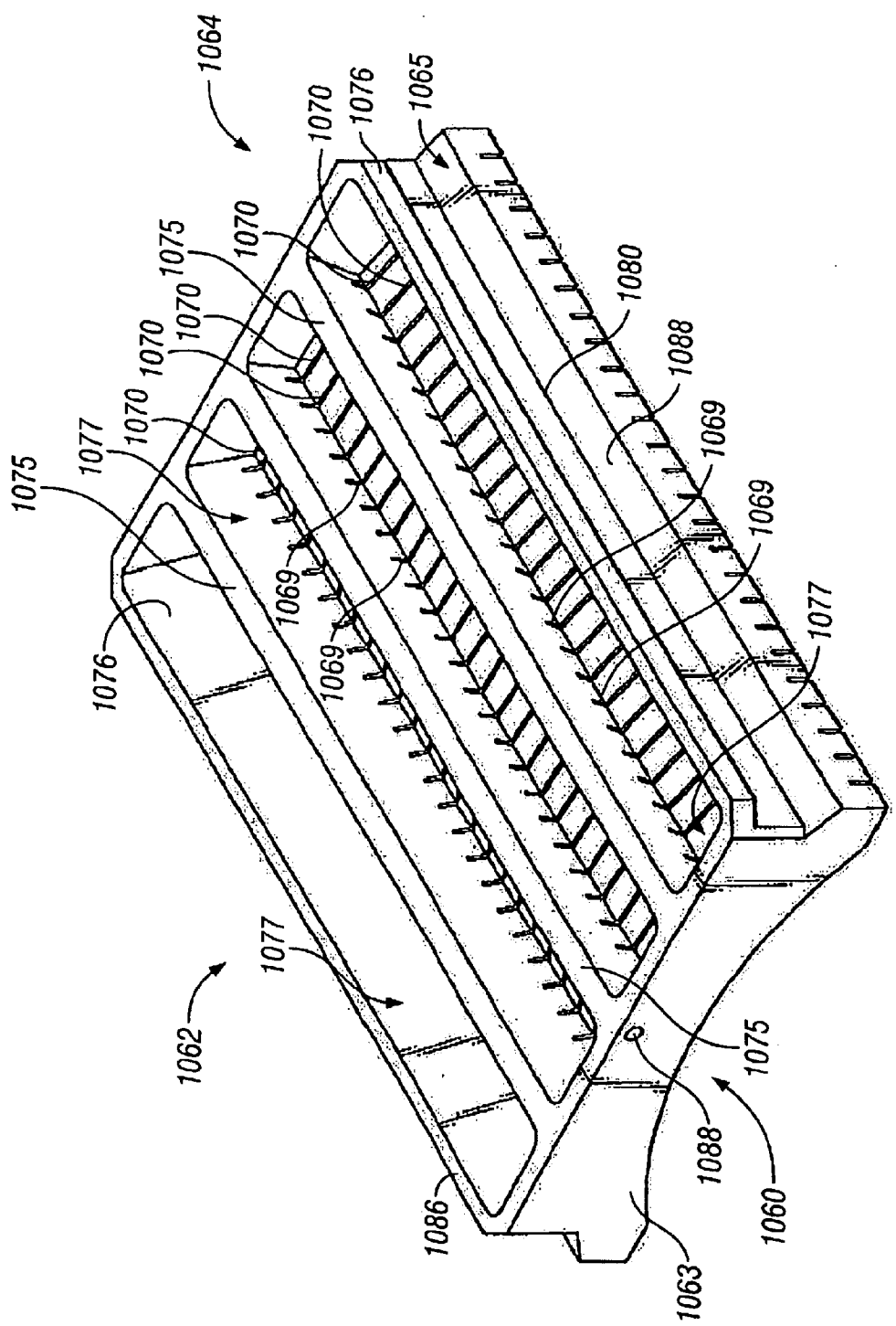
FIG. 35 is a perspective view showing bottom portions of a wafer holding tray used in the processing system of FIG. 33.

Refer to FIGS. 34 and 35 which show the novel wafer tray 1060 in greater detail. Wafer tray 1060 includes an upper surface 1061 and a lower surface 1062. The tray also has a first end 1063 and a second end 1064. Sides 1065 extend between the first and second ends. Additional features of the tray surfaces will now be more fully detailed.

Upper surface 1061 has a series of wafer tray receivers 1066. Wafer tray receivers 1066 each comprise a semicircular groove or channel having downwardly converging receiver sides 1067. The converging receiver sides 1067 adjoin to a receiver bottom section 1068 which is a relatively narrow slot having substantially parallel slot walls. The slot section is sized to provide a width about 0–10% greater than the thickness of the wafers which are being received therein. The receiver bottom or slot section has bottom surfaces 1069. The lower portions of the slot sections 1068 are formed so as to be intermittently closed at slot bottom surfaces 1069 and open along receiver drain apertures 1070 (FIG. 35). The slot bottom surfaces 1069 exist along longitudinal foundation bars 1075 and side rail portions 1076. The particular number of wafer tray receivers 1066 in any particular tray 1060 is variable. Typically, there will be 25 or 50 wafer receivers in order to correspond with the capacity of associated wafer carriers 1051 being used in other parts of the fabrication plant.

The upper surfaces of wafer tray 1060 also preferably include side land portions 1079. The side land portions are formed to reduce overall height of the tray while maintaining the general semicircular receiver shape. The overall width of tray 1060 is appropriately sized so that more than approximately 50° of arc are seated, more preferably approximately 60°–80° of arc are encompassed for seating the wafers in receivers 1066. Even more preferably the arc of the receiving channels is approximately 65°.

Figure 36:
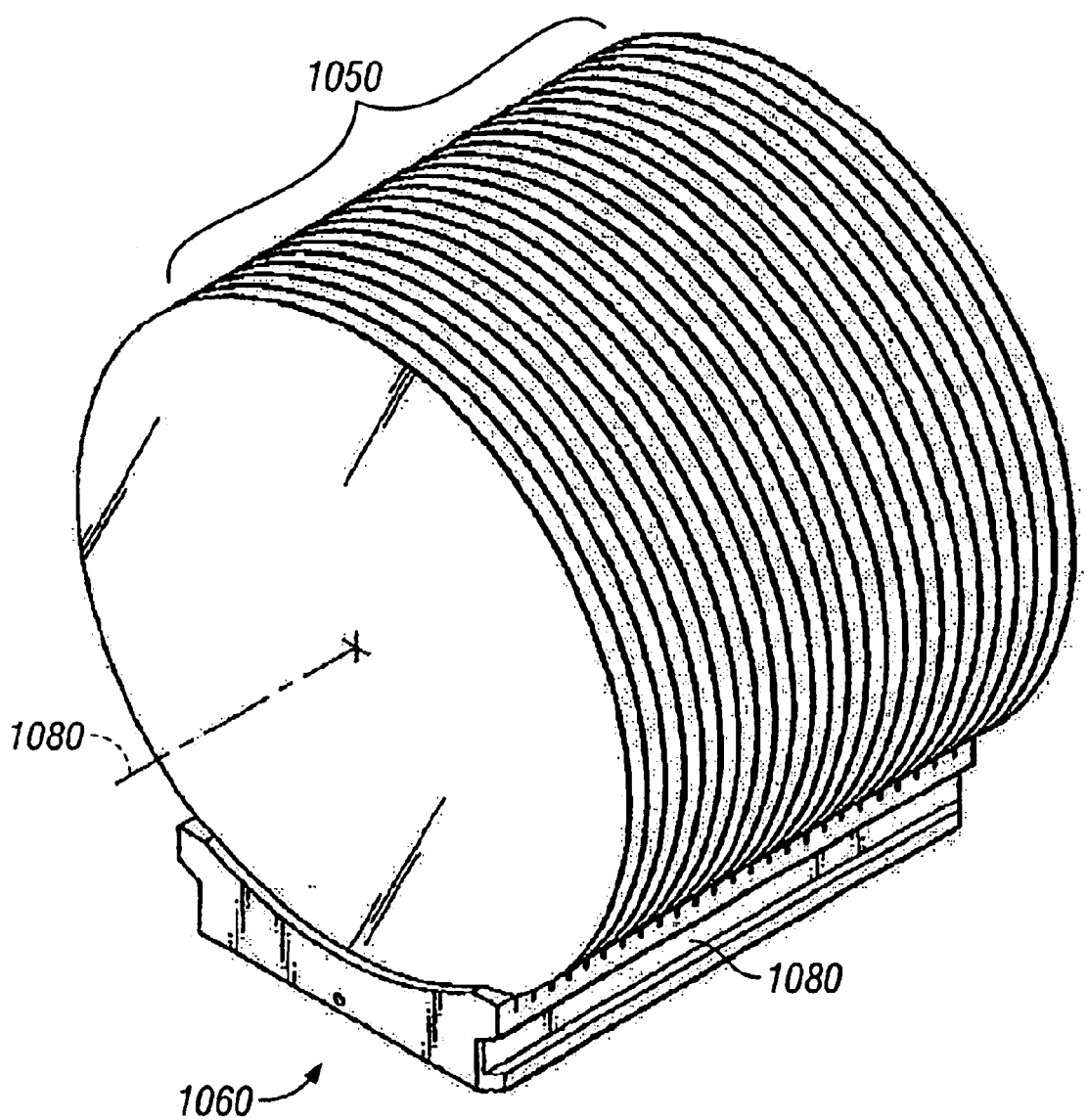
FIG. 36 is a perspective view showing the tray of FIG. 34 loaded with wafers.

The wafer tray ends 1063 and 1064 are preferably planar and perpendicular relative to a longitudinal axis 1080 (FIG. 36) which extends perpendicular to the receiving grooves along the center point of the receiving groove arcs defined by bottom surfaces 1069. Longitudinal axis 1080 also coincides with the centers of the wafers 1050 supported on the wafer tray. Tray ends 1063 and 1064 are advantageously provided with apertures 1088 for receiving a tool therein to allow handling of the trays with minimum contact, such as during cleaning.

Wafer tray 1060 has side rails 1076 which extend along both sides. The side rails have outer side surfaces 1065 which are advantageously formed to provide tray support features 1080. As shown, tray support features 1080 include a tray side channel 1081. Tray side channel 1081 has a downward facing bearing surface 1082 which bears upon supporting tools and equipment as explained more fully hereinbelow. Adjacent to surface 1082, is an outwardly facing channel base surface 1083. Bearing surface 1082 is preferably constructed to form an included angle of approximately 120° of arc relative to the channel base 1083. Channel 81 further includes an upwardly facing third surface 84 which serves to complete the channel shape of the tray support features and provides increased structural engagement between the wafer tray and equipment which engages the tray using the tray side channels 81.

The lower surface 1062 of tray 1060 is preferably formed with a downwardly facing contact or foot surface 1086. As shown, foot surface 1086 defines a footprint with five longitudinal segments associated with side rails 1076, longitudinal bars 1075, and end panels 1063 and 1064. The lower surface of the tray also is preferably constructed to have longitudinal base recesses 1077 between bars 1075 and side rails 1076. Processing fluids drain from the wafers 1050 and wafer tray 1060 through the receiving slot openings 1070 and base recesses 1077.

The novel wafer trays 1060 provide improved processing of wafers in processor 1040. The improvements include improved access of processing fluids to the surfaces of wafers 1050. The improved access of processing fluids occurs because there is less coverage of the wafers as compared to prior art carriers 1051. Only relatively small marginal edge portions along the arc of the receivers is covered. Thus allowing almost full access to the faces of the wafers by processing fluids. The improved access to processing fluids in turn results in reduced processing times and greater uniformity and effectiveness of the processes upon the surfaces being treated. Wafer tray 1060 also results in a small combined size of the wafer batch within processor 1040. This translates into a much smaller overall size of processor 1040 and reduced floor space requirements in clean rooms and adjacent gray rooms. Since the cost of floor space in these facilities is very high, the installed cost of the processing system 40 is kept relatively lower. These factors all attribute to better yields, improved quality and reduced costs of production.

Standard Wafer Carrier

Figure 37:
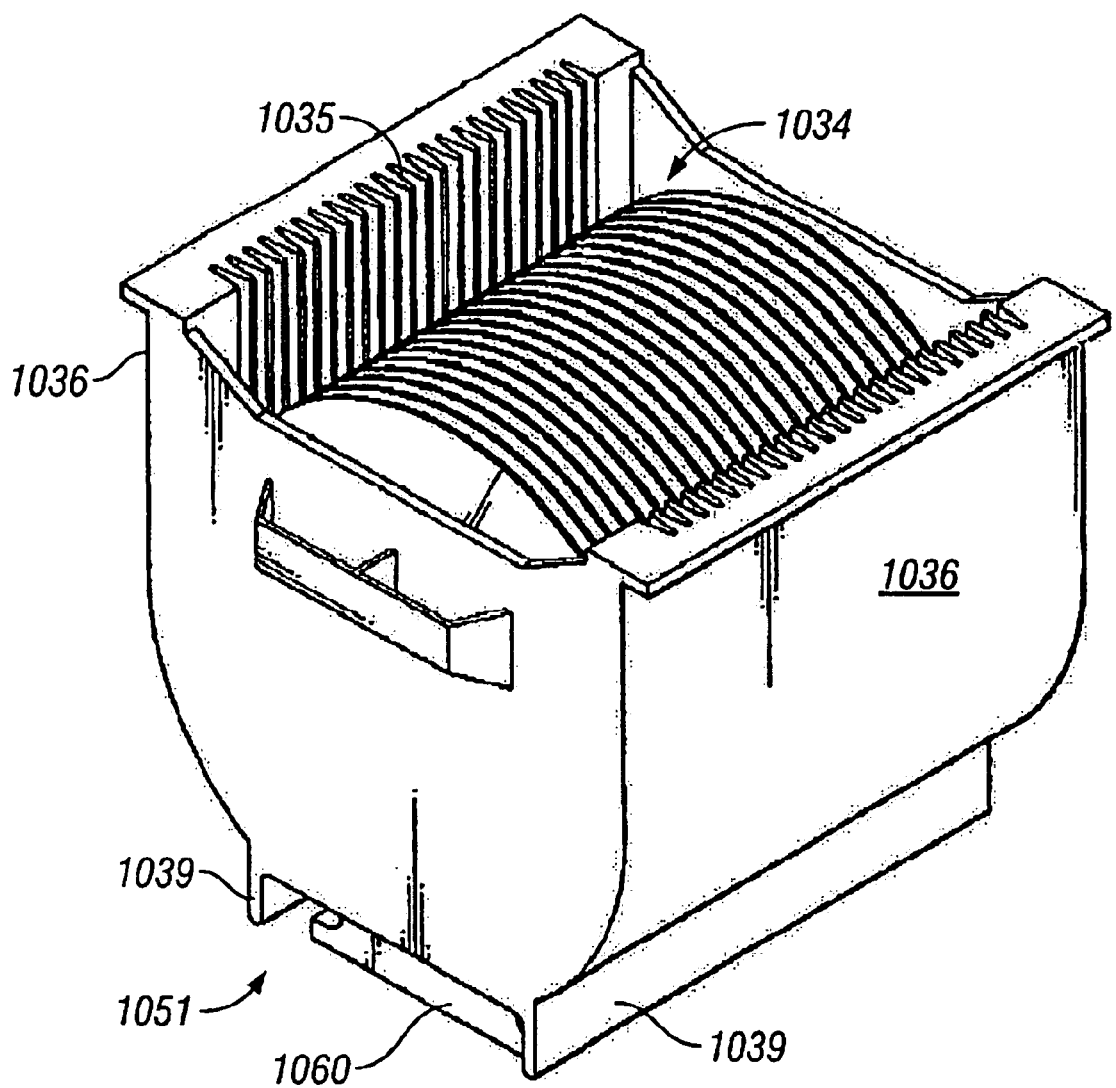
FIG. 37 is a perspective view showing a prior art industry standard wafer carrier loaded with wafers. The wafer holding tray of FIG. 34 is positioned below the wafer carrier.

Processor 1040 is designed to work in conjunction with a standard industry wafer carrier which is illustrated in FIG. 37. Such carriers are available from a number of supplying manufacturers. Carrier 1051 has a holding trough 1034 with a series of edge receiving receptacles 1035 along side walls 1036. End walls 1037 are typically provided with handles 1038. The bottom of carrier 1051 is provided with a bottom opening (not shown) which is rectangular and defined between base rails 1039. FIG. 37 shows a wafer tray 1060 positioned beneath wafer carrier 1051 aligned to pass up through the bottom opening of the carrier. Wafer tray 1060 is sized to pass through the bottom opening.

Interface Section

The interface section 1043 takes the wafers from the wafer carriers and installs them onto the specially constructed wafer trays 1060. The wafer trays provide improved processing of wafers 1050. The interface section also preferably provides a holding or inventorying capability for both wafers awaiting processing and wafers which have been processed. Thus the interface section constructed as shown in FIG. 33 functions as both an input subassembly, output subassembly and wafer holding station.

Interface 1043 is substantially enclosed by the enclosure envelope 1045. Interface 1043 has open work spare portions connected to the portions of work space 1046 contained within the processing section 1044. The interface includes a interface port 1056 formed through envelope 1045. Interface port 1056 allows wafers to be loaded into and removed from processor 1040. Interface port 1056 is preferably provided with a interface port closure in the form of a movable door 1059. Movable door 1059 is powered and extends upwardly from below to close the port and is retracted downwardly to open the port. This construction allows the interface port door to be automatically controlled to the extent desired.

FIGS. 38–44 show the principal operational portions of interface 1043. These portions serve to provide a wafer transfer which transfers wafers from the industry standard wafer carriers 1051 and installs the wafers onto the novel wafer trays 1060. Additionally, interface 1043 serves to hold wafer batches loaded onto the trays. These loaded tray batches are held for processing in the processor. Still further interface 1043 allows for the storage of unloaded wafer trays. As shown, interface 1043 also performs loading and unloading operations through interface port 1056.

Figure 38:
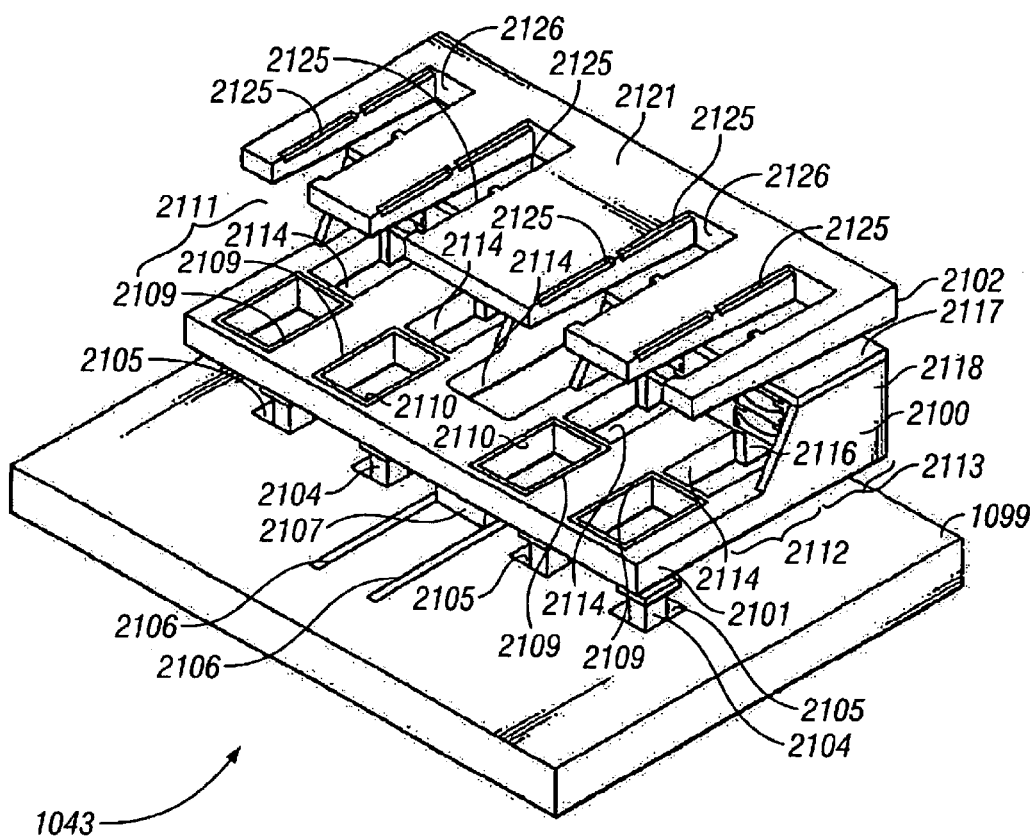
FIG. 38 is a perspective view showing portions of a wafer handling subsystem used in the processing system of FIG. 33.

FIG. 38 shows that the preferred interface 1043 has a base 1099 which is secured to frame 1041. A first or lower carriage 2100 is mounted for movements, such as the preferred horizontal movement. A second or upper carriage 2102 is also mounted for horizontal movement. Interface 1043 also has four elevators 1104 which provide vertical movement.

Base 1099 in some respects acts as an extension of frame 1041 and further serves to separate the interface section compartment into an interface section portion of working space 1046 and a mechanical compartment 1098 (FIG. 33) which is below and subjacent to the working space and base 1099. As shown, base 1099 is provided with four elevator openings 2102 which serve as apertures through which elevators 2104 extend.

Base 1099 also is provided with first carriage travel openings or clefts 2106. Clefts 2106 receive portions of a first carriage support pedestal 2107 which extend downwardly from the first carriage beneath base 1099. The pedestal extends down to a first carriage support track (not shown) which is below base 1099 in the mechanical compartment 1098. Pedestal 2107 is connected to a first carriage operator (not shown) which is advantageously in the form of a rotatable linear screw drive operator similar to the operator described below in connection with second carriage 2102.

FIG. 38 also shows that interface 1043 includes two carriages 2100 and 2102 which are movable relative to elevators 2104. Carriages 2100 and 2102 are preferably mounted for simple linear motion relative to the elevators. However, alternative configurations and movement patterns may be possible. Carriages 2100 and 2102 are independently operable or otherwise controllable to allow different relative horizontal positions and movements of the first and second carriages.

As shown, first carriage 2100 is positioned above base 1099 and below the second carriage 2102. This preferred configuration results in the first carriage functioning as a lower carriage, and the second carriage functioning as an upper carriage. Elevators 2104 serve to move wafer batches between a first or upper carriage level associated with the first carriage and a second or lower carriage level associated with the second carriage.

First carriage 2100 includes an outer or forward portion forming a first section 2111 of the carriage. This outward section is in the form of a cantilevered shelf or carrier support projection 2101. Carrier support projection 2101 serves to support wafer carriers 1051 thereon. First carriage 2100 is laterally movable to extend the carrier projection or overhang through interface port 1056 into the fully extended first carriage receiving position illustrated in FIG. 33. The overhanging carriage shelf 2101 is provided with carrier support features which are advantageously in the form of carriage support ledges 2109. The carrier support ledges are preferably recessed areas formed in the upper surface of shelf 2101. The carrier support features are advantageously constructed to provide lateral support against unintended horizontal displacement in either X or Y directions (see FIG. 33). The carrier support features also hold the carriers to prevent downward movement from a desired vertical or Z position, but allow vertical movement above the shelf for easy installation and removal of the wafer carriers.

The carrier support ledges 2109 or other carrier support features are preferably positioned adjacent or about first carriage transfer openings 2110. The support ledges are most preferably peripheral recessed areas about the opening 2110. Openings 2110 are provided to allow extension of the elevators 2104 therethrough. Extension of the elevators through openings 2110 is used in conjunction with the transfer of wafers between the wafer carriers 1051 and wafer trays 1060 in either incoming or outgoing directions.

First carriage 2100 also preferably includes a second or central section 2112 which includes a group of four first carriage pass-through openings 2113. Pass-through openings 2113 extend through the deck of the first carriage to allow extension of the elevators therethrough. Pass-through openings 2113 also allow unloaded wafer trays 1060 to be passed upwardly and downwardly through the first carriage deck in a manner as explained more fully below.

First carriage 2100 is further provided with a third or rearward section 2113. Rearward section 2113 includes an empty or unloaded wafer tray magazine or storage 2115. The empty wafer tray storage is advantageously in the form of four arrays each having three receptacles to receive three wafer trays therein. The receptacles each include shoulder pairs which function as rests upon which the side rails 1076 of the wafer trays rest. The shoulder pairs are along arranged along opposing sides of an empty tray gallery 2116 which is common to all three receptacles of a single storage array 2115. Galleries 2116 allow the heads of the elevators to extend upwardly to engage empty wafer trays and lift them for removal from the storage array. The empty tray gallery also extends through the deck of the first carriage, and is contiguous with and open to the adjoining pass-through openings 2114.

The empty tray storage is also preferably provided with an empty tray storage roof panel 2117 which extends over and protects the empty wafer trays from downwardly drifting contaminating particles. The roof panels are supported by first carriage rear section support panels 2118.

The first carriage is further advantageously provided with a second carriage pedestal inlet opening 2119 which allows a support pedestal of the second carriage to extend thereinto when the second carriage is moved forwardly.

Interface 1043 also includes the second or upper carriage 2102. Upper carriage 2102 has an upper carriage deck 2121 which is supported by a second carriage support pedestal 2122. Pedestal 2122 has a linear drive operator 2123 which is advantageously in the form of a rotatable screw drive 2124 which moves the second carriage forwardly and backwardly between retracted and extended positions.

The upper carriage is provided to function as a loaded tray holding or inventorying station. As shown, this function is accomplished by having the second carriage in a position above the first carriage, and provided with a series of loaded tray holders 2125. Loaded tray holders 2125 are formed as receptacle ledges formed in the deck. The receptacle ledges are adjacent to second carriage elevator openings 2126. Openings 2126 are preferably portal openings which have open entrances at the forward ends thereof. As shown, the upper carriage is configured to hold two groups, each group having four wafer trays in a four by two loaded wafer tray storage array.

Interface 1043 also includes elevators 2104 which have elevator rods or shafts 2128 and enlarged elevator heads 2129. The elevator heads are constructed to engage the lower surface 1062 of wafer trays 1060 in a stable manner. Most preferably the upper contacting face of elevator head 2129 is provided with four engagement projections 2130 at the front and back of the contacting face. The engagement projections are spaced and sized to fit within the longitudinal recesses 1077 of trays 1060 adjacent the end panels. This provides positive engagement against lateral displacement of the trays relative to the elevator head during automated handling of the wafer trays by the interface.

Interface 1043 is advantageously constructed to handle wafer carriers and wafer trays in groups or gangs of four at a time. Although this configuration is preferred, it is alternatively possible to have other gang sizes.

Operation of Interface Section

Figure 39:
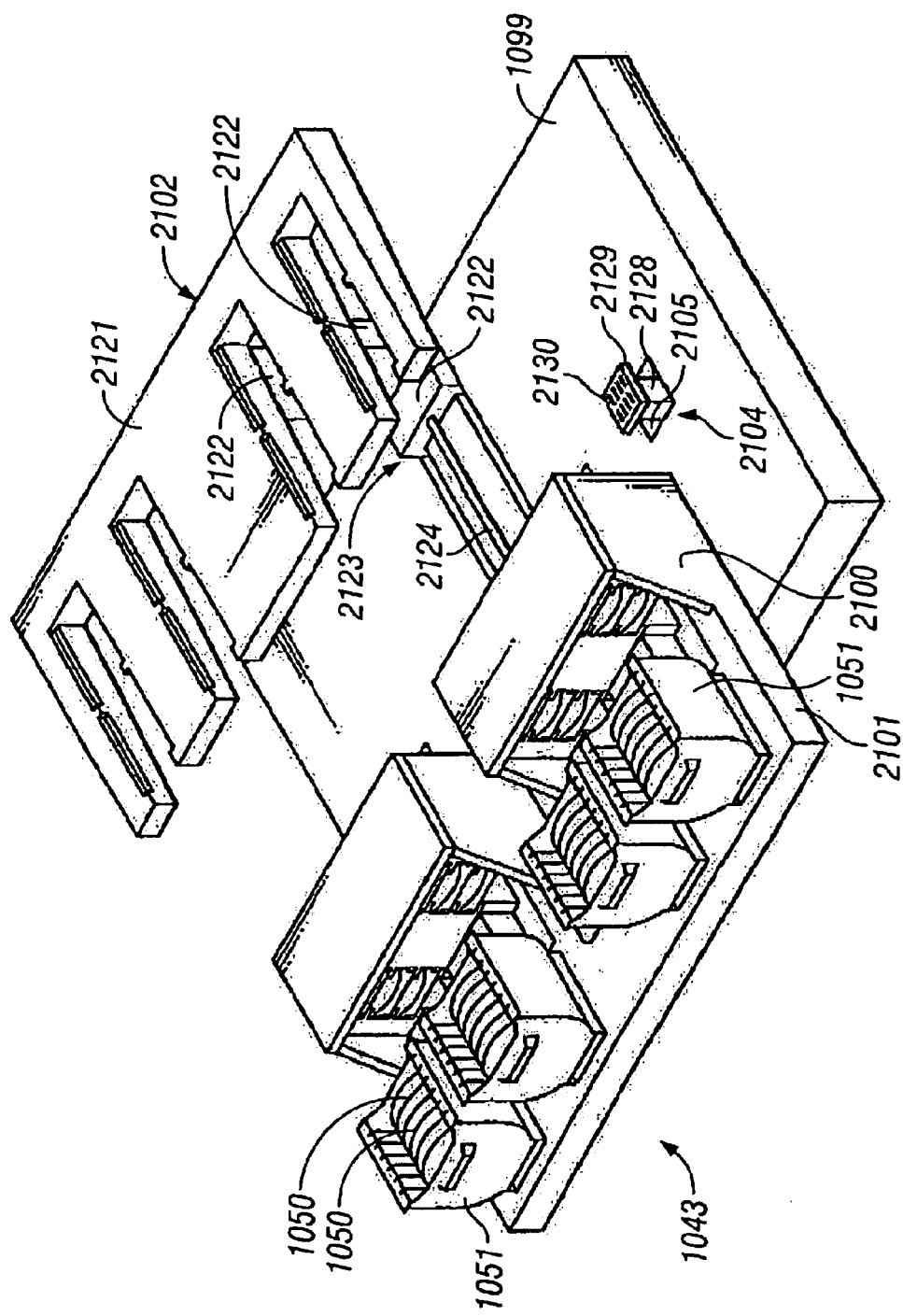
FIG. 39 is a perspective view of the subsystem of FIG. 38 moved into an initial loading position with wafer carriers containing wafers loaded thereon.
Figure 40:
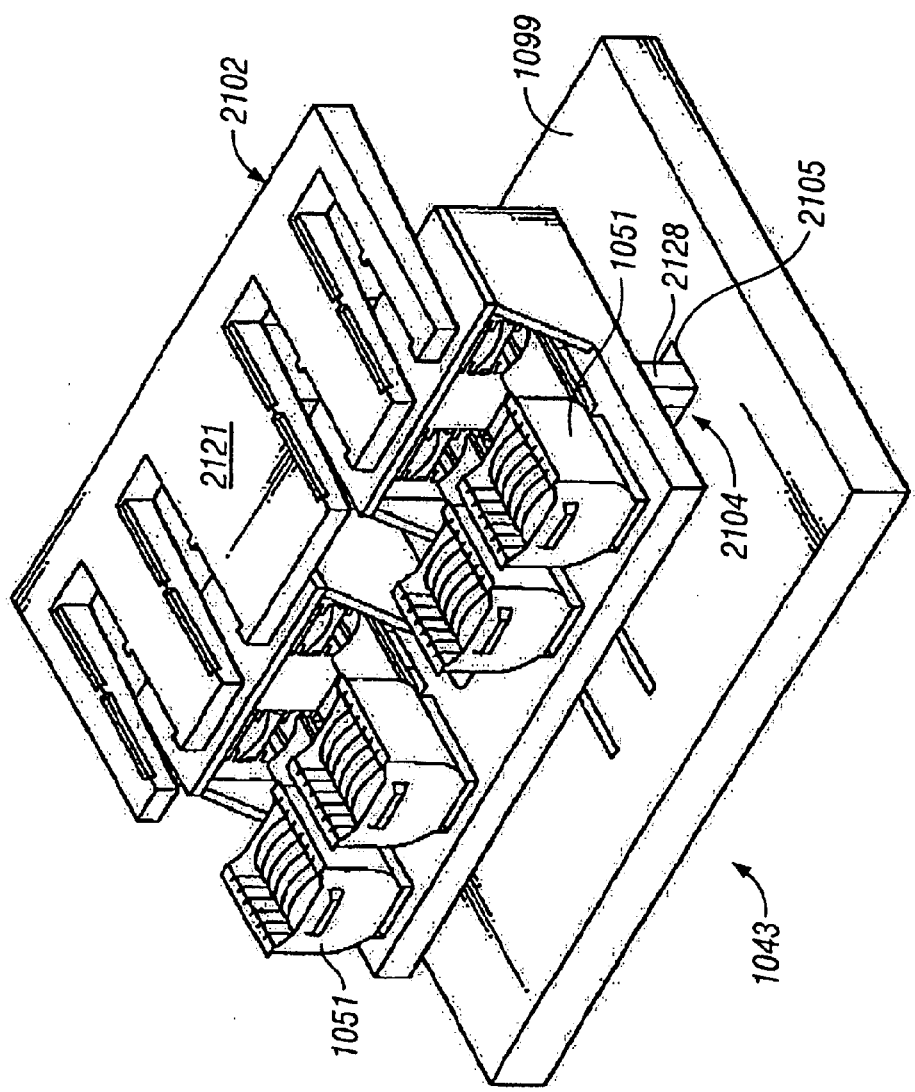
FIG. 40 is a perspective view showing the subsystem of FIG. 38 moved into a further position wherein empty wafer trays are passing through a tray pass-through opening.

The operation of interface 1043 will now be described in connection with the series of drawings shown in FIGS. 39–44. FIG. 39 shows the interface moved from the fully retracted positions of FIG. 38 into an initial loading position wherein the first carriage has been extended fully to position the overhanging carrier shelf 2101 through the interface port 1056. FIG. 39 also shows the carrier shelf loaded with four wafer carriers 1051 containing wafers 1050. The carriers and wafers are positioned in the carrier support receptacle ledges 2109 over the wafer transfer openings 2110. The second carriage 2102 is maintained in the fully retracted position.

After the wafer carriers have been loaded onto shelf 2101, the first carriage is retracted. When sufficiently retracted, the interface port door 1059 is closed by extending the door upwardly. The first carriage continues to retract rearwardly until the elevator head 2129 is aligned with the stored trays held in empty wafer tray storage arrays 2115. At this tray pick position, the first carriage is stopped and the elevators are aligned below the stored wafer trays. The elevators are then extended upwardly to engage and lift the lowest empty trays from the four storage arrays. The elevators are then stopped and held at a tray lift elevation position.

The first carriage is then retracted further to bring the pass-through openings 2114 into alignment with the elevators and elevated empty wafer trays positioned upon the heads of the elevators. At this pass-through position of the first carriage, the first carriage is stopped. The elevators 2104 are then retracted downwardly to pass the empty wafer trays through the deck of the first carriage. The empty trays are move downwardly until they are below and clear of the first carriage.

Figure 41:
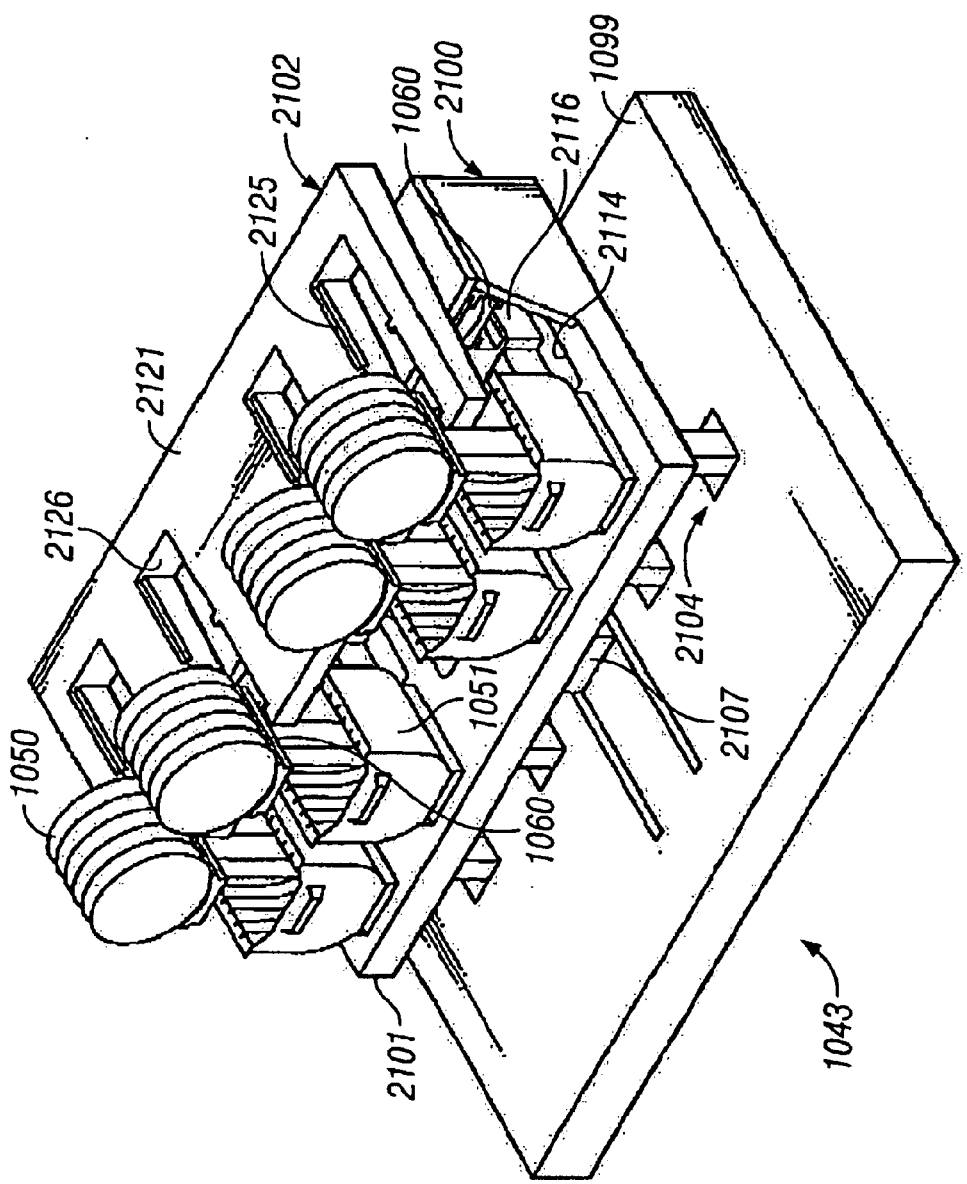
FIG. 41 is a perspective view showing the subsystem of FIG. 38 moved into a further position wherein the wafer trays have been elevated up through the wafer carriers to lift wafers from the carriers onto the trays.
Figure 42:
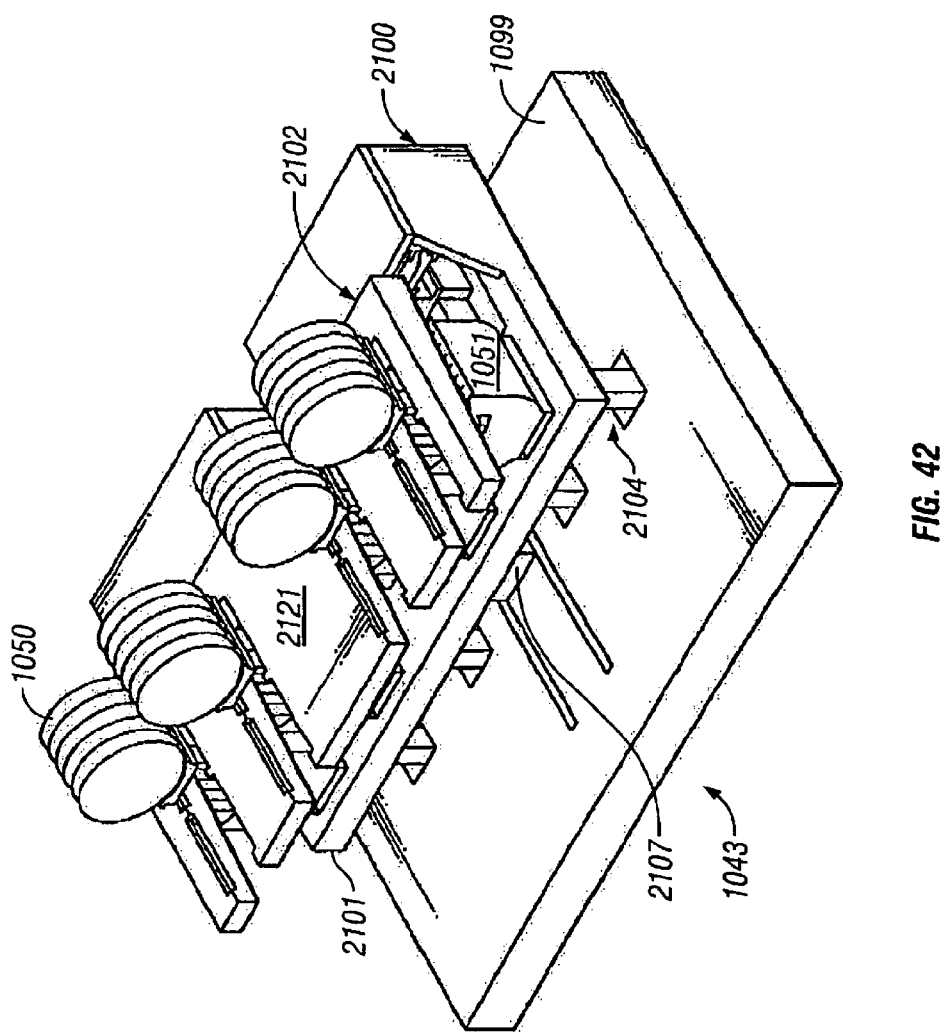
FIG. 42 is a perspective view showing the subsystem of FIG. 38 moved into a still further position wherein the wafer trays with wafers are positioned upon an upper carriage.

The first carriage is then moved rearwardly from the pass-through position into a transfer position. In the transfer position the first carriage is positioned so that the elevators and empty wafer trays held thereon are aligned with the bottom opening of the wafer carriers held in carrier holders 2109. FIG. 41 shows the first carriage in the first carriage transfer position.

FIG. 41 further illustrates the transfer of wafers from the wafer carriers 1051 and their installation onto the wafer trays 1060. In FIG. 41 the elevators have been extended upwardly after the first carriage has assumed the transfer position. The transfer includes aligning the individual wafer receivers 1066 below the wafers 1050 held in carriers 1051. As the elevators extend upwardly, the tray moves up, into and through the open bottom of carriers 1051. The edges of the wafers 1050 are guided by the V-shaped receiver mouths having downwardly converging receiver side surfaces 1067. The edges of wafers 1050 are guided by the receiver mouths into the relatively close fitting receiver slots or channels 1068. The edges of the wafers bear against the wafer slot bottom surfaces 1069. The bearing allows the wafers to further be lifted upwardly by the elevating trays 1060.

Figure 43:
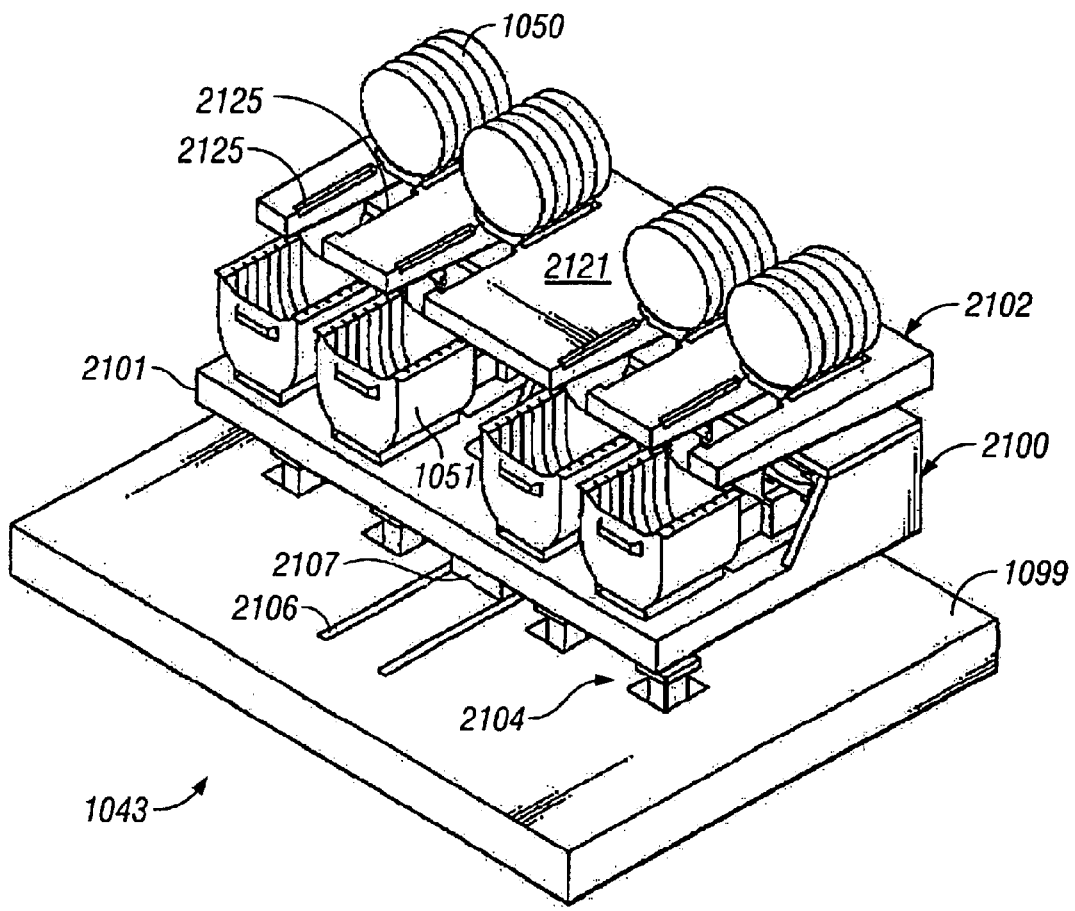
FIG. 43 is a perspective view showing the subsystem of FIG. 38 with the upper carriage and supported wafers and wafer trays positioned for holding until subsequently processed in the system processing chambers.

FIG. 41 shows the elevators fully extended with trays 1060 fully elevated and with wafers 1050 held in an aligned side-by-side array upon the trays. In this condition, interface 1043 has transferred the wafers and the loaded wafer trays are ready to be moved to the holding stations on second carriage 2102. To accomplish this, the second carriage is extended outwardly and forwardly from the retracted position into an extended position, such as the fully extended position shown in FIG. 42. In this position the second carriage has been moved forwardly so as to align the rearward gang of loaded tray holding receptacles 2125 with the elevated wafer trays. The elevators are then retracted downwardly to lower the loaded wafer trays into the receptacles 2125. After the loaded trays have been received in receptacles 2125, the second carriage can then be retracted rearwardly into a retracted holding position, such as shown in FIG. 43. FIG. 43 also shows the elevators 2104 fully retracted and the first carriage retracted with empty wafer carriers 1051 awaiting discharge from the interface section.

Figure 44:
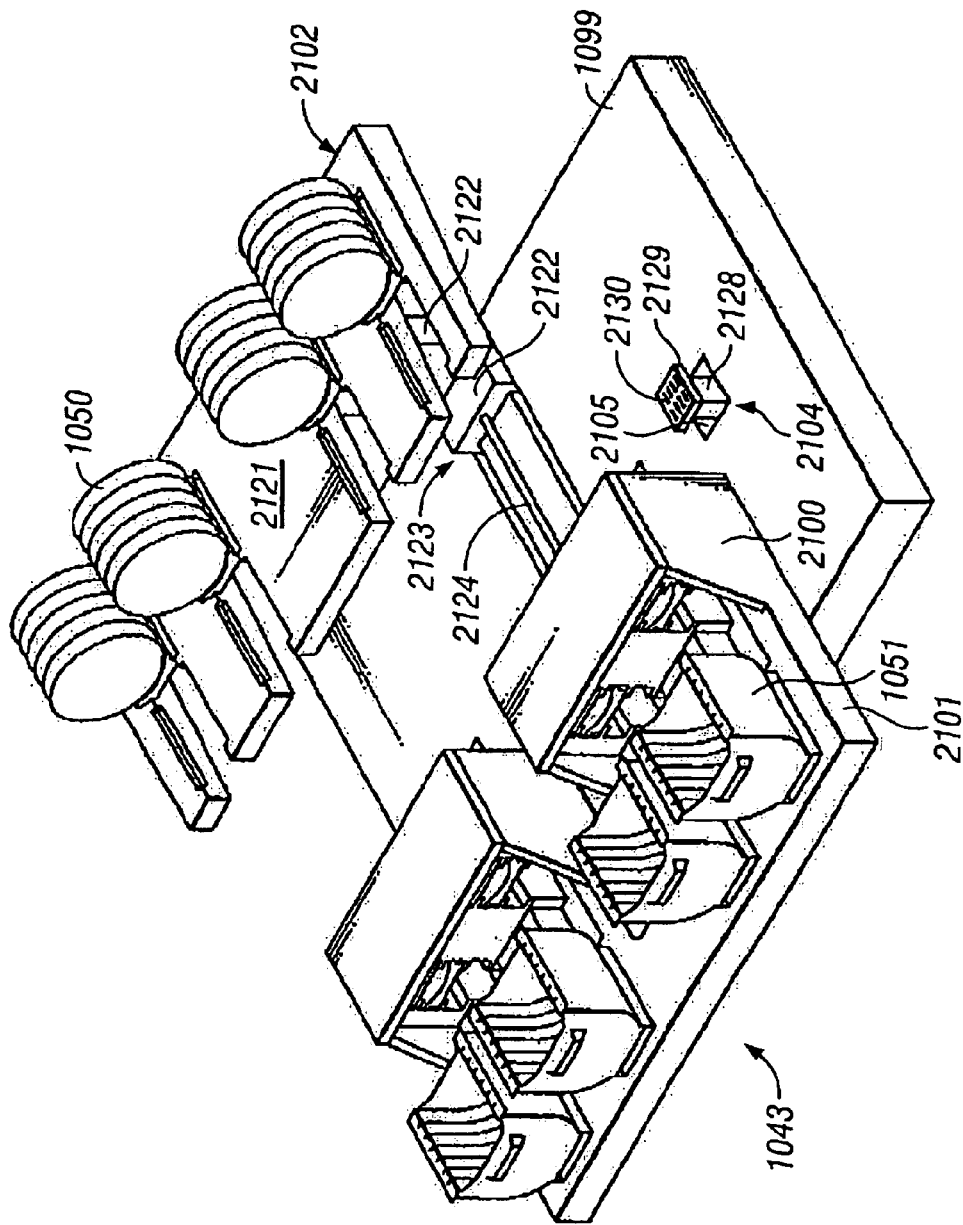
FIG. 44 is a perspective view of the subsystem of FIG. 38 in a position similar to FIG. 39 with the emptied wafer carriers ready for removal and replacement by loaded wafer carriers so that a second group can be transferred in a process similar to that illustrated by FIGS. 39–44.

FIG. 44 shows the first carriage repositioned into a fully extended carrier unload position. This position is also the initial load position shown in FIG. 39. The empty wafer carriers are removed using a suitable means, such as manual removal by a human operator (not shown). Loaded Wafer are then loaded onto the overhanging shelf of the first carriage and the process illustrated by FIGS. 39–44 is repeated for a second gang or group of carriers, wafers and trays. The second loading process differs only slightly from the process described above. One difference is that different trays are used from the empty tray storage magazines 2115. Another difference is that the second gang of loaded trays are held in the outer or forward holding receptacles 2125 instead of the rearward tray holders used by the first gang of wafer trays.

Processing Section

The processing section 1044 of processor 1040 will now be described in greater detail. As shown, processing section 1044 includes three centrifugal processing stations 1071–1073. Each processing station includes a processing chamber bowl 2131 which substantially encloses an internal processing chamber 2132. A centrifugal processing enclosure door 2134 is mounted for controlled powered vertical motion between a closed upward position and a downwardly retracted open position. Preferred door constructions are shown in U.S. Pat. No. 5,302,120, which is hereby incorporated by reference.

Figure 50:
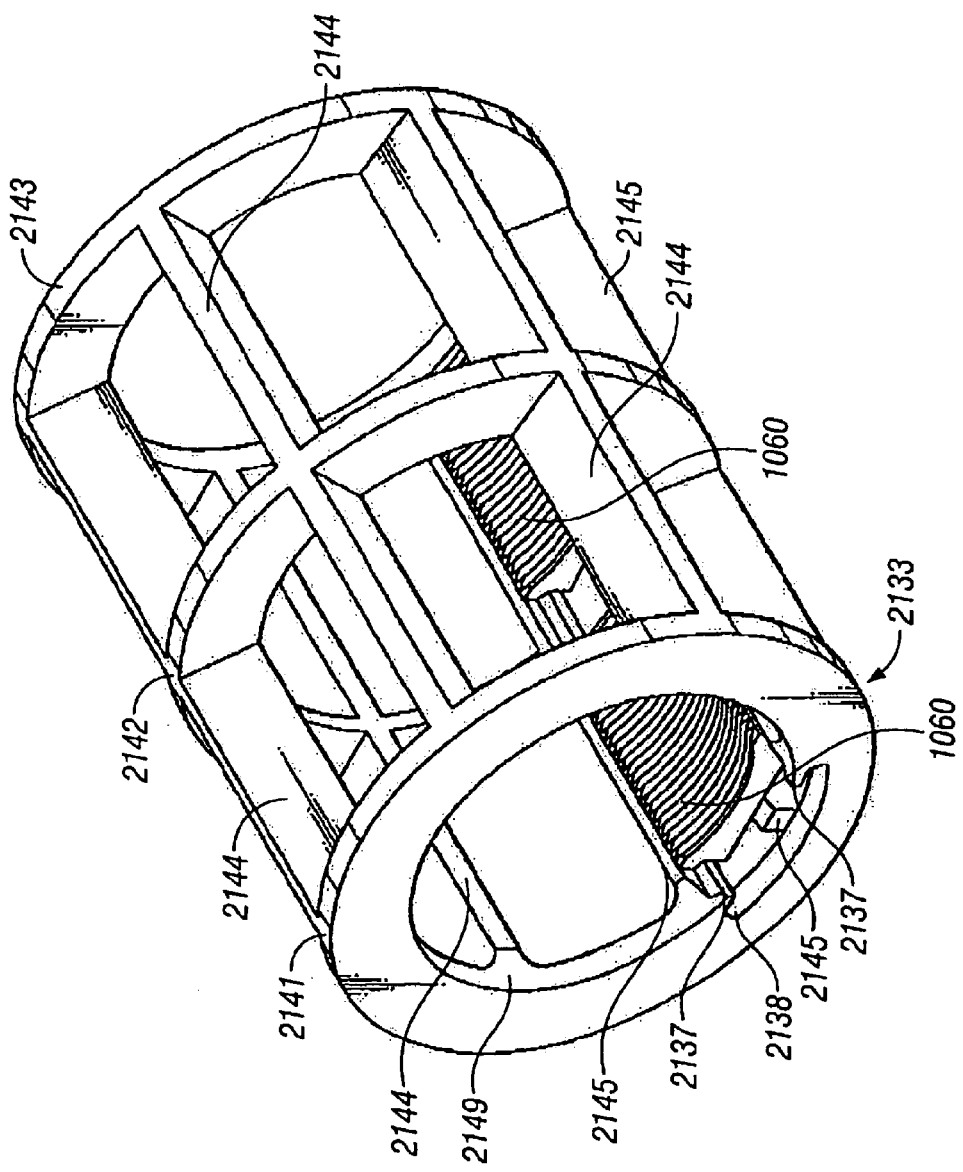
FIG. 50 is an isometric view of a preferred centrifugal processing rotor used in the centrifugal processing modules shown in FIG. 33.

Within each processing chamber is a suitable rotor for receiving loaded wafer trays, such as rotor 2133 detailed in FIG. 50. FIG. 51 shows a front view of rotor 2133 without a wafer tray loaded therein. FIG. 54 shows a front view similar to FIG. 53 with a loaded wafer tray positioned within the rotor. Rotor 2133 is specially constructed to receive and appropriately engage wafer tray 1060 using wafer tray engagement features as explained below. The resulting interlocking interengagement of the tray with the rotor substantially prevents dislodgement until appropriately removed.

Rotor 2133 includes three principal ring pieces 2141–2143. The front ring 2141 has a beveled rotor opening 2149. The front, central and rear rings are connected by connecting longitudinal bars 2144 and 2145. Upper longitudinal bars 2144 are spaced from the wafer trays 1060 and are provided with inwardly directed longitudinal bumpers 2146. Adjacent the wafer tray receptacle 2136 are three additional longitudinal bars 2145. The inward edges of bars 2145 serve to guide and support wafer trays 1060 appropriately positioned within the wafer tray receptacle.

The wafer tray engagement features used in the wafer tray receptacle include a rotor tray receiving channel 2136. The sides of receiving channel 2136 include rotor tray engagement projections 2137. The rotor tray engagement projections are shaped and sized to complement and be received along the tray side channels 1081. However, the tray side channels are substantially higher than the engagement projects because the trays are loaded using a tray engagement tool 2180 which inserts between the downward facing bearing surface 1082 of the tray and the upward surface of rotor engagement projections 2137. Additionally, the clearance is preferably sufficient so that engagement tines 2184 can also pass through the available space during insertion into the rotor to retrieve a tray therefrom.

The wafer tray engagement features used in rotor tray receiving channel 2136 also include opposing side receiving flutes 2138. Flutes 2138 receive the longitudinal side flanges 1085 of tray 1060 in relatively close fitting interengaging relationship. The bottom or foot surface 1086 of tray 1060 bears upon inwardly directed tray support surfaces 2147 on the longitudinal bars 2145. This advantageously occurs between both outer support bars 2145 with both side rails 1076 of the tray, and along a central tray support bar 2145 and the center longitudinal foundation bar 1075 of the tray. Central longitudinal bar 2145 is advantageously provided with a bumper bar 2148 (FIG. 51).

The processing stations are each independently driven by rotating assembly motors 153 and have other features of a centrifugal fluid processor as needed for the desired processing of that station. Additional details of a preferred construction of centrifugal processor are well-known.

The specific processing performed in processing stations 1071–1073 can each be different or of similar nature. Various liquid and gaseous processing steps can be used in various sequences. The processor is particularly advantageous in allowing a series of complex processes to be run serially in different processing chambers set up for very different chemical processing solutions. All the processing can be accomplished without human handling and in a highly controlled working space, thus reducing contamination and human operator handling time.

The processing section 1044 also includes a processing section portion of working space 1046. This portion of the working space is frontward of processing stations 1071–1073 within the enclosure envelope 1045. This processing section working space allows the tray conveyor described below to supply and remove loaded wafer trays to and from the processing stations.

Conveyor

Figure 45:
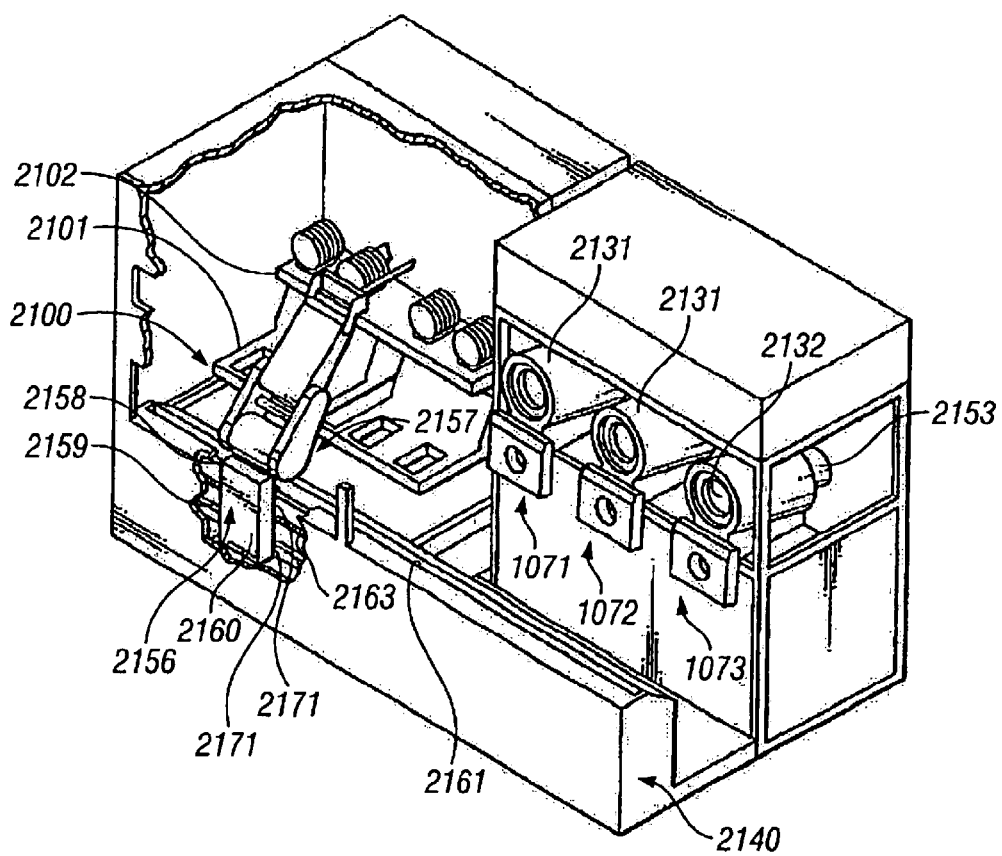
FIG. 45 is a perspective view showing the wafer processing system of FIG. 33 with a robot conveyor loading a tray of wafers.
Figure 46:
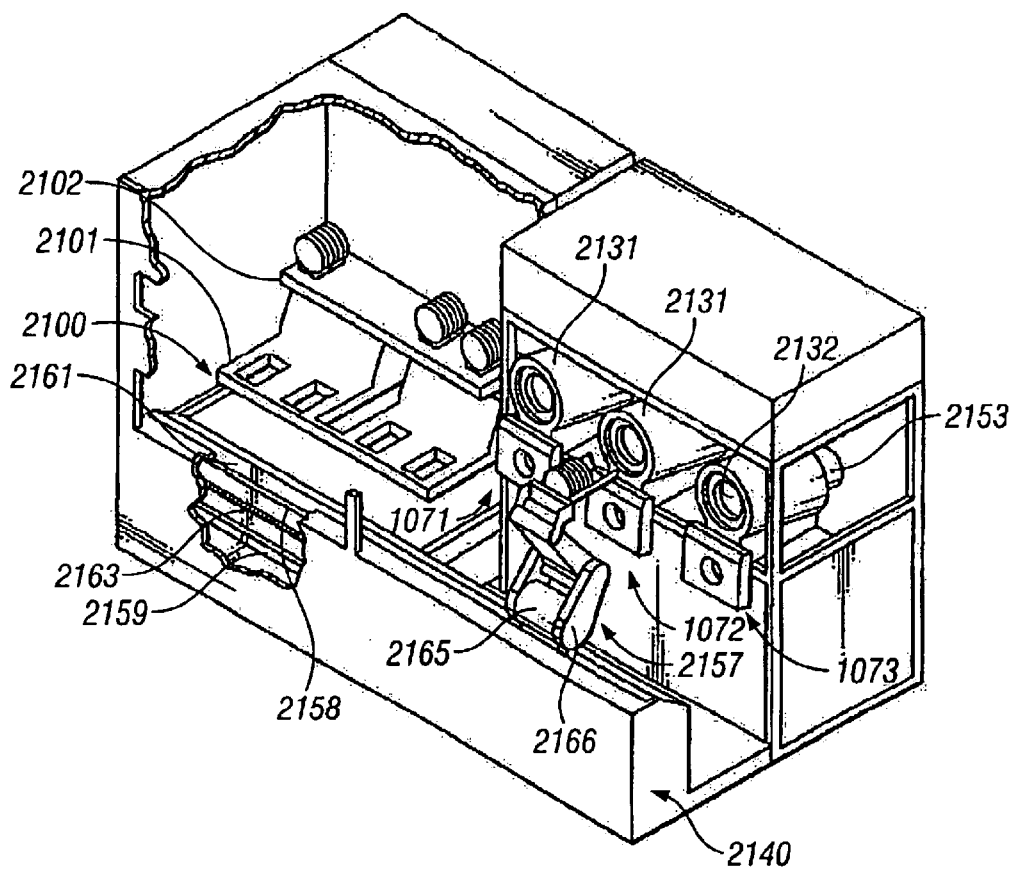
FIG. 46 is a perspective view similar to FIG. 45 with the robot conveyor relocated and preparing to install the tray wafers into a centrifugal processing module.

Processor 1040 is advantageously provided with a mechanical wafer tray conveyor 2140. Conveyor 2140 will be described initially with reference to FIGS. 45 and 46. The preferred conveyor includes a conveyor carriage or tram 2156 and a mechanical arm assembly 2157 which is mounted on the tram. The tram moves the mechanical arm assembly along a defined tram travel path. The mechanical arm assembly moves the wafer trays 1060 upwardly, downwardly, inwardly, outwardly, and adjusts the tilt within a range of available positions and orientations.

Tram 2156 has a base 2160 which connects with a base subassembly 2165 which forms part of the mechanical arm assembly. The complementary base parts 2160 and 2165 join to provide a combined base assembly which serves as a movable base for the mechanical arm assembly.

Tram 2156 moves along a guide track which defines the tram path along which the tram travels. The guide track is advantageously formed by upper and lower guide bars 2158 and 2159 which are mounted along the outward side of a track support member 2161 forming part of the frame. This construction allows the mechanical arm assembly to extend into cantilevered positions to reach processing stations 1071–1073 with good positional stability. The guide bars are engaged by track followers in the form of linear bearings 2171 which are secured to the inward face of the tram base 2160. The linear bearings 2171 are advantageously provided with rod engaging rollers spaced at equal 120° arc positions about the guide bars 2158 and 2159.

The tram is powered along the defined path guide track by a suitable tram driver, such as a track magnetic drive in the form of linear magnetic motor 2163. Linear magnetic motor 2163 is most preferably a linear brushless direct current motor. Such a preferred tram driver uses a series of angled magnetic segments which magnetically interact with an electromagnet on the base of the robotic conveyor to propel the tram and attached mechanical arm up and down the defined path track.

The path position of the base 2160 along the guide track is precisely controlled using a positional indicating array (not shown) affixed to the front of the track support member adjacent to guide bars 2158 and 2159. An optical emitter detector pair (not shown) are mounted upon base piece 2160. The optical emitter detector pair serves as a track position sensor or indicator which reads the position of the tram base from the indicating array after proper calibration. The positional accuracy of the track position indicator is preferably in the range less than 0.003 inch (approximately less than 0.1 millimeter).

Figure 47:
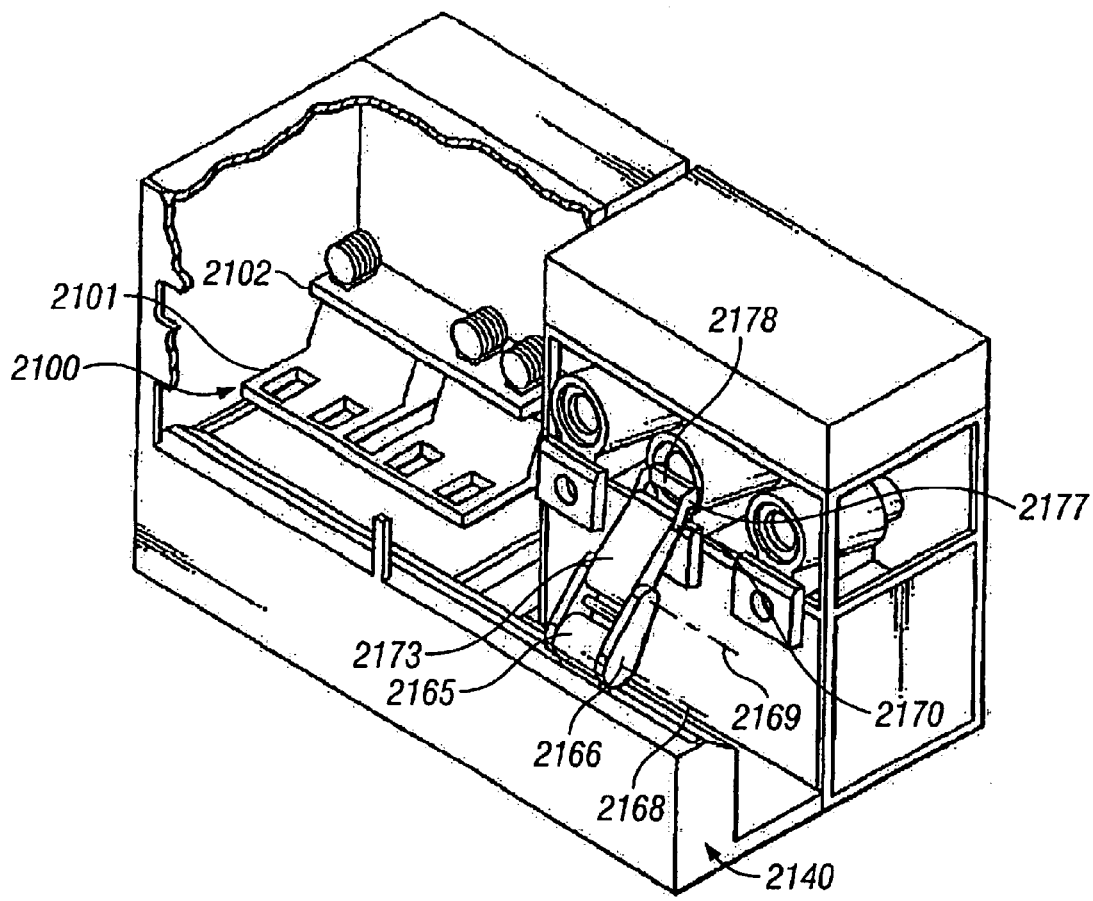
FIG. 47 is a perspective view similar to FIG. 46 with the robot extended into a loading position wherein the tray of wafers is installed in the centrifugal processing module.

A forearm assembly is connected near the outer distal end of the upper arm assembly. The forearm assembly advantageously includes two forearms 2172 which are joined by a forearm connection member 2174. The forearm assembly also uses opposing face panels 2173 (FIG. 47) to provide a strong and mechanically integrated forearm assembly which is resistant to twisting and provides a high degree of positional stability. The forearm assembly is connected to the upper arm assembly to allow relative pivotal movement about an elbow pivot axis 2169.

The distal end portions of the forearm assembly support a hand assembly 2176. Hand assembly 2176 is supported in a manner allowing pivotal movement about a wrist pivot axis 2170. The hand assembly includes two complementary hand bars 2177. Hand bars 2177 are joined together by a hand cross piece 2178. The hand assembly also preferably includes a tray engagement tool 2180 which is mounted to the hand cross piece 2178.

Figure 48:
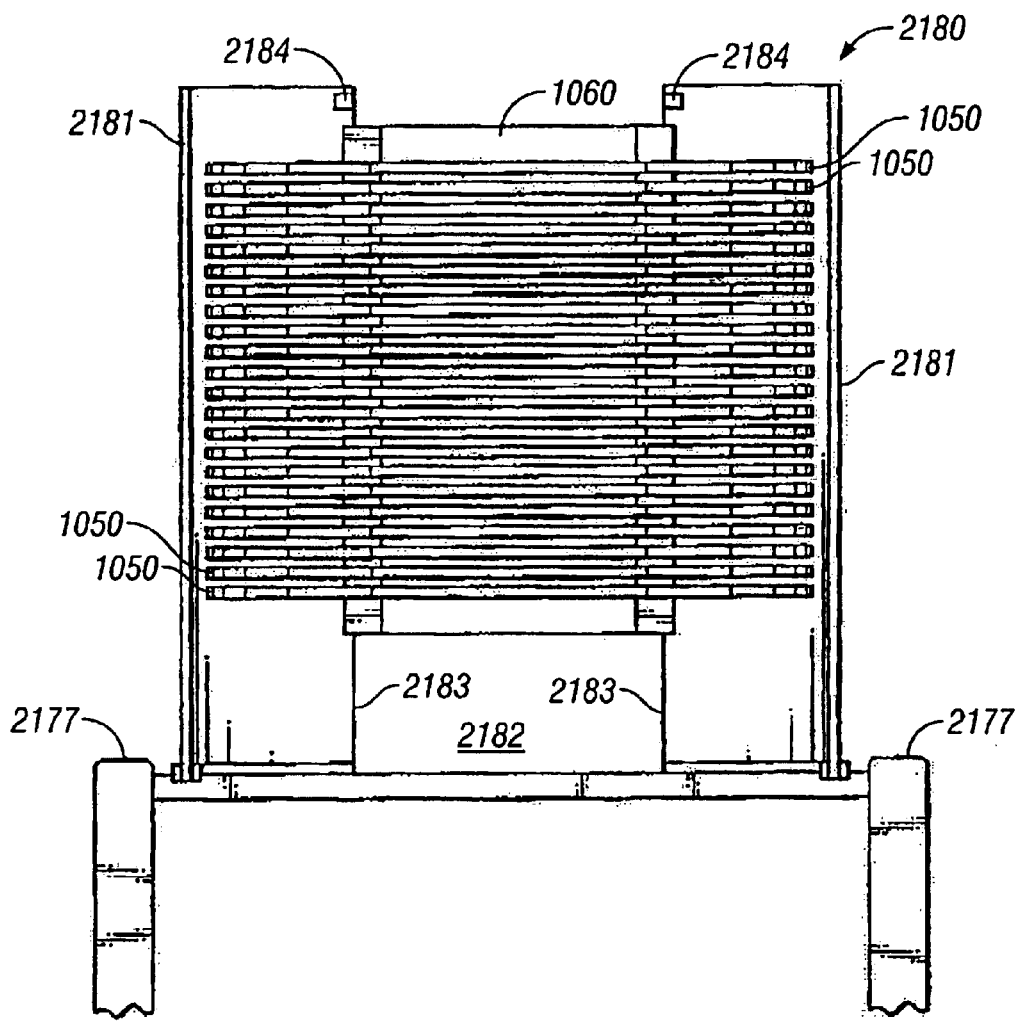
FIG. 48 is a top view showing a hand portion of the mechanical arm assembly with a tray of wafers loaded thereon.
Figure 49:
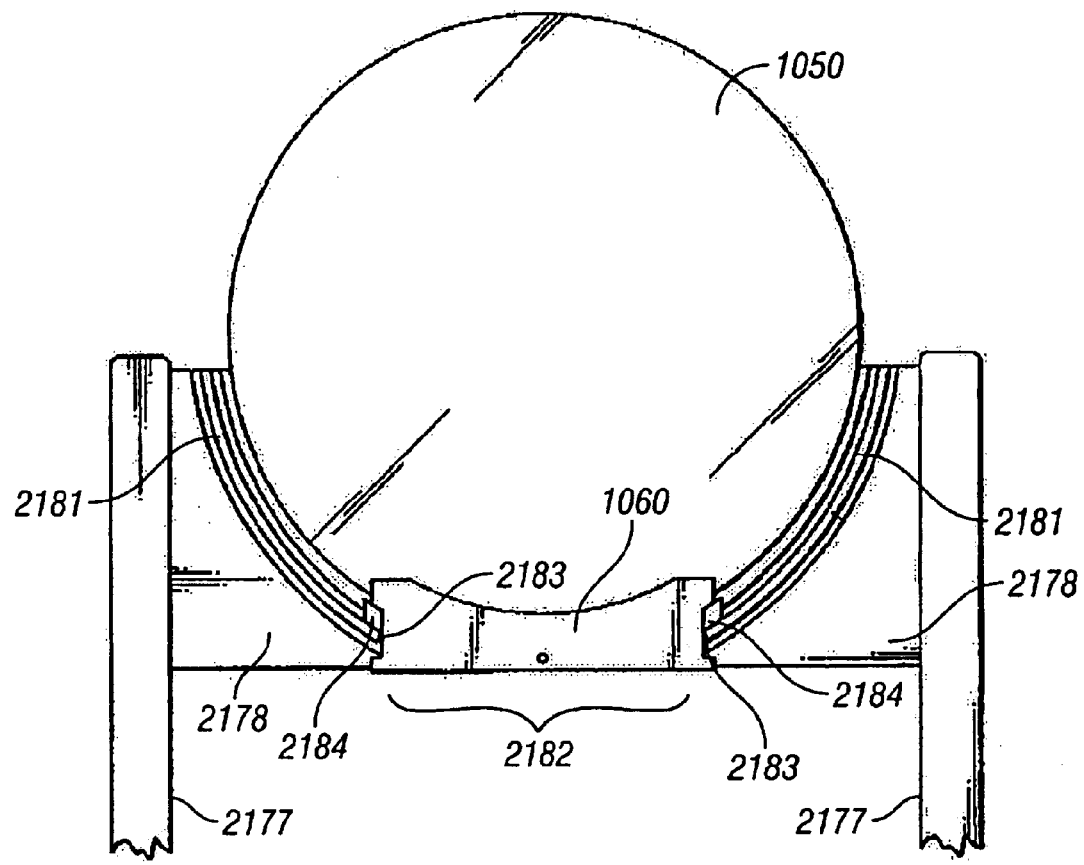
FIG. 49 is a front view showing the hand portion of FIG. 48.

FIGS. 48 and 49 show that the preferred tray engagement tool 2180 includes a complementary pair of hand extensions 2181. Hand extensions 2181 are advantageously semi-cylindrical sections which form a cradle which engages the wafer tray 1060. The hand extensions preferably engage the wafer tray along the side rails, such as along the outer side surfaces of the tray. More specifically, the hand extensions preferably are spaced to define a hand extension gap 2182 having parallel inside engagement edges 2183. Tool engagement edges 2183 are received along the wafer tray side channels 1081. The tool engagement edges are slid longitudinally along side channels 81 to position the tool for engagement with the wafer tray.

The ends of the hand extensions are preferably provided with end tines 2184. When the hand extensions are lifted upwardly, the engagement edges bear upon the downward facing bearing surface 1082 of the wafer side channels. Simultaneously therewith, tines 2184 move upwardly to latch at the end of the wafer tray to prevent longitudinal slippage of the wafer tray upon the hand extensions. This latching places the tines along end surfaces of the wafer tray. The hand extensions can advantageously be provided with perforations 2185 to lighten the weight of the assembly.

FIG. 33 Operation and Methods

The operation and methodology of processor 1040 have in part been explained above. Further description will now be given.

The invention further includes novel methods for processing semiconductor wafers and similar units requiring extremely low contamination. The methods can include providing a suitable processor, such as processor 40 described herein above and the associated subsystems thereof. Novel methods of processing such units preferably are performed by loading the wafers or other units to the system in carriers, such as wafer carriers 1051. Such loading step is to a work space which is enclosed or substantially enclosed, such as working space 1046. The loading step can include opening an enclosure door, such as door 1059 of the interface port to allow entry of the wafers. The loading preferably is done by opening the enclosure door and extending a loading shelf through an open interface opening, such as port 1056. Positioning of the loading shelf can be accomplished by moving the first carriage outwardly into an extended loading position.

The loading is further advantageously accomplished by depositing the wafers held within wafer carriers onto an extended loading shelf which is positioned through the interface opening. The wafers held in the carriers are positioned by depositing the loaded wafer carriers onto the extended shelf. The first carriage is thereafter moved such as by retracting the first carriage and the extended cantilevered shelf. After retracting the shelf through the interface port the methods advantageously include closing the interface port door or other similar enclosure door.

The methods also preferably include transferring wafers to a wafer tray, such as tray 1060. Such transferring preferably is done by transferring the wafer from a wafer carrier and simultaneously onto the wafer tray. This is done by lifting the wafers from the wafer carrier using the wafer tray. The transferring is advantageously accomplished by extending the wafer tray through an opening in the wafer carrier, for example elevating the wafer tray up through a bottom opening in the wafer carrier to lift the wafers. The transferring preferably is accomplished using an array of wafer receivers, such as receivers 1066. The wafer receivers which receive the wafers are preferably spaced and parallel to allow the receivers of the tray to be extended to receive the wafers in an edgewise relationship. The receiving is most preferably done using receiving channels having converging side surfaces which perform a guiding function as the tray and wafers approach relative to one another. The receiving also advantageously includes positioning edges of the received wafers into receiver bottom sections 1068 which includes positioning the edges into slots having spaced approximately parallel receiving slots with surfaces along marginal edge portions which hold the wafers in a spaced substantially parallel array.

The transferring also preferably includes extending, such as by lifting, the wafers received upon the wafer trays so as to clear the wafer free of the wafer carriers. This clearing of the wafers installed upon the trays completes the transferring of the wafers to perform an installing of the wafers onto the wafer trays.

The transferring and installing operations can in the preferred embodiment be preceded by storing wafer trays in a wafer tray storage area or array. The wafer trays can be stored by slipping the wafer trays into storage receptacles, such as upon storage support ledges 2109. The storing can occur by vertically arraying the unloaded wafer trays.

The wafer trays held within the storage receptacles are also preferably removed by unloading therefrom. This unloading can advantageously be done by elevating or otherwise by extending a tray support, such as head 2129 into proximity to and then engaging the head with the tray. The extending can function by lifting the engaged head and then moving to dislocate the lifted tray from the storage area. This dislocating can most easily be accomplished by moving the storage area, such as by moving the second carriage 2102, most preferably by retracting the carriage.

The steps preceding the transferring step can also advantageously include passing the engaged wafer tray through a pass-through opening in the first carriage. The passing-through step can be accomplished by lowering or retracting the engaged wafer trays through the pass-through opening and thus placing the wafer tray in a position suitable for performing the transferring. The passing-through most preferably includes aligning the engaged wafer tray with the pass-through opening.

The steps preceding the transferring and installing process also preferably include relatively moving the engaged wafer trays relative to the wafer carriers to bring the engaged wafer trays into aligned position. This aligning step is most ideally done by retracting or otherwise moving the first carriage rearwardly until the wafer carrier opening and engaged wafer tray are aligned for transfer and installation.

After the transferring or other installing of the wafers onto the wafer trays, the loaded wafer trays are preferably inventoried, such as by holding upon the second carriage. This storing is in the preferred embodiments done by extending or otherwise moving the second carriage or other loaded tray storage relative to the loaded wafer trays. The loaded wafer trays can be stored by positioning them over a holding features such as holding receptacles 2125. The positioning can be followed by lowering the wafer trays into the holders and then supporting the wafer trays by the wafer holders.

The loaded wafer trays can then be processed further by loading the wafer tray onto a wafer conveyor, such as conveyor 2140. The loading onto the conveyor can be done by moving a wafer tray engagement tool into engagement with the tray. This engaging step is most preferably done by sliding portions of the wafer engagement tool along receiving features of the wafer tray, such as by sliding the engagement edges 2183 along receiving channels 1083 of the tray, most preferably along opposing sides of the wafer tray. The engaging can further be perfected by lifting or otherwise interengaging the wafer tray engagement tool with the wafer tray being moved. This is most preferably done by lifting the tool relative to the tray and thereby positioning a longitudinal engagement feature, such as tines 2184, against a complementary surface of the tray so that longitudinal or other lateral displacement of the tray upon the tool does not occur due to movement.

The methods also preferably include moving the wafer trays to one or more processing stations. The moving can be done by tramming the loaded wafer tray along a defined guide track upon a movable tram. The moving or conveying step can also include horizontally positioning the wafer tray, and vertically positioning the wafer tray, and orienting the angular orientation of the wafer tray to enable the wafer tray to be positioned into a processing chamber. This functioning is preferably followed by loading the wafer tray into the processing chamber. This loading can be done by inserting the loaded wafer tray into a centrifugal wafer tray rotor. The inserting or other loading step can best be accomplished by sliding the loaded wafer tray into an engaged relationship with the rotor by receiving interengaging parts of the rotor and wafer tray.

The wafers which were inserted or otherwise installed into the processing chamber are then preferably further treated by processing with fluid processing materials, such as chemical processing fluids, liquid or gas; or heating, cooling or drying fluids, most typically gases.

The processing can also advantageous be centrifugal processing which involves rotating or otherwise spinning the wafers being processed, particularly when still installed upon the wafer trays. The spinning preferably occurs with the wafers positioned within a rotor which performs a restraining function keeping the wafers in an aligned array centered near the axis of rotation. The centrifugal processing can include a variety of spinning, spraying, rinsing and drying phases as desired for the particular articles being processed. Additional preferred processing parameters are included in the appendix hereto.

The processing can also include immersion processing, such as can be performed by the immersion processing station 2414 described above. Immersion station 2414 or other suitable station can perform processes which include positioning a dipper so as to allow installation of a loaded wafer tray thereon. As shown, this is down by raising the dipper arm upwardly and positioning the wafer holding basket with an open side forwardly. The mechanical arm can then function by inserting or otherwise installing or loading the basket with an open receiver for accepting the loaded wafer tray. After insertion and loading of the wafer tray onto the dipper movable assembly, then the dipper arm is used by moving the held wafers on the trays so as to process the wafers in the desired immersion tank. This dipping or immersing operation is preferably a submersing step which places the entire tray of wafers into the bath of processing chemical. Thereafter the wafers are processed by holding the wafers in the desired immersion position and conduction any monitoring desired while performing the bath processing.

The immersion processing methods can further include withdrawing the bathed wafers, such as by lifting the dipping arm upwardly. The wafer holding head is then preferably removed from the bath and is held in a draining condition to allow processing liquids to drain back into the bath from whence they were removed. The immersion processing can then be repeated for the second or other subsequent processing bath. After the bathing processes have been finished at any particular station then the mechanical arm is used by unloading the wafer trays from the dippers and the loaded wafer trays are moved to the next desired processing station.

The methods of this invention also include unloading the wafer trays from the processing stations, such as by engaging the loaded wafer trays with a tray engagement tool in processes similar to those discussed above. The engaged and loaded wafer tray is then preferably processed by relocating the wafer tray to a second processing station, such as by conveying by moving with the mechanical arm assembly. The relocating can include withdrawing the wafer tray from the processing chamber and moving to another processing chamber and installing the wafer tray therein. The processing can then be furthered using a processing sequence similar to that described or in other processing steps desired.

The wafer trays are also handled by conveying the wafer trays and supported wafers to a holding station and holding the wafers thereat. The holding awaits an interface unloading sequence which can be accomplished by transferring the wafer trays and supported wafers from the wafer trays back to wafer carriers. The transferring or retransferring step back to the wafer carriers is essentially a reverse of the transferring and installing steps described above. Such advantageously includes unloading the wafer trays from the holding area, such as by lifting loaded wafer trays from the holding receptacles. The lifting or other removing of the wafer trays from the holders is advantageously done by extending an elevator head through an aligned wafer carrier and elevating the wafer trays. The holders are then moved in a relative fashion from the lifted or otherwise supported wafer trays. This is advantageously done by moving the second wafer carriage, such as by retracting the wafer carriage rearwardly away from the supported wafer trays. The relative moving of the removed loaded wafer trays and holders allows the wafer trays to be lowered or otherwise retracted. The retracting is best performed by lowering the wafer tray downward after aligning the wafer tray with a wafer carrier. The lowering causes a transferring of wafers from the wafer trays onto the wafer carrier.

The methods also preferably include retracting the elevators downwardly and beneath the first carriage with the supported and now unloaded wafer trays thereon. The first carriage can then be moved into the pass-through position by aligning the empty wafer tray with the pass-through opening. The empty trays can then be extended, such as upwardly, through the pass-through opening.

The methods then preferably include moving the transferred wafers held in the wafer carriers into an extended unloading position through the interface port. This is advantageously done by moving the first carriage forwardly and extending the cantilevered shelf out through the interface port.

The moving of the first carriage forwardly to accomplish unloading, can also be used to perform a storing function for the empty wafer trays into the empty wafer storage array. This is preferably done by elevating the wafer trays into an aligned storage position, such as at a desired aligned storage elevation and then moving the first carriage and attached storage gallery toward the engaged empty wafer tray. Once installed the empty wafer tray can be lowered into a storage position. The empty wafer trays are preferably stored in a downwardly progressing fashion when the elevator is used.

The wafer carriers and associated processed wafers are taken from the processor by removing the loaded wafer carrier from the cantilevered shelf after such has been extended out through the interface port or other unloading passageway. This is typically done by manually grasping the wafer carrier with the processed wafers therein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A system for processing articles comprising:
   an interface section having a plurality of positions for holding article carriers, with each article carrier having a plurality of grooves for holding an array of articles;
   a process section adjacent to the interface section, with the process section including at least one processor including a rotor rotatably supported within the process chamber and having combs for holding the array of articles, the rotor having an open front end; and
   a robotic conveyor movable from the interface section to the process section, with the conveyor having an arm and an article transfer implement at an end of the arm, the article transfer implement having transfer implement arms including transfer implement grooves;
   the robotic conveyor conveying the array of articles from the interface section into the rotor by engaging the array of articles into the transfer implement grooves, lifting the array of articles vertically, moving in a first direction horizontally to the processor, and then moving in a second direction perpendicular to the first direction, to move the articles into the rotor through the open front end of the rotor, and then moving vertically downwardly to place the articles into the combs of the rotor, and with the second direction parallel to a spin axis of the rotor.

2. The system of claim 1 further including a rail extending between the interface section and the process section, with the robotic conveyor moveable along the rail in the first direction.

3. The system of claim 2 further comprising a plurality of processors, and with the rail extending in front of each of the processors.

4. The system of claim 1 with the rotor rotatable about an axis perpendicular to the first direction.

5. The system of claim 1 with the interface section including a front wall and an interface opening in the front wall, for loading and unloading articles into and out of the system.

6. The system of claim 1 with the interface section adjoining the process section.

7. The system of claim 1 with the article transfer implement including a pair of spaced apart arms, and with the transfer implement grooves formed in the spaced apart arms.

8. The system of claim 1 wherein the process chamber has an open front end, with loading and unloading of the process chamber performed by moving articles through the open front end of the process chamber and into the rotor.

9. The system of claim 8 wherein the rotor is cantilevered on a shaft extending through the closed back end of the chamber.

10. The system of claim 1 with the rotor further comprising one or more retainer assemblies on the rotor, for exerting radially inward force on the articles in the rotor.

11. The system of claim 1 wherein the robotic conveyor comprises a first arm section pivotably attached to a second arm section, and a third arm section pivotably attached to the second arm section.

12. The system of claim 1 with the robotic conveyor comprising an end effector including a pair of arms attached to a main body, with the arms spaced apart by a fixed distance less than a diameter of the articles, and a plurality of grooves in upward facing surfaces of the spaced apart arms, to allow the robotic conveyor to pick up and carry the array of articles without any part of the robotic conveyor moving into a position vertically above the array of articles.

13. The system of claim 1 with the process chamber having an open front end, and a process chamber door moveable between a closed position, for processing articles within the chamber and an open position, for loading and unloading articles into and out of the rotor in the process chamber.

14. A system for processing articles comprising:

an interface section having a plurality of positions for holding article carriers, with each of the article carriers having a plurality of grooves for holding an array of articles;

a process section adjacent to the interface section, with the process section including at least one processor including a rotor supported on a single rotor shaft extending through a rear wall of the process chamber, and having combs for holding the array of articles, and with the rotor having an open front end, and with loading and unloading of the rotor performed by moving articles through the open front end of the rotor;

a robotic conveyor movable from the interface section to the process section, with the conveyor having an arm and an article transfer implement at an end of the arm, the article transfer implement having transfer implement arms including transfer implement grooves;

the robotic conveyor for conveying the array of articles from the interface section into the rotor in the process chamber, with the robotic conveyor comprising an end effector including a pair of arms attached to a main body, with the arms spaced apart by a fixed distance less than a diameter of the articles, and a plurality of grooves in upward facing surfaces of the spaced apart arms, to allow the robotic conveyor to pick up and carry the array of articles without any part of the robotic conveyor moving into a position vertically above the array of articles.

15. The system of claim 14 with the robotic conveyor conveying the array of articles from the interface section into the rotor by engaging the array of articles into the transfer implement grooves, lifting the array of articles vertically, moving in a first direction horizontally to the processor, and then moving in a second direction perpendicular to the first direction, to move the articles into the rotor through the open front end of the rotor, and then moving vertically downwardly to place the articles into the combs of the rotor, and with the second direction parallel to a spin axis of the rotor.

16. The system of claim 14 with the rotor further comprising one or more retainer assemblies, for exerting radially inward force on the articles in the rotor.

17. The system of claim 14 wherein the robotic conveyor comprises a first arm section pivotably attached to a second arm section, and a third arm section pivotably attached to the second arm section.

18. A system for processing articles comprising:

an enclosure;

an interface section within the enclosure and having a plurality of carrier positions for holding article carriers, and having a plurality of supports, with each of the supports having spaced apart grooves for holding an array of articles;

at least one elevator in the interface section, positioned to lift articles out of the carriers and place the articles onto the supports;

a process section within the enclosure and adjacent to the interface section, with the process section including at least one centrifugal spray processor including a rotor having an open front end, with the rotor rotatably supported within the process chamber and having combs for holding the array of articles, and a robotic conveyor movable from the interface section to the process section, with the conveyor having a hand and a pair of spaced apart arms attached to the hand and including grooves on an upper surface of each arm;

the robotic conveyor conveying the array of articles from the interface section into the rotor by engaging the array of articles from below, with the edges of the articles moving into the grooves of the arms, lifting the array of articles vertically, moving in a first direction horizontally to the processor, and then moving in a second direction perpendicular to the first direction, to move the articles into the rotor through the open front end of the rotor, and then moving vertically downwardly to place the articles into the combs of the rotor, and with the second direction parallel to a spin axis of the rotor.

* * * * *